US011437780B2

(12) United States Patent
Ikedo et al.

(10) Patent No.: US 11,437,780 B2
(45) Date of Patent: Sep. 6, 2022

(54) SEMICONDUCTOR LASER DEVICE, SEMICONDUCTOR LASER MODULE, AND WELDING LASER LIGHT SOURCE SYSTEM

(71) Applicant: Panasonic Intellectual Property Management Co., Ltd., Osaka (JP)

(72) Inventors: Norio Ikedo, Toyama (JP); Tougo Nakatani, Toyama (JP); Takahiro Okaguchi, Toyama (JP); Takeshi Yokoyama, Toyama (JP); Tomohito Yabushita, Osaka (JP); Toru Takayama, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 70 days.

(21) Appl. No.: 16/567,336

(22) Filed: Sep. 11, 2019

(65) Prior Publication Data
US 2020/0006921 A1    Jan. 2, 2020

Related U.S. Application Data

(63) Continuation of application No. PCT/JP2018/007105, filed on Feb. 27, 2018.

(30) Foreign Application Priority Data

Mar. 16, 2017    (JP) .............................. JP2017-051921

(51) Int. Cl.
*H01S 5/10*    (2021.01)
*H01S 5/20*    (2006.01)
(Continued)

(52) U.S. Cl.
CPC .......... *H01S 5/1078* (2013.01); *B23K 26/064* (2015.10); *B23K 26/0613* (2013.01);
(Continued)

(58) Field of Classification Search
CPC ........... H01S 5/2036; H01S 5/22–2277; H01S 5/2031; H01S 5/205; H01S 5/227–2277; H01S 5/3213
See application file for complete search history.

(56) References Cited

U.S. PATENT DOCUMENTS 4,779,281 A * 10/1988 Naka .................... G02B 6/4202
372/45.01
4,803,691 A * 2/1989 Scifres .................. H01S 5/4031
372/45.01
(Continued)

FOREIGN PATENT DOCUMENTS

EP          0208209 A2 *  1/1987
JP      H06-291416 A     10/1994
(Continued)

OTHER PUBLICATIONS

International Search Report issued in corresponding International Patent Application No. PCT/JP2018/007105, dated May 1, 2018, with English translation.
(Continued)

*Primary Examiner* — Sean P Hagan
(74) *Attorney, Agent, or Firm* — McDermott Will & Emery LLP

(57) ABSTRACT

A semiconductor laser device lases in a multiple transverse mode and includes a stacked structure where a first conductivity-side semiconductor layer, an active layer, and a second conductivity-side semiconductor layer are stacked above a substrate. The second conductivity-side semiconductor layer includes a current block layer having an opening that delimits a current injection region. Side faces as a pair are formed in portions of the stacked structure that range from part of the first conductivity-side semiconductor layer to the second conductivity-side semiconductor layer. The active layer has a second width greater than a first width of the
(Continued)

opening. The side faces in at least part of the first conductivity-side semiconductor layer are inclined to the substrate. A maximum intensity position in a light distribution of light guided in the stacked structure, in a direction of the normal to the substrate, is within the first conductivity-side semiconductor layer.

20 Claims, 31 Drawing Sheets

(51) Int. Cl.
    *H01S 5/22*     (2006.01)
    *H01S 5/32*     (2006.01)
    *H01S 5/40*     (2006.01)
    *B23K 26/21*     (2014.01)
    *H01S 5/343*     (2006.01)
    *H01S 5/0234*     (2021.01)
    *H01S 5/16*     (2006.01)
    *H01S 5/024*     (2006.01)
    *B23K 26/06*     (2014.01)
    *H01S 5/02*     (2006.01)
    *B23K 26/064*     (2014.01)

(52) U.S. Cl.
    CPC .......... *B23K 26/21* (2015.10); *H01S 5/0202* (2013.01); *H01S 5/024* (2013.01); *H01S 5/0234* (2021.01); *H01S 5/162* (2013.01); *H01S 5/2031* (2013.01); *H01S 5/2036* (2013.01); *H01S 5/2202* (2013.01); *H01S 5/2226* (2013.01); *H01S 5/3202* (2013.01); *H01S 5/3213* (2013.01); *H01S 5/34313* (2013.01); *H01S 5/34353* (2013.01); *H01S 5/4031* (2013.01); *H01S 2301/16* (2013.01); *H01S 2301/176* (2013.01)

(56) References Cited

U.S. PATENT DOCUMENTS

| | | | | |
|---|---|---|---|---|
| 4,888,624 A * | 12/1989 | Johnston, Jr. | ......... | H01L 33/305 257/E21.111 |
| 5,375,137 A * | 12/1994 | Hirayama | ............. | H01L 33/305 372/45.01 |
| 5,390,205 A | 2/1995 | Mori et al. | | |
| 5,585,309 A * | 12/1996 | Mori | ........................ | H01S 5/227 438/45 |
| 5,615,224 A * | 3/1997 | Cohen | ................... | H01S 5/0607 372/36 |
| 5,832,019 A * | 11/1998 | Paoli | ................... | H01S 5/34326 372/46.016 |
| 5,974,069 A * | 10/1999 | Tanaka | ................... | H01S 5/2231 257/E33.067 |
| 5,990,496 A | 11/1999 | Kunisato et al. | | |
| 7,903,711 B1 * | 3/2011 | Hasenberg | ............ | H01S 5/2004 372/45.01 |
| 2001/0009558 A1 * | 7/2001 | Shigihara | .................. | H01S 5/22 372/45.01 |
| 2008/0285611 A1 | 11/2008 | Fujimoto | | |
| 2011/0211608 A1 | 9/2011 | Fujimoto et al. | | |
| 2019/0229497 A1 * | 7/2019 | Vierheilig | ................. | H01S 5/22 |

FOREIGN PATENT DOCUMENTS

| | | |
|---|---|---|
| JP | H10-12923 A | 1/1998 |
| JP | H11-163459 A | 6/1999 |
| JP | 2001-308445 A | 11/2001 |
| JP | 2006-114693 A | 4/2006 |
| JP | 5367263 B2 | 12/2013 |
| WO | 2010/050071 A1 | 5/2010 |

OTHER PUBLICATIONS

Chinese Office Action issued in corresponding Chinese Patent Application No. 201880017229.2, dated Sep. 14, 2020, English translation.

* cited by examiner

OPTICAL LOSS $\alpha$ = MIRROR LOSS $\alpha_m$ + WAVEGUIDE LOSS $\alpha_i$ + FREE CARRIER LOSS $\alpha_{free}$

[ISOLATION GROOVES WITH SHALLOW DEPTH]

[ISOLATION GROOVES WITH DEEP DEPTH]

Prior Art    FIG. 30B

SEMICONDUCTOR LASER DEVICE, SEMICONDUCTOR LASER MODULE, AND WELDING LASER LIGHT SOURCE SYSTEM

CROSS REFERENCE TO RELATED APPLICATIONS

This application is a U.S. continuation application of PCT International Patent Application Number PCT/JP2018/007105 filed on Feb. 27, 2018, claiming the benefit of priority of Japanese Patent Application Number 2017-051921 filed on Mar. 16, 2017, the entire contents of which are hereby incorporated by reference.

BACKGROUND

1. Technical Field

The present disclosure relates to a semiconductor laser device, a semiconductor laser module, and a welding laser light source system, and in particular to a semiconductor laser or the like used as a welding light source, a display light source, a sensing light source, an illuminating light source, or any other light source of equipment such as an electronic device or an information processor.

2. Description of the Related Art

Semiconductor lasers have so far been used actively as communication light sources or optical pickup light sources, but in recent years, there are demands for semiconductor lasers that can be utilized widely as light sources in optical application fields other than communication and optical pickup. In particular, there is a strong desire for high-power semiconductor lasers capable of realizing optical output at levels of several tens of watts per emitter.

As this type of semiconductor laser devices, semiconductor laser devices with a configuration disclosed in WO/2010/050071 (PTL 1) have conventionally been known. Hereinafter, a conventional semiconductor laser device disclosed in PTL 1 will be described with reference to FIGS. 30A and 30B. FIG. 30A is a sectional view of conventional semiconductor laser device 10 disclosed in PTL 1, and FIG. 30B is a distribution chart of band gaps of each layer in conventional semiconductor laser device 10 disclosed in PTL 1.

As illustrated in FIG. 30A, semiconductor laser device 10 includes substrate 19, lower cladding layer 15 provided above substrate 19, guiding layer 14 provided above lower cladding layer 15, barrier layer 13 (n-type barrier layer) provided in the upper portion of guiding layer 14, active layer 11 provided in the upper portion of barrier layer 13, upper cladding layer 12 provided above active layer 11, first contact layer 17 provided above upper cladding layer 12, current block layer 16 having a stripe opening and provided in first contact layer 17, and second contact layer 18 provided in the upper portion of first contact layer 17.

As illustrated in FIG. 30B, the band gap of barrier layer 13 provided adjacent to active layer 11 is made greater than the band gaps of active layer 11, guiding layer 14, and lower cladding layer 15. The refractive index of lower cladding layer 15 is made higher than the refractive index of upper cladding layer 12.

With this configuration, electrons caused by carrier overflow with an increase in the temperature of active layer 11 due to high levels of drive current injection are efficiently injected into active layer 11 through barrier layer 13. It is also assumed that the occurrence of catastrophic optical damage (COD) can be suppressed because light diffused in guiding layer 14 becomes a guided mode and this reduces light intensity on the exit end face.

Japanese Unexamined Patent Application Publication No. 2001-308445 (PTL 2) discloses a gain-induced guiding semiconductor laser device with a wide ridge width (stripe width). FIG. 31 is a sectional view of conventional semiconductor laser device 20 disclosed in PTL 2.

As illustrated in FIG. 31, conventional semiconductor laser device 20 is bonded to heat-sink 29b via solder member 29a. The surface of semiconductor laser device 20 is covered with resin 28.

Semiconductor laser device 20 is configured to constrict the flow of current with P-side electrode 21a, N-cap layer 22a, and $P^+$-cap layer 22b. The structure is such that quantum well layer 24b is sandwiched between P-cladding layer 23 and N-cladding layer 25 via guiding layers 24a and 24c and is also sandwiched between P-cap layer 22c and N—GaAs substrate 27 (N-buffer layer 26). Note that N-side electrode 21b is formed on the face of N—GaAs substrate 27 on the opposite side to N-buffer layer 26.

In conventional semiconductor laser device 20 with this configuration, side faces on both or one side of a current stripe width are covered with resin 28 that has low reflecting properties. Thus, even if the amount of injection current is increased in the gain-induced guiding semiconductor laser device with a wide ridge width, it is assumed possible to reduce light that is fed back through the side faces in a direction perpendicular to a cavity length direction so as to suppress stimulated emission and thereby to avoid stopping of lasing in the cavity length direction.

Japanese Patent No. 5367263 (PTL 3) discloses another gain-induced guiding semiconductor laser device. FIG. 32 is a sectional view of conventional semiconductor laser device 30 disclosed in PTL 3.

As illustrated in FIG. 32, semiconductor laser device 30 includes active layer 34, a pair of optical waveguide layers 33 and 35 provided on both top and bottom sides of active layer 34, and a pair of cladding layers 32 and 36, all of which are formed on semiconductor substrate 31 having two grooves 31a that extend in a cavity length direction. Semiconductor laser device 30 is structured such that optical waveguide layers 33 and 35 are bent on both sides of a current injection region in a transverse direction orthogonal to the cavity length direction. The current injection region is provided at a position sandwiched between two grooves 31a of semiconductor substrate 31, and each groove 31a has a depth greater than or equal to a thickness obtained by adding the thickness of active layer 34 and the thicknesses of optical waveguide layers 33 and 35.

With this configuration, it is assumed possible to prevent light that leaks from optical waveguide layers 33 and 35 in the transverse direction from propagating into side faces where chips are isolated.

However, as a feature of gain-induced guiding semiconductor lasers, semiconductor laser device 10 disclosed in PTL 1 has no structure for confining light in the transverse direction, so that light is likely to leak from the optical waveguide in the transverse direction (direction orthogonal to the cavity length direction and parallel to the interface to the active layer). Besides, leakage light from guided-mode light, which exists as a standing wave in the cavity length direction, will increase at high levels of current injection.

The light leaking from the optical waveguide in the transverse direction is fed back into the active layer through the pair of side faces of the stacked structure of semiconductor layers. This light is different in guided mode from light that is originally intended to oscillate and fed back in the cavity length direction. Thus, these guided modes of light conflict with each other and may stop lasing in the cavity length direction. In this regard, PTL 1 describes nothing about stabilizing the guided mode in the cavity length direction, so that a high-power operation itself is difficult with semiconductor laser device 10 disclosed in PTL 1. In this way, it is important for gain-induced guiding semiconductor laser devices with no structure for confining light in the transverse direction to take measures against leakage light in the transverse direction.

Semiconductor laser device 20 disclosed in PTL 2 is capable of inhibiting light that leaks from the optical waveguide in the transverse direction from being fed back through the pair of side faces of the stacked structure of semiconductor layers, because the pair of side faces is covered with resin 28 having low reflecting properties. Accordingly, it is possible to restrain competition between the light leaking from the optical waveguide in the transverse direction and fed back through the pair of side faces, and the light originally intended to oscillate and fed back in the cavity length direction.

However, semiconductor laser device 20 disclosed in PTL 2 is unable to eliminate a refractive index difference because resin 28, which covers the pair of side faces, is an extraneous material. Thus, in the case where leakage light increases as the amount of light in the optical waveguide increases with increasing amount of current injection, the light leaking from the optical waveguide in the transverse direction is sooner or later fed back into the active layer through the pair of side faces, and the result is that competition between guided modes occurs. Therefore, the fact remains that lasing in the cavity length direction stops. Accordingly, it is impossible to stabilize the guided mode originally intended to oscillate in the cavity length direction, without fundamentally controlling the light that leaks from the optical waveguide in the transverse direction in order to prevent the feedback of this light through the pair of side faces.

In semiconductor laser device 30 disclosed in PTL 3, the pair of deep concave grooves is formed in advance in the semiconductor substrate to extend in the cavity length direction and sandwich the position where the optical waveguide is formed, and semiconductor layers are formed on this semiconductor substrate. Thus, light that leaks from the optical waveguide in the transverse direction is attenuated by being bent at the active layer and at the light guiding layers, which are formed to sandwich and bend the active layer, above the pair of grooves in the semiconductor substrate. Accordingly, it is possible to inhibit leakage light from being reflected off the pair of side faces of the stacked structure of semiconductor layers and fed back into the active layer, and to achieve stable transverse-mode laser light.

However, semiconductor laser device 30 disclosed in PTL 3 requires machining process steps for forming the grooves in the semiconductor substrate. This may cause defects in the semiconductor substrate as a result of the machining process contaminating the surface of the semiconductor substrate or flaws being generated in the surface of the semiconductor substrate by machining. In this case, the semiconductor layers are formed on these defects by crystal growth, and accordingly a large number of regrown hillocks (crystal defects) may occur due to induced dislocations and abnormal growth.

In order to achieve a high-power semiconductor laser device at levels of several tens of watts per emitter, it is necessary to increase the cavity length from several millimeters to approximately ten millimeters so as to reduce mirror losses to achieve lower losses, and it is also necessary to increase the width of current injection in order to allow the semiconductor laser device to operate in a multiple transverse mode so as to suppress gain saturation and reduce optical density on the light exit end face. Consequently, chip size increases with increased cavity length and increased area of current injection. For a large-area current injection region, it is difficult to reduce the densities of dislocations and crystal defects induced in chips to a substrate level, and dislocations and crystal defects will be included in the current injection region. This results in a decrease in uniformity in the wafer and leads to a reduction in yield. Even if desired initial characteristics could be obtained, intrinsic dislocations and crystal defects will grow with injection current, and accordingly it is impossible to ensure long-term reliability of a semiconductor laser device at levels of several tens of watts per emitter, which requires large current.

Moreover, in a semiconductor laser device with a multi-emitter structure, yields are reduced by a power of the number of emitters. Thus, due to its too low yields, the structure of semiconductor laser device 30 is unsuitable for a large-sized semiconductor laser device that injects current into a large area with a long cavity length.

Semiconductor laser device 30 also requires concave regions as a structure for attenuating light that leaks from the optical waveguide in the transverse direction, as well as requiring formation of the region necessary for gain-induced lasing per emitter. Thus, semiconductor laser device 30 is difficult to reduce in size and considerably inefficient because only a small area of the active layer can be used per emitter width.

SUMMARY

The present disclosure has been made in view of the circumstances described above, and it is an object of the present disclosure to provide a high-power, long-term reliable semiconductor laser device or other similar devices capable of inhibiting light that leaks from an optical waveguide in the transverse direction from being fed back into an active layer and stably outputting laser light in a multiple transverse mode even if the amount of injection current is increased.

To achieve the object described above, a semiconductor laser device according to one aspect of the present disclosure is a semiconductor laser device that lases in a multiple transverse mode and includes a substrate having a main surface and a stacked structure including a first conductivity-side semiconductor layer, an active layer, and a second conductivity-side semiconductor layer that are sequentially stacked above the main surface of the substrate. The second conductivity-side semiconductor layer includes a current block layer having an opening that delimits a current injection region A pair of side faces is formed in portions of the stacked structure that ranges from part of the first conductivity-side semiconductor layer to the second conductivity-side semiconductor layer. The active layer has a second width greater than a first width of the opening. The pair of side faces in at least part of the first conductivity-side semiconductor layer is inclined to the main surface of the substrate. A maximum intensity position in a light distribution of light guided in the stacked structure, in a normal direction of the main surface of the substrate, is within the first conductivity-side semiconductor layer.

A high-power, long-term reliable semiconductor laser device can be achieved because it is possible to inhibit light that leaks from the optical waveguide in the transverse direction from being fed back into the active layer and to stably output laser light in a multiple transverse mode even if the amount of injection current is increased.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 30B is a distribution chart of band gaps of each layer in the conventional semiconductor laser device disclosed in PTL 1;

DETAILED DESCRIPTION OF THE EMBODIMENTS

Figure 1:
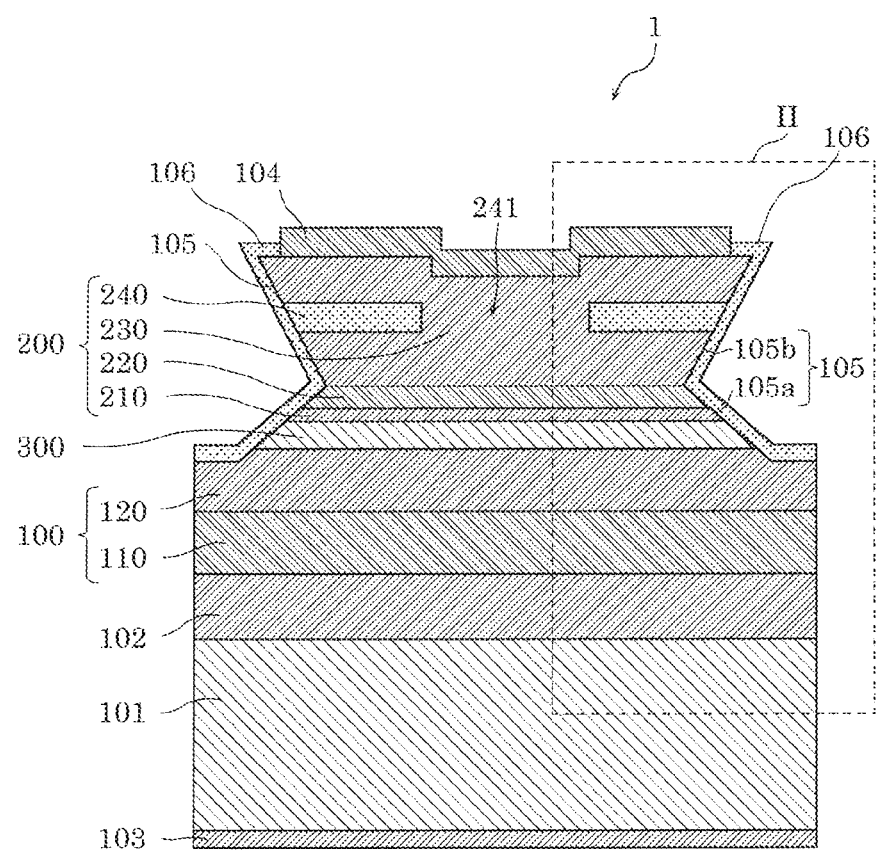
FIG. 1 is a sectional view of a semiconductor laser device according to Embodiment 1.

Logic Behind Achievement of Embodiments of Present Disclosure

There have been demands for low-voltage-driven, high-output (high-power) semiconductor laser devices, but very large making current (injection current) is necessary for semiconductor laser devices with high outputs greater than or equal to 10 W per emitter). For example, in the case of a multi-emitter laser whose making current is large and exceeds 10 A per emitter, total making current is obtained by multiplying 10 A by the number (N) of emitters, and if N=20, the total making current is as large as 200 A. In order to achieve low-voltage-driven, high-output semiconductor laser devices, the efficiency of power conversion may be improved, but in order to achieve high power conversion efficiency, it is important to accumulate improvements in electrical and optical characteristics of individual components.

The followings are important in achieving high-output semiconductor laser devices.

(i) It is necessary to suppress end-face damage (COD) accompanied by increased output. In this case, COD can be suppressed by, for example, increasing the number of transverse modes during lasing to reduce optical density on the light exit end face. The optical density on the light exit end face at high output can be further reduced by reducing the proportion of the active layer in the light distribution in the stacking direction of semiconductor layers.

(ii) Stable optical characteristics (current-optical output characteristics) are desired at high output. In this case, if electrons and holes injected into the active layer are efficiently confined within the active layer, it is possible to reduce threshold current and operating current, and it is also possible to reduce reactive current. This reduces the amount of heat to be generated and achieves current-optical output characteristics that maintain linearity up to a high-output region.

(iii) It is necessary to reduce heat generation in the waveguide in order to achieve high output at levels of several tens of watts per emitter. For this purpose, it is necessary to reduce mirror losses, which are one kind of optical losses in the optical waveguide, and for example, the cavity length is increased from several millimeters to approximately 10 mm to increase the length of the resonator. If the number of transverse modes in each emitter is increased, the usable area of the active layer in the transverse direction, to which a guided mode per emitter contributes, can be maximized to reduce optical density, and this allows the semiconductor laser device to be driven at an operating point that achieves high differential gain, while reducing gain saturation. Each emitter width has to be minimized while ensuring heat dissipation capability against heat generation that propagates radially from the active layer region contributing to lasing. Also, cost reduction has to be achieved by reducing the size of each chip to increase the number of chips that can be produced from a single wafer.

(iv) In the case where a wafer is cut into small pieces of semiconductor lasers, the wafer is mechanically cut with a scriber or the like and cleaved into individual pieces. However, defects may also occur at the time of cutting the wafer, and this can cause leakage current. In order to suppress such leakage current, it has been proposed to separately provide a current injection region and a chip isolation region and form isolation grooves for division into individual pieces. In the case where semiconductor laser devices are arrayed, it is necessary to suppress light leaking from adjacent emitters to adjacent chips and the interference of heat. The leakage light interacts with light in the adjacent waveguide and causes instability of transverse modes. In regard to the interference of heat, adjacent emitters have to be optically and thermally isolated from one another. This is because heat generated from emitters in the edge portion of a chip and emitters in the central portion of the chip affects the entire chip, temperature becomes nonuniform as a result of temperature rises at the emitters in the edge portion of the chip and temperature drops at the emitters in the central portion of the chip, and the nonuniformity in temperature deteriorates the uniformity of the oscillation wavelengths of light emitted from each emitter.

In order to achieve high-output semiconductor laser devices based on these viewpoints, the inventors of the present disclosure have focused their attention on the light leaking in the transverse direction and reflected off the side faces of the stacked structure, out of leakage light from the optical waveguide, in a semiconductor laser device having a current block structure that is very weak in terms of light confinement in the transverse direction. Specifically, the inventors have focused on the light leaking in the transverse direction and the width of current constriction produced by the current block structure and the shape of a pair of grooves formed lateral to an optical waveguide.

The inventors of the present disclosure have come up with the idea of making inclined faces by inclining the side faces of the stacked structure of semiconductor layers. They also have found the way of causing the light leaking in the transverse direction from an optical waveguide to be reflected off the above side faces (inclined faces) and thereby preventing that light from returning to the active layer in the optical waveguide. Specifically, the inventors of the present disclosure have conducted a detailed study of a path through which the reflected light leaking from the optical waveguide and reflected off the side faces returns to the active layer region in the optical waveguide, and they also have estimated an internal reflection distance with respect to the inclination angle of the side faces. In this way, by accurately estimating the distance (internal reflection distance) from a reflecting point where the leakage light is reflected off the inclined faces to a return point where the light returns to the active layer region, the inventors have newly found that, if the active layer within the optical waveguide is arranged at the internal reflection distance or more from the reflecting point, the light leaking from the optical waveguide in the transverse direction can be basically inhibited from being fed back into the active layer through the side faces.

The present disclosure has been made in view of the circumstances described above, and it is an object of the present disclosure to provide a gain-induced guiding semiconductor laser device that can, even with a very weak structure in terms of light confinement in the transverse direction, inhibit the light leaking in the transverse direction out of leakage light from the optical waveguide from being fed back into the active layer through the pair of side faces of the stacked structure of semiconductor layers, operate in a stable multiple transverse mode in the cavity length direction even if the amount of current injection is increased, and reduce the distance between the pair of side faces of the stacked structure to minimize the emitter width and achieve high integration. Hence, an object of the present disclosure is to provide a high-power, long-term reliable semiconductor laser device.

To achieve the object described above, one aspect of the semiconductor laser device according to the present disclosure includes a substrate having a main surface, and a stacked structure including a first conductivity-side semiconductor layer, an active layer, and a second conductivity-side semiconductor layer that are sequentially stacked above the main surface of the substrate. The second conductivity-side semiconductor layer includes a current block layer having an opening that delimits a current injection region. Two side faces as a pair are formed in portions of the stacked structure that range from part of the first conductivity-side semiconductor layer to the second conductivity-side semiconductor layer. The active layer has a second width greater than a first width of the opening. The pair of side faces in at least part of the first conductivity-side semiconductor layer is inclined to the main surface of the substrate. A maximum intensity position in a light distribution of light guided in the stacked structure, in a direction of a normal to the main surface of the substrate, is within the first conductivity-side semiconductor layer.

With the semiconductor laser device according to the present disclosure, high-power emission with high optical output per emitter, which is impracticable with a single-mode laser, is made possible by lasing in a multiple transverse mode in a high-output semiconductor laser device with optical output at levels of 10 W per emitter. The current injection region is delimited by the opening of the current block layer provided in the second conductivity-side semiconductor layer, and carriers can be injected in a free form into an in-plane region of the active layer that contributes to the oscillation mode. Since the current block layer is embedded in the second conductivity-side semiconductor layer, the entire upper portion of the second conductivity-side semiconductor layer can be used as a contact electrode. Accordingly, it is possible to maximize the area of contact, reduce contact resistance, and thereby reduce a drive voltage. It is also possible to reduce temperature in the active layer and improve thermal saturation characteristics because the path of heat dissipation is widened.

Moreover, the optical density on the light exit end face can be reduced by causing the current injection region to lase in a multiple transverse mode according to the shape of the opening of the current block layer. This suppresses the occurrence of COD.

The side faces in at least part of the first conductivity-side semiconductor layer are inclined to the main surface of the substrate. Thus, leakage light that leaks in the transverse direction from the guided mode oscillating in a multiple transverse mode in the cavity length direction can be reflected off the pair of side faces and attenuated, the transverse direction being a direction orthogonal to the cavity length direction and parallel to the main surface of the substrate. This suppresses a guided mode that causes the feedback of leakage light into the active layer through the pair of side faces, the leakage light being light originally not intended to oscillate and propagating in a direction parallel to the main surface of the substrate and orthogonal to the cavity length direction. Accordingly, the semiconductor laser device can operate stably in a multiple transverse mode even at high levels of current injection.

As for the light distribution in the structure of light confinement in the stacking direction, i.e., the direction of the normal to the main surface of the substrate, the amount of optical waveguide losses in the structure having a maximum intensity of the light distribution within the active layer is generally in the range of approximately 2 to 3 cm$^{-1}$. However, a high-output semiconductor laser device at levels of several tens of watts per emitter requires a very large operating current and suffers a large amount of optical waveguide losses. In this regard, the semiconductor laser device according to the present disclosure can reduce losses obtained by adding waveguide losses $\alpha_i$ and free carrier losses $\alpha_{free}$, out of overall losses in the optical waveguide, because the maximum intensity position of the light distribution in the direction of the normal to the main surface of the substrate is within the first conductivity-side semiconductor layer. Accordingly, it is possible to achieve a low-loss optical waveguide and thereby to reduce the threshold current and the operating current.

In one aspect of the semiconductor laser device according to the present disclosure, each of the pair of side faces may include a first side face on a side close to the substrate and a second side face on a side farther away from the substrate. θ1 may be less than 90 degrees, θ1 being an angle formed by a direction of a normal to the first side face and the direction of the normal to the main surface of the substrate, and θ2 may be greater than 90 degrees, θ2 being an angle formed by a direction of a normal to the second side face and the direction of the normal to the main surface of the substrate.

With this configuration, the width on the second conductive side of the stacked structure increases as the distance from the substrate increases. This increases the area of contact during heat dissipation through the upper portion of the second conductivity-side semiconductor layer, so that the path of heat dissipation is widened and heat can be exhausted efficiently at high output. Moreover, since the area of contact between each layer on the second conductive side of the stacked structure can be increased, it is possible to reduce contact resistance at the time of arranging the electrode in the upper portion and to reduce the operating voltage.

In one aspect of the semiconductor laser device according to the present disclosure, the stacked structure may have a narrowest portion in an area ranging from part of the first conductivity-side semiconductor layer to the second conductivity-side semiconductor layer that are sandwiched between the pair of side faces. The narrowest portion has a width greater than the first width.

With this configuration, heat generated at the time of current injection into the active layer through the width (first width) of the opening of the current block layer is exhausted upward of the second conductivity-side semiconductor layer by an amount corresponding to the heat generated in the active layer region that has passed current and by an amount corresponding to the heat generated by resistance components in each layer existing in the current path of the stacked structure. Since the width of the narrowest portion of the second conductivity-side semiconductor layer is greater than the first width, heat can be radiated upward of the second conductivity-side semiconductor layer without the need to narrow the path of heat dissipation for heat that is diffused radially. Accordingly, it is possible to emit laser light at high output without lowering the level of thermal saturation at high levels of current injection.

In one aspect of the semiconductor laser device according to the present disclosure, the narrowest portion may be within the second conductivity-side semiconductor layer.

With this configuration, heat generated at the time of current injection into the active layer through the opening width of the opening of the current block layer is exhausted upward of the second conductivity-side semiconductor layer by an amount corresponding to the heat generated in the active layer region that has passed current and by an amount corresponding to the heat generated by resistance components in each layer existing in the current path of the stacked structure. Since the narrowest portion is within the second conductivity-side semiconductor layer, sufficient thermal diffusion occurs radially in the transverse direction of the stacked structure before the above amounts of heat reach the narrowest portion, and accordingly heat is diffused to the entire stacked structure. Moreover, heat exhaust efficiency improves because the width of the stacked structure increases from above the narrowest portion of the second conductivity-side semiconductor layer so as to increase the area of each layer and widen the path of heat dissipation. Accordingly, it is possible to emit laser light at higher output without lowering the level of thermal saturation at high levels of current injection.

In one aspect of the semiconductor laser device according to the present disclosure, the second conductivity-side semiconductor layer may include a second conductivity-side first semiconductor layer, a second conductivity-side second semiconductor layer, and a second conductivity-side contact layer that are provided on the substrate in an order mentioned. The current block layer may be within the second conductivity-side contact layer. The narrowest portion may be in close proximity to an interface between the second conductivity-side second semiconductor layer and the second conductivity-side contact layer.

By making the pair of side faces into inclined faces, it is possible to suppress the feedback of primary reflected light into a light distribution that is distributed slightly in the second conductivity-side first semiconductor layer of the second conductivity-side semiconductor layer. The primary reflected light is leakage light leaking in the transverse direction from the second conductivity-side first semiconductor layer and reflected off the pair of side faces. This suppresses a guided mode originally not intended to oscillate and configured via leakage light, the pair of side faces of the second conductivity-side first semiconductor layer, and the active layer region within the light distribution. Accordingly, it is possible to achieve stable lasing in a multiple transverse mode.

In one aspect of the semiconductor laser device according to the present disclosure, the first conductivity-side semiconductor layer includes a first conductivity-side first semiconductor layer and a first conductivity-side second semiconductor layer that are provided on the substrate in an order mentioned. If θ [°] is an angle formed by one of the pair of side faces and the main surface of the substrate, d [µm] is a thickness from the active layer to an interface between the first conductivity-side first, semiconductor layer and the first conductivity-side second semiconductor layer, Nw [µm] is a width of the light distribution of the light guided in the stacked structure, Ws is an opening width that is the first width, and X [µm] is a distance from a side face of the opening of the current block layer to an intersection of the one of the pair of side faces and an interface between the active layer and the first conductivity-side second semiconductor layer, the following relation is satisfied:

$$0° < \theta < 90\left[1° - \frac{1}{\pi}\text{Arctan}\left\{\frac{4d}{2X - (Nw - Ws)}\right\}\right];$$

$$-\frac{\pi}{2} < \text{Arctan}\left\{\frac{4d}{2X - (Nw - Ws)}\right\} < \frac{\pi}{2}$$

Leakage light that leaks from a guided mode lasing in a multiple transverse mode in a direction orthogonal to the cavity length direction and parallel to the interface with the active layer, propagates in a direction toward the pair of side faces. When the angle θ formed by the pair of side faces and the direction horizontal to the main surface of the substrate is less than or equal to 45°, leakage light that leaks from the optical waveguide in the transverse direction attenuates remarkably because it is reflected off the pair of side faces (inclined faces) and propagates diagonally downward. Thus, the leakage light can be inhibited from being reflected off the pair of side faces and fed back into the active layer. This allows the semiconductor laser device to stably operate in a multiple transverse mode even at high levels of current injection. When the angle θ formed by the pair of side faces and the direction horizontal to the main surface of the substrate is greater than 45°, leakage light that leaks from the optical waveguide in the transverse direction turns into primary reflected light as a result of being reflected off the side faces (inclined faces) of the first conductivity-side second semiconductor layer, and changes its direction. The primary reflected light further turns into secondary reflected light as a result of being reflected off the interface between the first conductivity-side first semiconductor layer and the first conductivity-side second semiconductor layer, and returns in a direction toward the light distribution, which is the source of light leakage. If the inclination angle θ is set so as to satisfy the above expression, it is possible to suppress the influence of leakage light that leaks from the light distribution on the light distribution, which is the source of leakage, and to allow the semiconductor laser device to stably operate.

In one aspect of the semiconductor laser device according to the present disclosure, the first conductivity-side semiconductor layer includes a first conductivity-side first semiconductor layer and a first conductivity-side second semiconductor layer that are provided on the substrate in an order mentioned.

The second conductivity-side semiconductor layer includes a second conductivity-side first semiconductor layer and a second conductivity-side second semiconductor layer that are provided on the substrate in an order mentioned. The following relations may be satisfied:

$$n_{22} < n_{11} < n_{12}, \text{ and}$$

$$n_{12} \geq n_{21}$$

where $n_{11}$, $n_{12}$, $n_{21}$, and $n_{22}$ are respectively refractive indices of the first conductivity-side first semiconductor layer, the first conductivity-side second semiconductor layer, the second conductivity-side first semiconductor layer, and the second conductivity-side second semiconductor layer.

The distribution of light in the structure of line confinement in the stacking direction of the stacked structure is controlled by differences in the refractive indices of semiconducting materials, and light is distributed on the average toward a higher refractive index distribution. Accordingly, if the refractive index ($n_{22}$) of the second conductivity-side second semiconductor layer is set to a lowest value, and the refractive index ($n_{11}$) of the first conductivity-side first semiconductor layer is set to the second lowest value, the light distribution can be distributed in the first conductivity-side second semiconductor layer sandwiched between the first conductivity-side first semiconductor layer and the second conductivity-side second semiconductor layer, in the active layer, and in the second conductivity-side first semiconductor layer, and the light distribution is biased to the first conductivity-side second semiconductor layer. Since the refractive index ($n_{12}$) of the first conductivity-side second semiconductor layer is higher than or equal to the refractive index ($n_{21}$) of the second conductivity-side first semiconductor layer, the light distribution in the stacking direction can be distributed in the first conductivity-side second semiconductor layer. Thus, losses obtained by adding waveguide losses $\alpha_i$ and free carrier losses $\alpha_{free}$ can be reduced, out of overall losses in the waveguide. Accordingly, it is possible to achieve a low-loss waveguide and to reduce the threshold current and the operating current.

In one aspect of the semiconductor laser device according to the present disclosure, the pair of side faces may be covered with a dielectric film.

With this configuration, when the semiconductor laser device is mounted on a heat-sink (sub-mount) via solder with the upper side of the second conductivity-side semiconductor layer facing the heat sink side, it is possible to prevent the solder that laterally enters the side faces (inclined faces) from coming in contact with part of the first conductivity-side semiconductor layer and allowing the passage of leakage current. In the case of forming the second electrode, since the pair of side faces, both being inclined faces, is covered with a dielectric film, it is possible to prevent the second electrode from making its way around the stacked structure and passing leakage current to the stacked structure. It is also possible to improve heat dissipation capability, so that even if single- or multi-layer metal having high heat dissipation capability, such as Au or a solder member, is embedded laterally in the side faces, the passage of leakage current can be prevented because the pair of side faces is covered with the dielectric film.

In one aspect of the semiconductor laser device according to the present disclosure, the active layer may have a quantum well structure that includes one or more quantum well layers. A total thickness of the one or more quantum well layers in the active layer may be less than or equal to 100 angstroms.

With this configuration, since the thickness of the active layer is reduced, the active layer that contributes to lasing decreases in volume, and is made transparent as a result of threshold gain being reached with a small amount of current injection. At the time of current injection, diffusion current diffused from the opening is injected into the active layer region immediately below the opening of the current block layer and in the lower portion of the current block layer around the opening, and the active layer is made transparent with a small amount of current because the active layer structure is a thin-film quantum well structure. Thus, mode losses in the active layer are very small, and the light distribution is less likely to be absorbed in the active layer and expands widely in the transverse direction. This increases optical density on the light exit end face and reduces the occurrence of COD. Since the proportion of light in the active layer is reduced, gain saturation is less likely to occur, and a high-power semiconductor laser device can be achieved with a low threshold current.

In one aspect of the semiconductor laser device according to the present disclosure, the opening may include a plurality of openings. Each of the plurality of openings may be isolated by an isolation groove that spans from part of the first conductivity-side semiconductor layer to the second conductivity-side semiconductor layer.

With this configuration, when the optical axis of each emitter is adjusted, the positions of light-emitting points can be controlled with high precision by the emitter pitch of adjacent emitters, and the stacked structure for each emitter is made of the same thickness on the same substrate. Thus, the light-emitting point of each emitter can be easily made to the same height. In addition, it is possible to increase optical output by an amount corresponding to the number of emitters, and to achieve a compactly integrated, high-power semiconductor laser device.

In one aspect of the semiconductor laser device according to the present disclosure, the current block layer may be made of a first conductive semiconductor.

Thermal conductivity can be improved by configuring the current block layer of a semiconducting material. This causes electrons and holes injected from the first and second electrodes to be recombined and emit light in the active layer, and heat generated at this time propagates radially from the current injection region into the stacked structure. At this time, heat propagating from the active layer can be dissipated radially without causing accumulation of heat in the current block layer, because the current block layer in the second conductivity-side semiconductor layer has high thermal conductivity. In particular, in the case of P-side-down mounting in which the second conductivity-side semiconductor layer side is mounted on a heat-sink (sub-mount), the position of the active layer serving as a heat generator can be brought relatively closer to the heat sink because the capability of heat dissipation through a region of the current block layer can be ensured. This improves heat dissipation capability, and accordingly it is possible to further improve the level of thermal saturation at high levels of current injection and to emit laser light at higher output levels.

Moreover, the semiconductor laser device is superior in reverse bias characteristics because the polarity of the current block layer is of a first conductivity type. Thus, the stacked structure region with the current block layer inserted therein forms a thyristor structure because this region is a stacked structure of the first conductivity type, the active layer, the second conductivity type, the first conductivity type (current block layer), and the second conductivity type when viewed from the substrate side. Accordingly, it is possible to ensure the width of a depletion layer and keep a satisfactory current block function in the stacked structure region where the current block layer exists during the application of a forward bias even if the thickness of the current block layer is reduced. For example, an excellent current block function can be achieved even if the thickness of the current block layer is reduced to a value in the range of approximately 0.5 μm to 0.1 μm. In addition, low resistance can be achieved because the thickness of the second conductivity-side semiconductor layer is reduced with decreasing thickness of the current block layer.

In one aspect of the semiconductor laser device according to the present disclosure, a distribution of the light guided in the stacked structure, in a direction horizontal to the main surface of the substrate, may have a width greater than the first width of the opening.

With this configuration, the opening width of the current block layer is sufficiently wide for lasing in a multiple transverse mode, and current is diffused radially in the downward direction of the first conductivity-side semiconductor layer. Since the gain-induced guiding laser structure is weak in terms of light confinement in the transverse direction, it is possible to enlarge the region of the active layer in the transverse direction that reaches threshold gain with diffusion current that is diffused radially from the opening of the current block layer toward the substrate, and to increase the distribution width of the light oscillating in a multiple transverse mode to a value greater than the opening width of the opening of the current block layer. This reduces the optical density on the light exit end face and improves the level of COD. The enlargement of the area of the active layer that contributes to a lasing guided mode enables expanding a region of heat generation, reducing the density of heat generation, and reducing the temperature in the active layer. In actual dimensions, the opening width of the opening of the current block layer is very wide and in the range of 50 μm to 300 μm, whereas the distance from the current block layer to the active layer in the stacking direction is approximately 0.5 μm, and less than or equal to 10 μm at the maximum. Thus, the diffusion length of current in the transverse direction from the boundary of the opening of the current block layer is less than or equal to 10 μm, and the amount of increase in the optical distribution width with respect to the opening width of the opening of the current block layer is approximately in the neighborhood of 10 μm.

One aspect of a semiconductor laser module according to the present disclosure includes one of the semiconductor laser devices described above.

Accordingly, it is possible to achieve a semiconductor laser module including a high-power, low-voltage-driven semiconductor laser device.

One aspect of a welding laser light source system according to the present disclosure includes one of the semiconductor laser devices described above.

Accordingly, it is possible to construct a welding laser light source system including a high-power, low-voltage-driven semiconductor laser device.

Embodiments according to the present disclosure will be described hereinafter with reference to the drawings. Note that each embodiment described below shows a preferable specific example of the present disclosure. Thus, numerical values, shapes, materials, structural elements, locations and connection forms of the structural elements, steps (process steps), a sequence of steps, and so on shown in the following embodiments are illustrative only and not intended to limit the present disclosure. Among the structural elements described in the following embodiments, those that are not recited in independent claims, which indicate the broadest concept of the present disclosure, are described as arbitrary structural elements.

Each drawing is a schematic and does not necessarily provide precise depiction. Therefore, scale reduction and the like in the figures are not necessarily the same. Substantially the same structural elements are given the same reference signs throughout the drawings, and detailed description thereof is omitted or simplified.

Embodiment 1

Configuration of Semiconductor Laser Device

Figure 2:
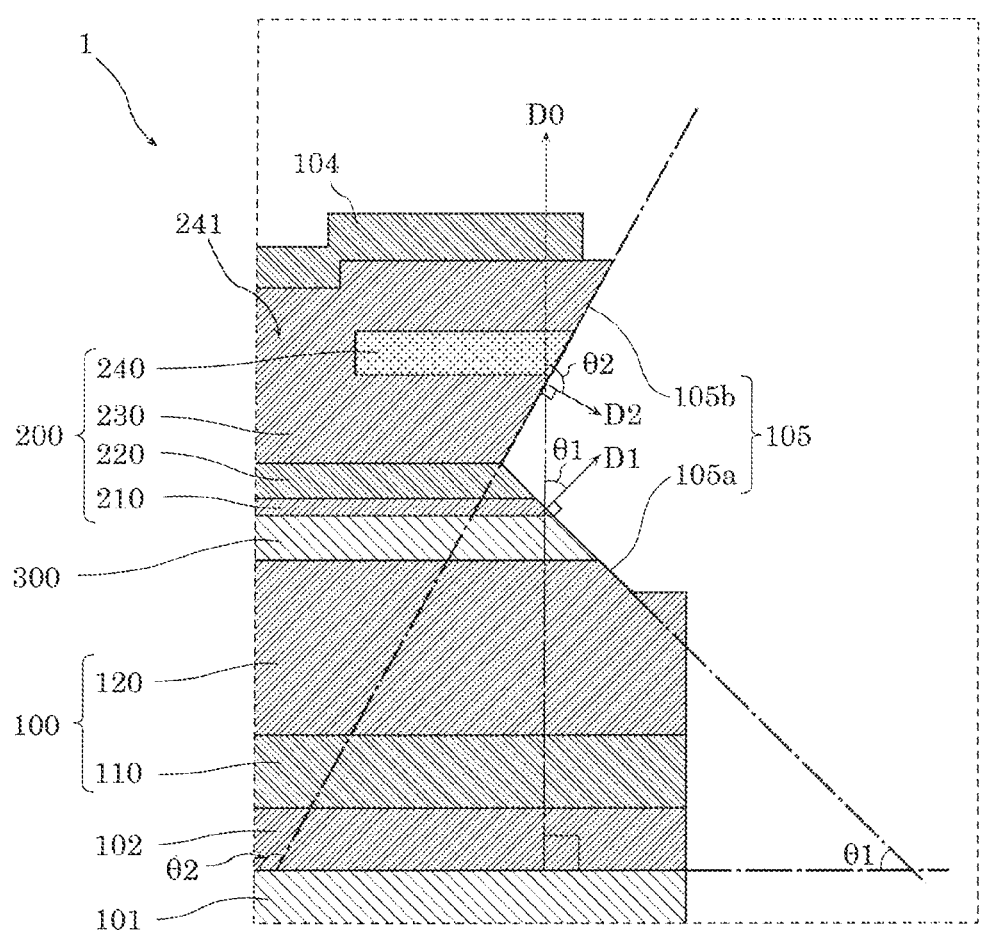
FIG. 2 is an enlarged view of region II enclosed by a broken line in FIG. 1.
Figure 3:
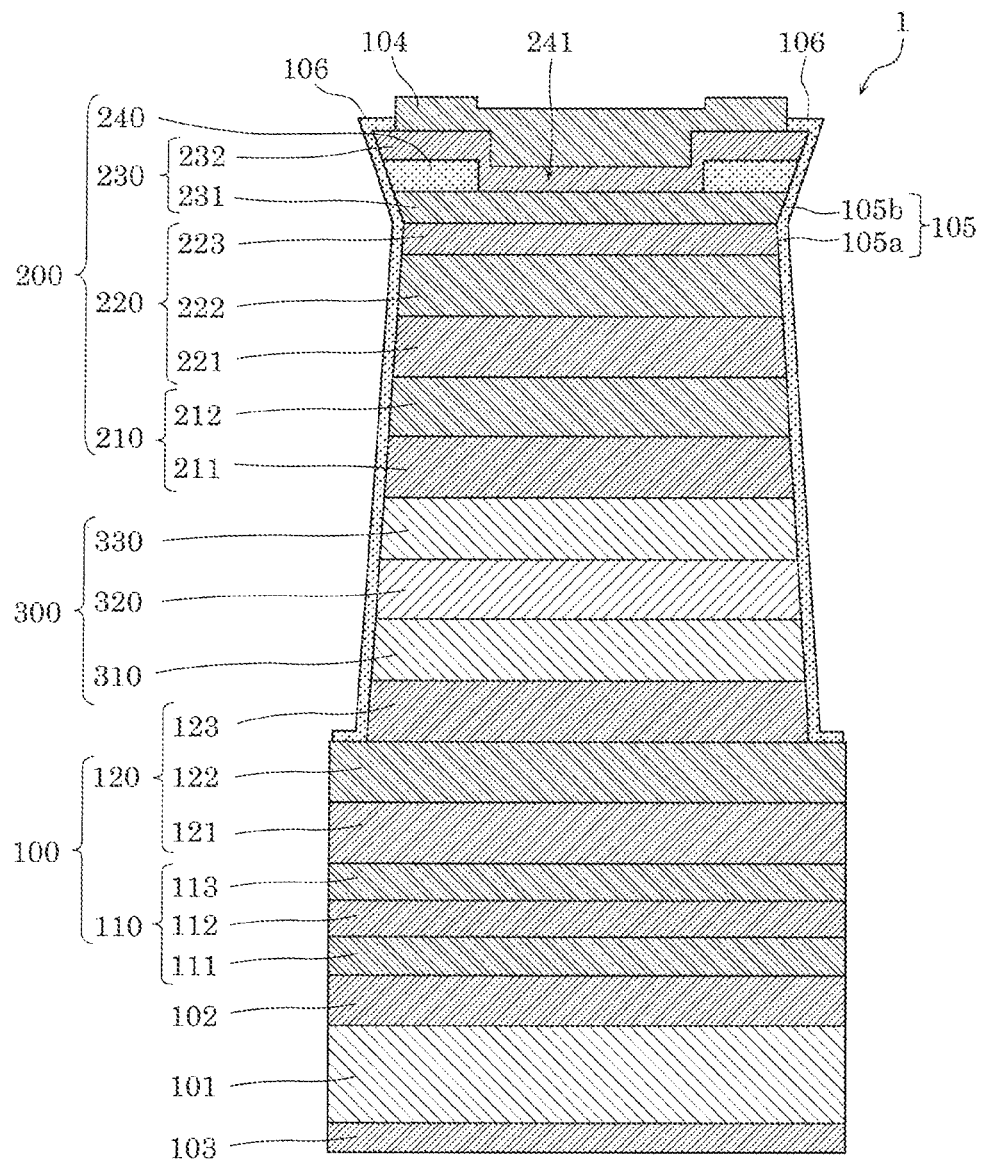
FIG. 3 is a sectional view illustrating a detailed configuration of the semiconductor laser device according to Embodiment 1.

First, a configuration of semiconductor laser device 1 according to Embodiment 1 will be described with reference to FIGS. 1 to 3. FIG. 1 is a sectional view illustrating a schematic configuration of semiconductor laser device 1 according to Embodiment 1. FIG. 2 is an enlarged view of region II enclosed by the broken line in FIG. 1. FIG. 3 is a sectional view of a detailed configuration of semiconductor laser device 1 according to Embodiment 1. Note that dielectric film 106 is not shown in FIG. 2.

As illustrated in FIGS. 1 and 2, semiconductor laser device 1 according to Embodiment 1 includes a stacked structure in which first conductivity-side semiconductor layer 100, active layer 300, and second conductivity-side semiconductor layer 200 are sequentially stacked above a main surface of substrate 101. Semiconductor laser device 1 further includes first electrode 103 below first conductivity-side semiconductor layer 100, and second electrode 104 above second conductivity-side semiconductor layer 200.

Specifically, semiconductor laser device 1 includes substrate 101, buffer layer 102 formed on substrate 101, first conductivity-side semiconductor layer 100 formed on buffer layer 102, active layer 300 formed on first conductivity-side semiconductor layer 100, second conductivity-side semiconductor layer 200 formed on active layer 300, first electrode 103 formed on the lower face of substrate 101, and second electrode 104 formed on second conductivity-side semiconductor layer 200. In the present embodiment, a first conductivity type is an n-type, and a second conductivity type is a p-type, which is different from the first conductivity type. Thus, first electrode 103 is an n-side electrode, and second electrode 104 is a p-side electrode. First and second electrodes 103 and 104 supply current to the stacked structure.

Hereinafter, each structural member in the stacked structure of semiconductor laser device 1 will be described in detail with reference to FIG. 3 as well as FIGS. 1 and 2.

Substrate 101 is a flat plate-like substrate having uniformly plane main surfaces. In the present embodiment, substrate 101 is an n-GaAs substrate.

Buffer layer 102 is, for example, an n-GaAs layer with a thickness of 0.5 µm, and is stacked on substrate 101. Specifically, buffer layer 102 is formed on the upper face of substrate 101.

First conductivity-side semiconductor layer 100 is, for example, an n-side semiconductor layer and configured by a plurality of semiconductor layers. Specifically, first conductivity-side semiconductor layer 100 includes n-side first semiconductor layer 110 (first conductivity-side first semiconductor layer) and n-side second semiconductor layer 120 (first conductivity-side second semiconductor layer) that are stacked in this order from the side close to substrate 101.

N-side first semiconductor layer 110 is an n-side cladding layer formed on buffer layer 102. In the present embodiment, n-side first semiconductor layer 110 is an n-type cladding layer (first conductivity-type cladding layer) with a total thickness of 3.395 µm, and has a composition of $Al_xGa_{1-x}As$ ($0<x<1$).

N-side first semiconductor layer 110 is made of a stacked film of two or more layers having different Al compositions. Specifically, n-side first semiconductor layer 110 is a stacked film in which n-type first cladding layer 111 made of n-$Al_{0.15}Ga_{0.85}As$ (with a thickness of 0.05 µm and an Si doping concentration of $1\times10^{18}/cm^3$), n-type second cladding layer 112 made of n-$Al_{0.335}Ga_{0.665}As$ (with a thickness of 2.85 µm and an Si doping concentration of $1\times10^{18}/cm^3$), and n-type third cladding layer 113 made of n-$Al_{0.335}Ga_{0.665}As$ (with a thickness of 0.465 µm and an Si doping concentration of $4\times10^{16}/cm^3$) are sequentially stacked. In the stacked film of n-side first semiconductor layer 110, a film whose composition has a lower Al concentration is arranged on the side farther away from active layer 300.

N-side second semiconductor layer 120 is an n-side light guiding layer (first light guiding layer) formed on n-side first semiconductor layer 110. N-side second semiconductor layer 120 is formed between n-side first semiconductor layer 110 and active layer 300. In the present embodiment, n-side second semiconductor layer 120 is an n-type light guiding layer (first conductivity-type light guiding layer) with a total thickness of 0.605 µm, and has a composition of $Al_xGa_{1-x}As$ ($0<x<1$).

N-side second semiconductor layer 120 (first light guiding layer) is made of a stacked film of two or more layers having different Al compositions. Specifically, n-side second semiconductor layer 120 is a stacked film in which n-type first optical waveguide layer 121 made of n-$Al_{0.27}Ga_{0.73}As$ (with a thickness of 0.56 µm and an Si doping concentration of $4\times10^{16}/cm^3$), n-type second optical waveguide layer 122 made of n-$Al_{0.27}Ga_{0.73}As$ (with a thickness of 0.040 µm and an Si doping concentration of $8\times10^{16}/cm^3$), and n-type third optical waveguide layer 123 made of n-$Al_{0.25}Ga_{0.75}As$ (with a thickness of 0.005 µm and an Si doping concentration of $5\times10^{17}/cm^3$) are sequentially stacked. In the stacked film of n-side second semiconductor layer 120, a film whose composition has a lower Al concentration is arranged on the side closer to active layer 300.

Second conductivity-side semiconductor layer 200 on active layer 300 is, for example, a p-side semiconductor layer and configured by a plurality of semiconductor layers.

Specifically, second conductivity-side semiconductor layer 200 includes p-side first semiconductor layer 210, p-side second semiconductor layer 220, and p-side third semiconductor layer 230 in order from the side closer to active layer 300. Second conductivity-side semiconductor layer 200 further includes current block layer 240 as a p-side fourth semiconductor layer.

P-side first semiconductor layer 210 is a p-side light guiding layer (second light guiding layer) formed on active layer 300. P-side first semiconductor layer 210 (second light guiding layer) is formed between active layer 300 and p-side second semiconductor layer 220. In the present embodiment, p-side first semiconductor layer 210 is a p-type light guiding layer (second conductivity-type light guiding layer) and has a composition of $Al_xGa_{1-x}As$ ($0<x<1$).

P-side first semiconductor layer 210 (second light guiding layer) is made of a stacked film of two or more layers having different Al compositions. Specifically, p-side first semiconductor layer 210 is a stacked film in which first optical waveguide layer 211 made of un-$Al_{0.3}Ga_{0.7}As$ (with a thickness of 0.03 µm) and p-type second optical waveguide layer 212 made of p-$Al_{0.4}Ga_{0.6}As$ (with a thickness of 0.131 µm and a C doping concentration of $1.5\times10^{17}/cm^3$) are sequentially stacked. In the stacked film of p-side first semiconductor layer 210, a film whose composition has a lower Al concentration is arranged on the side closer to active layer 300.

In p-side first semiconductor layer 210, first optical waveguide layer 211 is an undoped light guiding layer in which impurities are not doped intentionally. In this way, p-side first semiconductor layer 210 includes the undoped light guiding layer (first optical waveguide layer 211) on the side close to active layer 300.

P-side second semiconductor layer 220 is a p-side cladding layer formed on p-side first semiconductor layer 210. P-side second semiconductor layer 220 is formed between p-side first semiconductor layer 210 and p-side third semiconductor layer 230. In the present embodiment, p-side second semiconductor layer 220 is a p-type cladding layer (second conductivity type cladding layer) with a total thickness of 0.75 µm and has a composition of $Al_xGa_{1-x}As$ ($0<x<1$).

P-side second semiconductor layer 220 is made of a stacked film of two or more layers having different Al compositions. Specifically, p-side second semiconductor layer 220 is a stacked film in which p-type first cladding layer 221 made of p-$Al_{0.65}Ga_{0.35}As$ (with a thickness of 0.05 µm and a C doping concentration of $3\times10^{17}/cm^3$), p-type second cladding layer 222 made of p-$Al_{0.65}Ga_{0.35}As$ (with a thickness of 0.65 µm and a C doping concentration of $4\times10^{18}/cm^3$), and p-type third cladding layer 223 made of p-$Al_{0.15}Ga_{0.85}As$ (with a thickness of 0.05 µm and a C doping concentration of $4\times10^{18}/cm^3$) are sequentially stacked. In the stacked film of p-side second semiconductor layer 220, a film whose composition has a lower Al concentration is arranged on the side farther away from active layer 300.

P-side third semiconductor layer 230 is a p-side contact layer (second conductivity-side contact layer) formed on p-side second semiconductor layer 220. P-side third semiconductor layer 230 is formed between p-side second semiconductor layer 220 and second electrode 104. In the present embodiment, p-side third semiconductor layer 230 is a p-type contact layer (second conductivity-type contact layer) and has a composition of GaAs.

P-side third semiconductor layer 230 includes first contact layer 231 and second contact layer 232. First contact layer 231 is made of p-GaAs with a thickness of 0.4 μm and a C doping concentration of $3×10^{17}/cm^3$ and is formed on p-side second semiconductor layer 220. Second contact layer 232 is made of p-GaAs with a thickness of 1.75 μm and produced by gradually increasing the C doping concentration to a value in the range of $1×10^{18}$ to $3×10^{19}/cm^3$. P-side third semiconductor layer 230 is further formed on first contact layer 231 and on current block layer 240 so as to fill opening 241 of current block layer 240.

Current block layer 240 is provided within p-side third semiconductor layer 230 (second conductivity-side-type contact layer). Current block layer 240 is formed on first contact layer 231 of p-side third semiconductor layer 230.

In the present embodiment, current block layer 240 is a first conductivity-type current block layer made of a first conductive semiconductor. Specifically, current block layer 240 is an n-type current block layer made of n-GaAs having a thickness of 0.45 μm and doped with Si at a doping concentration of $2×10^{18}/cm^3$. Current block layer 240 has opening 241 for delimiting a current injection region. Opening 241 of current block layer 240 has a first width as an opening width (stripe width) and extends linearly in a cavity length direction of semiconductor laser device 1 (longitudinal direction of the resonator).

In this way, n-GaAs is used as the material for current block layer 240 in the present embodiment. This is because the angle of transverse spreading of laser light becomes wider under the influence of diffraction caused by a difference in refractive index and cannot be narrowed due to the influence of a fixed refractive index, which is one issue in real refractive index semiconductor laser devices in which the refractive index distribution is given in the transverse direction of the section of semiconductor laser device 1.

Active layer 300 is formed on first conductivity-side semiconductor layer 100. Specifically, active layer 300 is formed between first conductivity-side semiconductor layer 100 and second conductivity-side semiconductor layer 200. Active layer 300 has a second width greater than the width (first width) of opening 241 of current block layer 240.

In the present embodiment, active layer 300 has a single quantum well structure that includes a single quantum well layer. Active layer 300 has a composition of $In_xGa_{1-x}As$ (0≤x≤1). In this case, when 0<x<1, the emission wavelength is in the range of 830 nm to 1000 nm, and when x=0 (GaAs), the emission wavelength is in the range of 780 nm to 860 nm.

Specifically, active layer 300 is a stacked film in which first barrier layer 310 made of un-$Al_{0.25}Ga_{0.75}As$ (with a thickness of 0.005 μm), well layer 320 made of un-$In_{0.17}Ga_{0.83}As$ (with a thickness of 0.008 μm), and second barrier layer 330 made of un-$Al_{0.25}Ga_{0.75}As$ (with a thickness of 0.01 μm) are sequentially stacked. First barrier layer 310, well layer 320, and second barrier layer 330 are all undoped layers in which impurities are not doped intentionally.

The structure of active layer 300 is not limited to a single quantum well structure, and may be a multiple quantum well structure including a plurality of quantum well layers. In either case where active layer 300 has a single quantum well structure or a multiple quantum well structure, a total thickness of the quantum well layer(s) in active layer 300 may be less than or equal to 100 angstroms.

Semiconductor laser device 1 with this configuration is an end-face emission semiconductor laser element, and oscillates in a transverse mode and a multi-mode (multiple transverse mode) and emits laser light from the light exit end face when current is injected from first and second electrodes 103 and 104.

Semiconductor laser device 1 also has inclined portions on the side faces of the stacked structure. Specifically, as illustrated in FIGS. 1 to 3, semiconductor laser device 1 has a pair of side faces 105 as the side faces of the stacked structure, side faces 105 being located inward of the width of substrate 101 and ranging from second conductivity-side semiconductor layer 200 to first conductivity-side semiconductor layer 100. Side faces 105 are formed as inclined faces in portions that range from part of first conductivity-side semiconductor layer 100 to second conductivity-side semiconductor layer 200.

In the present embodiment, side faces 105 (inclined faces) are formed, ranging from part of n-side second semiconductor layer 120 of first conductivity-side semiconductor layer 100. Specifically, as illustrated in FIG. 3, side faces 105 are formed in upper portions that range from n-type third optical waveguide layer 123 of n-side second semiconductor layer 120, but the present disclosure is not limited to this example. For example, side faces 105 may be formed in upper portions that range from n-type first optical waveguide layer 121.

Side faces 105 originate in grooves for dividing a plurality of semiconductor laser devices formed on a wafer into individual pieces. Thus, the height of side faces 105 corresponds to the depth of the isolation grooves, which is the distance from the outermost surface of second conductivity-side semiconductor layer 200 to the lower ends (bottoms) of the isolation grooves formed in first conductivity-side semiconductor layer 100. When the bottoms of the isolation grooves are surfaces parallel to the main surface of substrate 101, the positions of the lower ends of the isolation grooves correspond to the positions of these surfaces (bottom faces). When the isolation grooves are V-shaped grooves, the positions of the lower ends correspond to the positions of the vertices of the isolation grooves.

The stacked structure of semiconductor laser device 1 has a narrowest portion in a portion that ranges from part of first conductivity-side semiconductor layer 100 to second conductivity-side semiconductor layer 200 and that is sandwiched by the pair of side faces 105. The narrowest portion is where the stacked structure has a smallest width. That is, the space between side faces 105 becomes a minimum at the narrowest portion.

The narrowest portion of the stacked structure is within second conductivity-side semiconductor layer 200. In the present embodiment, the narrowest portion is in the vicinity of the interface between p-side second semiconductor layer 220 and p-side third semiconductor layer 230. Specifically, the narrowest portion is at the interface between p-side second semiconductor layer 220 and first contact layer 231. In the present embodiment, the narrowest portion has a width greater than the opening width (first width) of opening 241 of current block layer 240.

In semiconductor laser device 1, the pair of side faces 105 is inclined so that the stacked structure becomes constricted at the narrowest portion. The pair of side faces 105 is inclined so as to bend such that the space therebetween becomes a minimum at the narrowest portion. Specifically, side faces 105 are inclined in a flared mesa shape from first conductivity-side semiconductor layer 100 through active layer 300 to the narrowest portion, and then inclined in an inverted flared mesa shape from the narrowest portion to the upper face of second conductivity-side semiconductor layer 200.

In the present embodiment, the stacked structure is produced using a (100)-plane substrate tilted by 0.2° in the [011] direction as substrate 101. Thus, the stacked structure has almost a bilaterally symmetrical shape. Accordingly, side faces 105 also have almost a bilaterally symmetrical shape.

Each of side faces 105 includes first side face 105a located on the side close to substrate 101 and second side face 105b located on the side farther away from substrate 101, using the narrowest portion as a boundary.

First side face 105a of each of side faces 105 is configured by a first inclined face formed as at least part of the side face of first conductivity-side semiconductor layer 100, a second inclined face formed as the side face of active layer 300, and a third inclined face formed as part of the side face of second conductivity-side semiconductor layer 200.

First side face 105a is not parallel to the direction of the normal to the main surface of substrate 101, and is inclined to the main surface of substrate 101. In the present embodiment, two first side faces 105a of side faces 105 are inclined such that the space therebetween gradually increases as the distance to substrate 101 decreases. That is, the stacked structure sandwiched by two opposing first side faces 105a has a divergent shape (flared mesa shape) toward substrate 101.

Second side face 105b of each of side faces 105 is an inclined face formed as part of the side face of second conductivity-side semiconductor layer 200.

Second side face 105b is not parallel to the direction of the normal to the main surface of substrate 101, and is inclined to the main surface of substrate 101. In the present embodiment, two second side faces 105b of side faces 105 are inclined such that the space therebetween gradually increases as the distance from substrate 101 increases. That is, the stacked structure sandwiched by two opposing second side faces 105b has a divergent shape (inverted flared mesa shape) in the direction away from substrate 101.

In this way, each of the opposing side faces of second conductivity-side semiconductor layer 200 is configured by part of first side face 105a and second side face 105b, with the narrowest portion located between first and second side faces. That is, the side faces of second conductivity-side semiconductor layer 200 are configured by the pair of first side faces 105a located on the lower side of the narrowest portion and having a flared mesa shape, and the pair of second side faces 105b located on the upper side of the narrowest portion and having an inverted flared mesa shape, using the narrowest portion as a boundary.

In each of first side faces 105a inclined in a flared mesa shape, first angle θ1 formed by normal direction D1 of first side face 105a and normal direction D0 of the main surface of substrate 101 is smaller than 90 degrees (θ1<90°) as illustrated in FIG. 2.

In each of second side faces 105b inclined in an inverted flared mesa shape, second angle θ2 formed by normal direction D2 of second side face 105b and normal direction D0 of the main surface of substrate 101 is greater than 90 degrees (θ2>90°).

As illustrated in FIGS. 1 and 3, the pair of side faces 105 is covered with dielectric film 106. In the present embodiment, dielectric film 106 covers entire first side faces 105a and entire second side faces 105b. Specifically, dielectric film 106 covers inclined faces and flat faces (bottom faces of the isolation grooves) on the upper side of first conductivity-side semiconductor layer 100, the side faces of active layer 300, and the entire side faces of second conductivity-side semiconductor layer 200. Dielectric film 106 is made of, for example, SiN or $SiO_2$ and functions as a current block film.

Figure 4:
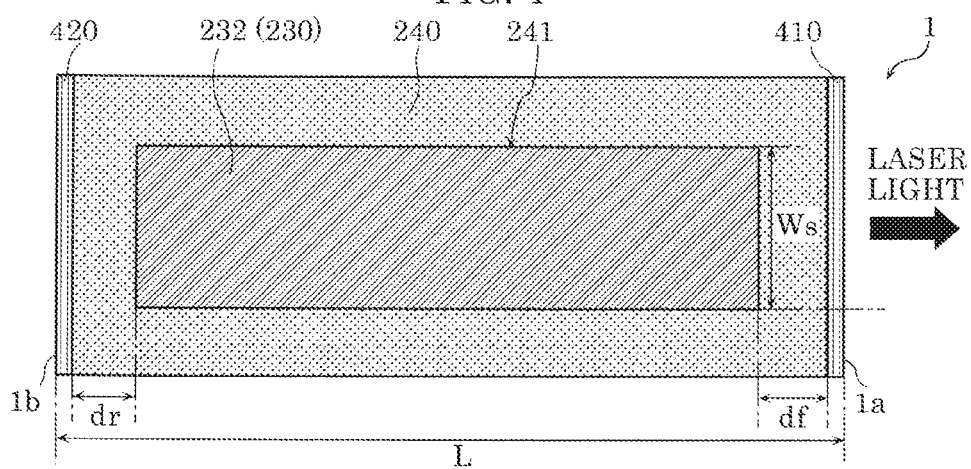
FIG. 4 is a sectional view of the semiconductor laser device according to Embodiment 1, cut away in a horizontal direction at a current block layer.

Next, the structure of semiconductor laser device 1 in the cavity length direction and the shape of opening 241 of current block layer 240 will be described with reference to FIG. 4. FIG. 4 is a sectional view of semiconductor laser device 1 according to Embodiment 1, cut away in the horizontal direction at current block layer 240.

The stacked structure of semiconductor laser device 1 has front end face 1a serving as an exit end face of laser light, and rear end face 1b that is the face on the opposite side to front end face 1a, as illustrated in FIG. 4.

The stacked structure of semiconductor laser device 1 also includes an optical waveguide using front and rear end faces 1a and 1b as reflecting mirrors of the resonator. The width of a current injection region toward the optical waveguide is delimited by opening 241 of current block layer 240. Specifically, the width of the current injection region is delimited by opening width Ws (first width) of opening 241 of current block layer 240.

Opening 241 of current block layer 240 is formed inward of front and rear end faces 1a and 1b serving as the end faces of the resonator. That is, the ends of the current injection region in the cavity length direction (longitudinal direction) of the optical waveguide) are located inward of front and rear end faces 1a and 1b.

In the present embodiment, one end of opening 241 of current block layer 240 in the longitudinal direction is formed at a position moved inward by length df from front end face 1a. The other end of opening 241 of current block layer 240 in the longitudinal direction is formed at a position that is located inward by length dr from rear end face 1b. As one example, when cavity length L of semiconductor laser device 1 is 6 mm, lengths df and dr that are the amounts of inward displacement is 50 μm. As will be described later, lengths dr and df correspond to regions where end window structures are formed.

As illustrated in FIG. 4, front end face 1a has first reflection film 410 made of a dielectric multilayer film, and rear end face 1b has second reflection film 420 made of a dielectric multilayer film. First reflection film 410 is, for example, a multilayer film of $Al_2O_3$ and $Ta_2O_5$, when viewed in a crystal end direction. Second reflection film 420 is, for example, a multilayer film of $Al_2O_3$, $SiO_2$, and $Ta_2O_5$, when viewed in the crystal end direction. As one example, R1=2% and R2=95%, where R1 is the reflectance of first reflection film 410 and R2 is the reflectance of second reflection film 420.

Figure 5:
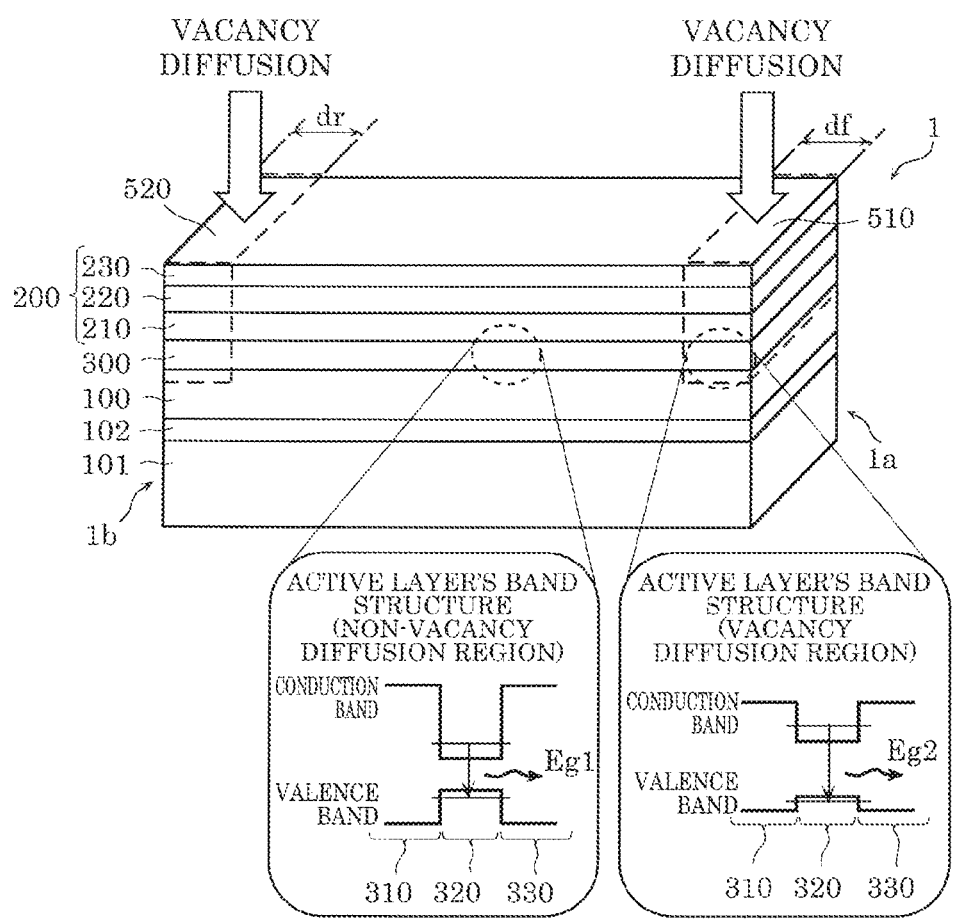
FIG. 5 schematically illustrates a structure around an active layer of the semiconductor laser device according to Embodiment 1.

Next, the structure of semiconductor laser device 1 around active layer 300 will be described with reference to FIG. 5. FIG. 5 schematically illustrates the structure of semiconductor laser device 1 around active layer 300 according to Embodiment 1. Note that part of the configuration of semiconductor laser device 1, including the inclined structure (side faces 105) of the stacked structure, first reflection film 410, and second reflection film 420, is not shown in FIG. 5.

In the present embodiment, the stacked structure of semiconductor laser device 1 has an end window structure on both ends in the cavity length direction. Specifically, as illustrated in FIG. 5, windows are formed in a region of length df from front end face 1a and in a region of length dr from rear end face 1b in a non-current injection region located in the vicinity of both end faces of the optical waveguide in active layer 300.

Here, the windows are formed so as to, for example, satisfy the relation of $\Delta Eg=Eg2-Eg1=100$ meV, where Eg1 is the peak energy of photoluminescence in the region of active layer 300 where no windows are formed, Eg2 is the peak energy of photoluminescence in the regions of active layer 300 where windows are formed, and ΔEg is the difference between Eg1 and Eg2. That is, the bandgap of active layer 300 in the regions located in the vicinity of front and rear end faces 1a and 1b is made greater than the bandgap of active layer 300 in the region other than the regions in the vicinity of front and rear end faces 1a and 1b.

Method of forming windows generally include an impurity diffusion method and a vacancy diffusion method, and in the present embodiment, the vacancy diffusion method is used to form the windows. This is because reducing losses and thereby reducing the amount of light absorption is important for ultrahigh-output semiconductor laser devices at levels exceeding 10 W per emitter. That is, using the impurity diffusion method to form the windows makes it difficult to reduce light absorption losses because the amount of light absorption is increased by impurities, but light absorption losses caused by the introduction of impurities can be eliminated by using the vacancy diffusion method for formation of windows because the vacancy diffusion method is an impurity-free method. By forming the windows with the vacancy diffusion method, first vacancy diffusion region 510 is formed on front end face 1a' side, and second vacancy diffusion region 520 is formed on rear end face 1b's side as the end window structure, as illustrated in FIG. 5. In FIG. 5, regions indicated by broken lines are first vacancy diffusion region 510 and second vacancy diffusion region 520.

In the vacancy diffusion method, windows can be formed by quick high-temperature processing. For example, active layer 300 may be formed into mixed crystal by diffusing Ga holes under exposure to very high-temperature heat of 800° C. to 950° C. around crystal growth temperatures in order to produce disorder in the quantum well structure of active layer 300 and to form active layer 300 into windows (make active layer 300 transparent) as a result of interdiffusion of holes and Group III elements.

In this way, by forming windows on the both ends of semiconductor laser device 1 in the cavity length direction, it is possible to make the end faces of the resonator in semiconductor laser device 1 transparent and reduce light absorption in the vicinity of front end face 1a. This suppresses the occurrence of COD on front end face 1a.

Figure 6A:
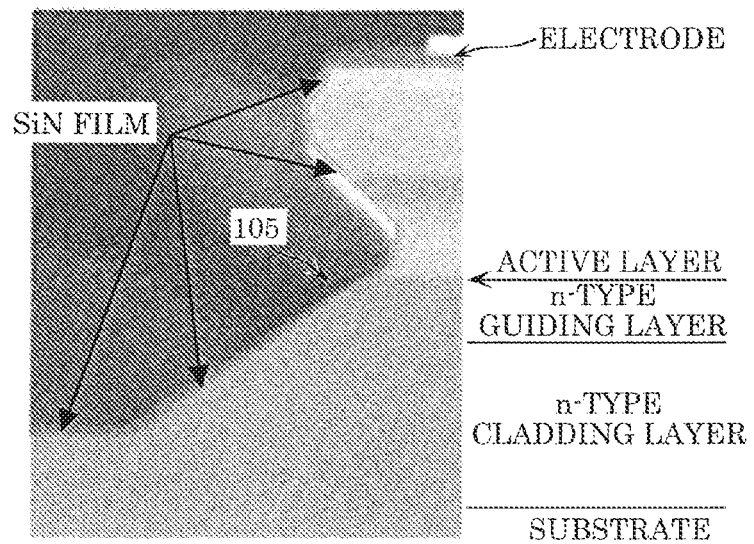
FIG. 6A is an SEM photograph of actually produced semiconductor laser device 1 according to Embodiment 1 when a region including an inclined portion of one side face of a stacked structure is observed from a front end face (exit end face side)
Figure 6B:
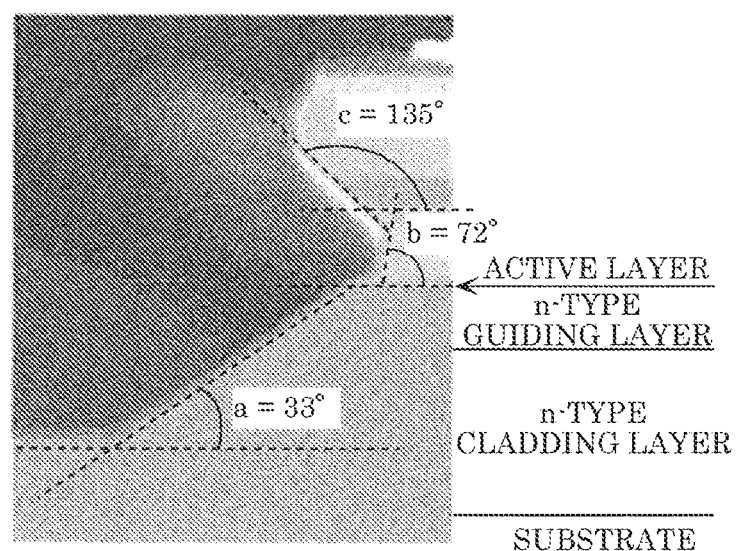
FIG. 6B illustrates inclination angles of each part of the inclined portion of the side face of the stacked structure in FIG. 6A with respect to a stacking interface.

FIG. 6A shows an SEM photograph when semiconductor laser device 1 described above is actually produced and the region of the stacked structure including the inclined portion of side face 105 is observed from front end face 1a (exit end face side). FIG. 6B illustrates the inclination angle of each part of the inclined portion of side face 105 of the stacked structure in FIG. 6A with respect to a stacking interface.

In FIG. 6A, when semiconductor laser device 1 is viewed from front end face 1a, the inclined portion of side face 105 has a flared mesa shape (shape whose width increases toward substrate 101) from some midpoint in the n-type cladding layer of first conductivity-side semiconductor layer 100 to part of second conductivity-side semiconductor layer 200 above active layer 300. The inclined portion has the narrowest portion above active layer 300, more specifically, on the side closer to active layer 300 than current block layer 240 in second conductivity-side semiconductor layer 200, and thereafter changes its angle greatly toward second electrode 104 in the stacking direction into an inverted flared mesa shape (shape spreading in the stacking direction). As a boundary with air space, an SiN film serving as dielectric film 106 is formed on the entire surface of the inclined portion of side face 105 of the stacked structure, ranging from the flared-mesa-shaped portion to the inverted flared-mesa-shaped portion.

The inclined portions of side face 105 are formed by isotropic wet etching at the time of forming the isolation grooves, but the inclination angle of each inclined portion of side face 105 can be changed by changing the composition ratio of the Al composition in the AlGaAs material for each layer of the stacked structure. Specifically, the etch rate can be increased by increasing the composition ratio of the Al composition in the AlGaAs material. Since semiconductor laser device 1 includes the AlGaAs layer with a high Al composition in second conductivity-side semiconductor layer 200 above active layer 300 of the stacked structure, it is possible to produce an inclined portion whose inclination angle is controlled so that the narrowest portion is located within second conductivity-side semiconductor layer 200. The depth of the inclined portion of side face 105 can be adjusted by changing the etching time, and for example, the inclined portion can be produced to an arbitrarily depth such as a depth at some midpoint in the n-type guiding layer serving as n-side second semiconductor layer 120, a depth at the boundary between the n-type guiding layer and the n-type cladding layer serving as n-side first semiconductor layer 110, a depth at some midpoint in the n-type cladding layer, or a depth of substrate 101. The SEM photographs of semiconductor laser device 1 in FIGS. 6A and 6B show the shape of the inclined portion of side face 105 of the stacked structure that is produced by forming the isolation grooves to a depth at some midpoint in the n-type cladding layer by wet etching.

FIG. 6B shows measured values for the inclination angle of each part of the inclined portion of side face 105 of the stacked structure in FIG. 6A. First, the inclined portion of side face 105 has a flared mesa shape (shape whose width increases toward the substrate) from some midpoint in the n-type cladding layer to the upper portion of the active layer, and an angle a formed by the inclined portion and the stacking interface is 33°. Then, the inclination angle increases from the upper portion of active layer 300 toward the narrowest portion, and an angle b formed with the stacking interface is 72°. The narrowest portion is formed in the p-type cladding layer with a high Al composition included in second conductivity-side semiconductor layer 200. The inclination angle is increased because the etch rate in the transverse direction during wet etching is increased as compared to the etch rate in the stacking direction. Furthermore, the inclined portion passing through the narrowest portion changes its angle greatly toward second electrode 104 in the stacking direction and spreads in an inverted flared mesa shape (shape spreading in the stacking direction), and an angle c formed with the stacking interface is 135°.

A preferable range of angle a of the inclined portion having a flared mesa shape (shape whose width increases toward the substrate) is desirably in the range of angles that do not allow primary light to return to the source of leakage, the primary light being leakage light propagating in a direction toward the side faces during lasing and reflected off the inclined portion. Specifically, an upper-limit value of angle a is desirably 45°, i.e., a≤45°.

In particular, a lower-limit value of angle a is desirably 20°, i.e., 20°≤a when consideration is given to a reduction in the number of semiconductor laser devices 1 that can be produced from a single wafer.

Angle c of the inclined portion having an inverted flared mesa shape (shape spreading in the stacking direction) is desirably as large as possible because, from the viewpoint of enlarging the area of electrical contact and the area of heat dissipation, it is desirable to ensure a sufficient size of second electrode 104. In particular, angle c is desirably greater than or equal to 120° and less than or equal to 150° in order to prevent chipping of the inverted flared-mesa-shaped side faces of the inclined isolation grooves in producing the end faces of the resonator by cleavage.

Method of Manufacturing Semiconductor Laser Device

Next, a method of manufacturing semiconductor laser device 1 according to Embodiment 1 will be described with reference to FIGS. 7A to 7F. FIGS. 7A to 7F are diagrams for describing each step in the method of manufacturing semiconductor laser device 1 according to Embodiment 1.

Figure 7A:
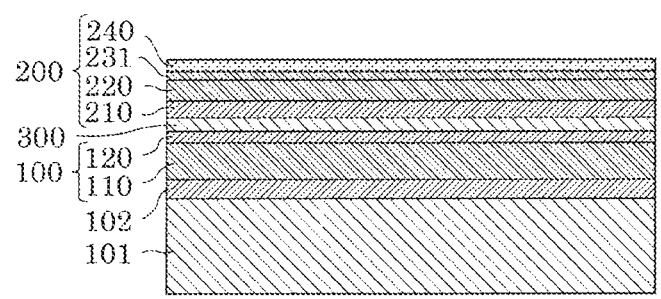
FIG. 7A is a sectional view illustrating a step of forming the stacked structure up to the current block layer in the method of manufacturing a semiconductor laser according to Embodiment 1.

First, as illustrated in FIG. 7A, a stacked structure made of an AlGaAs material is formed by forming buffer layer 102 on substrate 101 and forming first conductivity-side semiconductor layer 100, active layer 300, and second conductivity-side semiconductor layer 200 on buffer layer 102.

Specifically, an n-type GaAs buffer layer serving as buffer layer 102, an n-type AlGaAs cladding layer serving as n-side first semiconductor layer 110, an n-type AlGaAs guiding layer serving as n-side second semiconductor layer 120, a quantum well active layer consisting of an InGaAs well layer and an AlGaAs barrier layer and serving as active layer 300, a p-type AlGaAs guiding layer serving as p-side first semiconductor layer 210, a p-type AlGaAs cladding layer serving as p-side second semiconductor layer 220, a p-type GaAs contact layer serving as first contact layer 231 of p-side third semiconductor layer 230, and an n-type GaAs current block layer serving as current block layer 240 are sequentially grown in crystal form on substrate 101, which is an n-type GaAs substrate serving as a wafer, using a crystal growth technique of metalorganic chemical vapor deposition (MOCVD).

The relationship between the magnitudes of the refractive indices of n-side first semiconductor layer 110 and n-side second semiconductor layer 120 will be described later, but each of n-side first semiconductor layer 110 and n-side second semiconductor layer 120 has a multilayer structure configured by a plurality of layers as illustrated in FIG. 3. An average refractive index of n-side first semiconductor layer 110 and n-side second semiconductor layer 120, each having a multilayer structure, is required to satisfy the relation that n-side second semiconductor layer 120 has a higher refractive index than n-side first semiconductor layer 110.

Figure 7B:
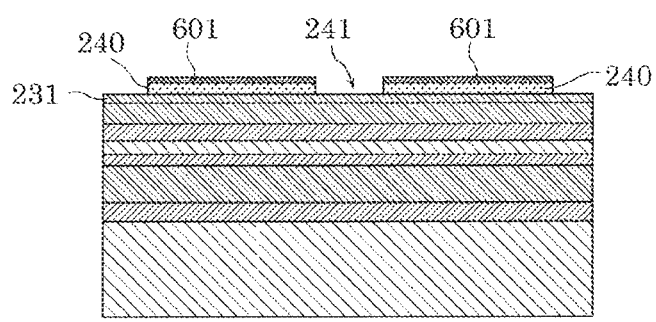
FIG. 7B is a sectional view illustrating a step of machining the current block layer in the method of manufacturing a semiconductor laser device according to Embodiment 1.

Then, as illustrated in FIG. 7B, in order to form a current injection region, mask 601 made of, for example, SiO$_2$ is formed by photolithography into a given pattern on first contact layer 231, and then current block layer 240 is patterned into a predetermined shape by etching using a wet etching technique. At this time, etching is performed until first contact layer 231 is exposed.

In this way, by patterning current block layer 240, opening 241 can be formed in current block layer 240. A desirable example of an etchant used to etch current block layer 240 is a sulfuric acid-based etchant. For example, an etchant with a 1:1:40 composition of sulfuric acid, a hydrogen peroxide solution, and water may be used.

Figure 7C:
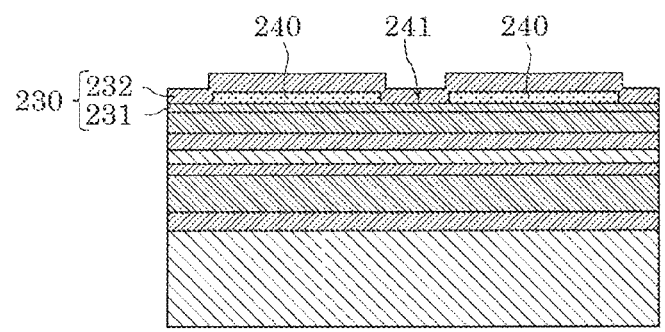
FIG. 7C is a sectional view illustrating a step of forming a second contact layer of a third semiconductor layer in the method of manufacturing a semiconductor laser device according to Embodiment 1.

Then, as illustrated in FIG. 7C, after mask 601 is removed by a hydrofluoric acid-based etchant, a p-type GaAs contact layer serving as second contact layer 232 of p-side third semiconductor layer 230 is grown in crystal form, using a crystal growth technique of MOCVD. Specifically, second contact layer 232 is grown in crystal form on current block layer 240 and first contact layer 231 so as to fill opening 241 of current block layer 240.

Figure 7D:
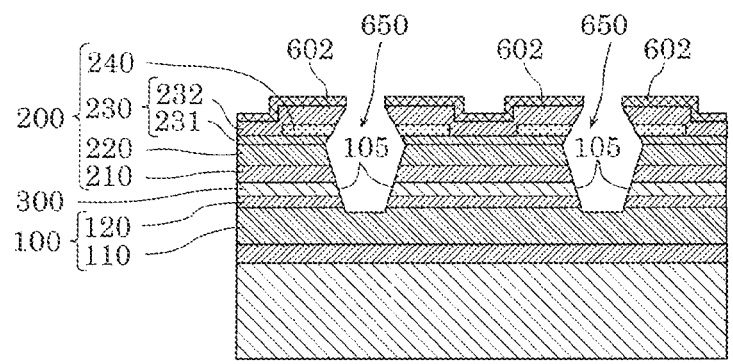
FIG. 7D is a sectional view illustrating a step of forming isolation grooves in the stacked structure in the method of manufacturing a semiconductor laser device according to Embodiment 1.

Then, as illustrated in FIG. 7D, in order to form isolation grooves, mask 602 made of, for example, SiO$_2$ is formed by photolithography into a given pattern on second contact layer 232, and thereafter, the surface is etched from second contact layer 232 to some midpoint in n-side first semiconductor layer 110 (n-type AlGaAs cladding layer), using a wet etching technique, so as to form isolation grooves 650 having inclined side wall surfaces. This forms side faces 105 of the stacked structure as side wall surfaces (inclined faces) of isolation grooves 650.

A desirable example of an etchant used to form isolation grooves 650 is a sulfuric acid-based etchant. For example, an etchant with a 1:1:10 composition ratio of sulfuric acid, a hydrogen peroxide solution, and water may be used. The etchant is not limited to a sulfuric acid-based etchant, and may be an organic acid-based etchant or an ammonia-based etchant.

Isolation grooves 650 are formed by isotropic wet etching. This forms inclined faces (side faces 105) of the stacked structure, and forms a constricted structure of the stacked structure. The inclination angle of side faces 105 changes with the composition ratio of the Al composition in the AlGaAs material of each layer of the stacked structure. In this case, the etch rate can be accelerated by increasing the Al composition in the AlGaAs material. Therefore, in order to form side faces 105 having an inclination as illustrated in FIGS. 1 to 3 in the stacked structure, the composition ratio of the Al composition in p-side second semiconductor layer 220 of second conductivity-side semiconductor layer 200 may be set to a highest value so as to make highest the etch rate of second conductivity-side semiconductor layer 200 in the transverse direction (horizontal direction). At this time, the narrowest portion of the stacked structure can be formed in the vicinity of the interface between p-side second semiconductor layer 220 and p-side third semiconductor layer 230.

Figure 7E:
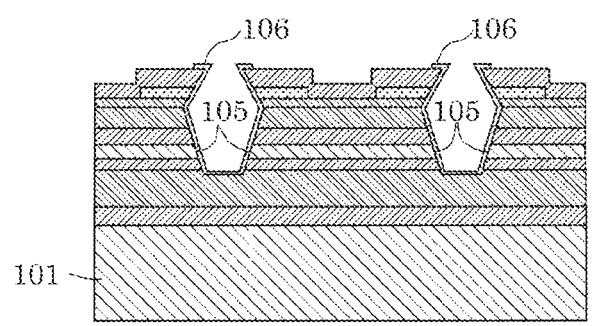
FIG. 7E is a sectional view illustrating a step of forming a dielectric film on a wall surface of the isolation grooves in the method of manufacturing a semiconductor laser device according to Embodiment 1.

Then, as illustrated in FIG. 7E, after mask 602 is removed by a hydrofluoric acid-based etchant, an SiN film serving as dielectric film 106 is deposited on the entire surface of substrate 101 serving as a wafer, and thereafter a portion of dielectric film 106 that forms the current injection region is removed, using photolithographic and etching techniques.

The etching of dielectric film 106 may be wet etching using a hydrofluoric acid-based etchant or dry etching of reactive ion etching (RIE). Dielectric film 106 is not limited to an SiN film, and may be any other film such as an SiO$_2$ film. Dielectric film 106 may be made of a material with excellent insulating properties against electrical conductivity.

Figure 7F:
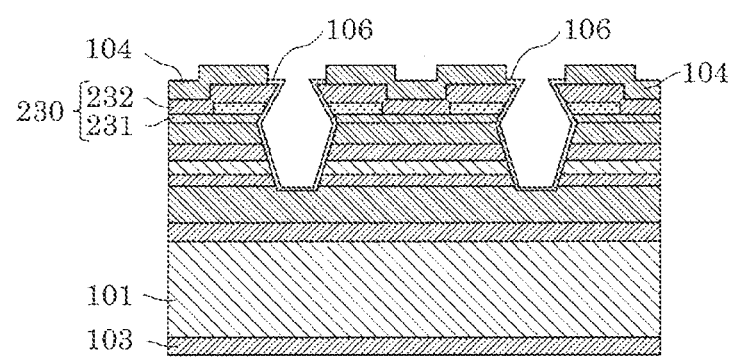
FIG. 7F is a sectional view illustrating a step of forming first and second electrodes in the method of manufacturing a semiconductor laser device according to Embodiment 1.

Then, as illustrated in FIG. 7F, second electrode 104 is formed on the upper face of second contact layer 232, using photolithographic and lift-off techniques. For example, second electrode 104 is formed by forming Ti/Pt/Au as an underlying electrode by electron-beam evaporation and then forming an Au plating electrode by electroplating. Thereafter, first electrode 103 is formed on the back surface of substrate 101.

Thereafter, although not shown, the stacked structure is isolated in bar form by, for example, dicing or cleavage using a blade and is then cut using the isolation grooves as sectioned parts so as to isolate chips. Accordingly, individual pieces of semiconductor laser devices 1 are produced.

Characteristics of Semiconductor Laser Device

Figure 8A:
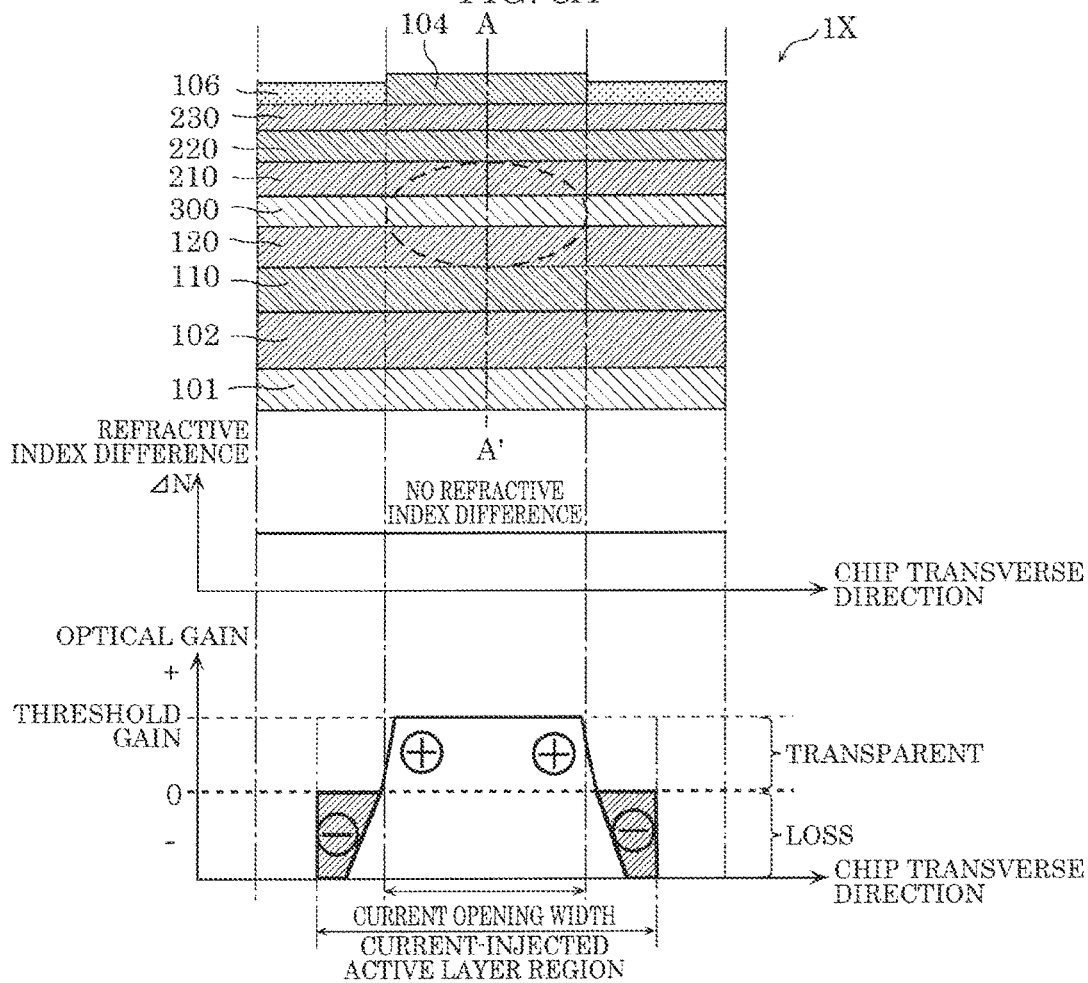
FIG. 8A is a schematic diagram illustrating a fixed refractive index distribution and optical gain in the transverse direction of a semiconductor laser device according to Comparative Example 1.
Figure 8B:
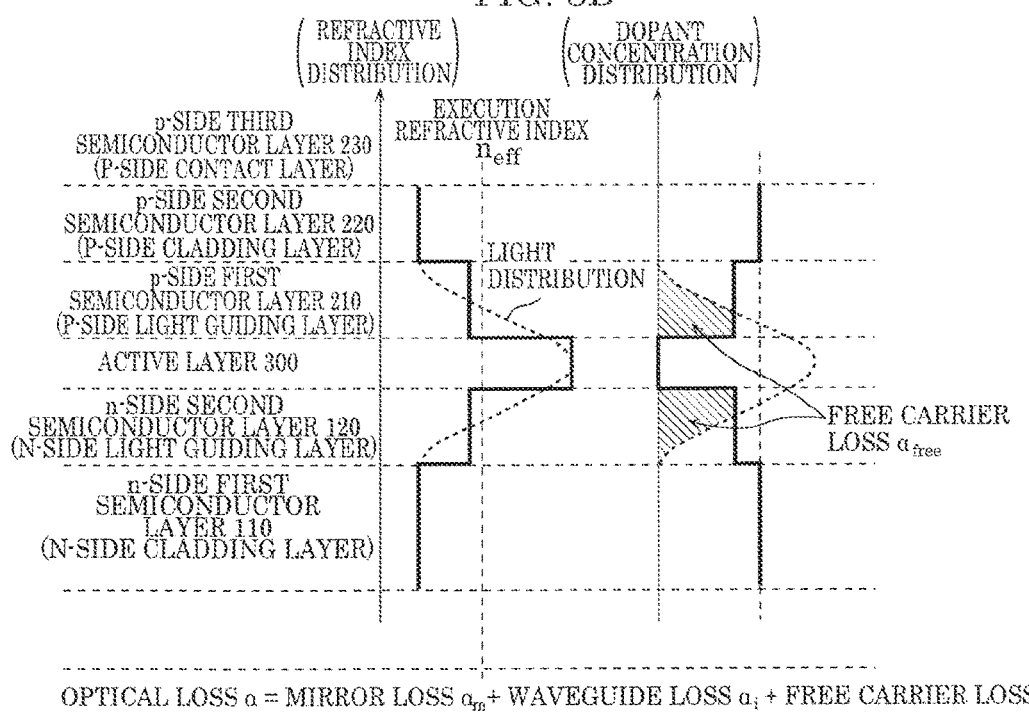
FIG. 8B is a schematic diagram illustrating profiles of a fixed refractive index distribution, a light distribution, and a dopant concentration distribution in the stacking direction of the semiconductor laser device, taken along line A-A' in FIG. 8A.

Next, optical characteristics of semiconductor laser device 1 will be described in comparison with optical characteristics of semiconductor laser device 1X according to Comparative Example 1. FIG. 8A is a schematic diagram illustrating a fixed refractive index distribution and optical gain in a direction (transverse direction) horizontal to the main surface of substrate 101 of semiconductor laser device 1X according to Comparative Example 1. FIG. 8B is a schematic diagram illustrating profiles of a fixed refractive index distribution, a light distribution, and a dopant concentration distribution in the stacking direction (longitudinal direction) of semiconductor laser device 1X according to Comparative Example 1, taken along line A-A' in FIG. 8A.

As illustrated in FIG. 8A, semiconductor laser device 1X according to Comparative Example 1 is a gain-induced guiding semiconductor laser element that has no refractive index difference in the transverse direction. In semiconductor laser device 1X according to Comparative Example 1, upon current injection from second electrode 104 (p-side electrode), current is injected into active layer 300 located immediately below second electrode 104, and the width across which current is injected increases in the transverse direction with diffusion current. This, however, increases a current value necessary for making active layer 300 transparent and also considerably increases optical gain losses because active layer 300 cannot be made transparent due to diffusion current that diffuses into a region other than the region immediately below second electrode 104. As a result, it is impossible to remarkably expand the light distribution to a width greater than the width of second electrode 104 and to reduce optical density on the light exit end face. Accordingly, optical losses increase, the level of thermal saturation degrades due to an increase in the amount of heat generation and a resultant temperature rise in active layer 300, and the operating current increases due to increased threshold current or decreased slope efficiency.

As illustrated in FIG. 8B, in semiconductor laser device 1X according to Comparative Example 1, $n_{11}<n_{12}$, $n_{22}<n_{21}$, $n_{11}=n_{22}$ and $n_{12}=n_{21}$, where $n_{11}$, $n_{12}$, $n_{21}$, and $n_{22}$ are respectively the refractive indices of n-side first semiconductor layer 110, n-side second semiconductor layer 120, p-side first semiconductor layer 210, and p-side second semiconductor layer 220.

In semiconductor laser device 1X with this configuration according to Comparative Example 1, a maximum intensity of the light distribution (near-field) in the longitudinal direction is within active layer 300. Thus, the light distribution is also spread to n-side second semiconductor layer 120 (n-side light guiding layer) and p-side first semiconductor layer 210 (p-side light guiding layer), and since n-side second semiconductor layer 120 and p-side first semiconductor layer 210 have electrical conductivity, free carrier losses $\alpha_{free}$ via impurities increases and overall optical losses α increase considerably.

In this way, simple gain-induced guiding semiconductor laser device 1X that has no fixed refractive index difference in the transverse direction and no light confinement structure in the transverse direction has considerable optical losses in both transverse and longitudinal directions. Thus, it is difficult to achieve optical output at levels of several tens of watts per emitter with high efficiency and via low-current drive.

In contrast, semiconductor laser device 1 according to the present embodiment can achieve optical output at levels of several tens of watts per emitter with high efficiency and via low-current drive, although semiconductor laser device 1 is also a gain-induced guiding semiconductor laser element that has no fixed refractive index difference in the transverse direction and no light confinement structure in the transverse direction This will be described hereinafter.

Figure 9A:
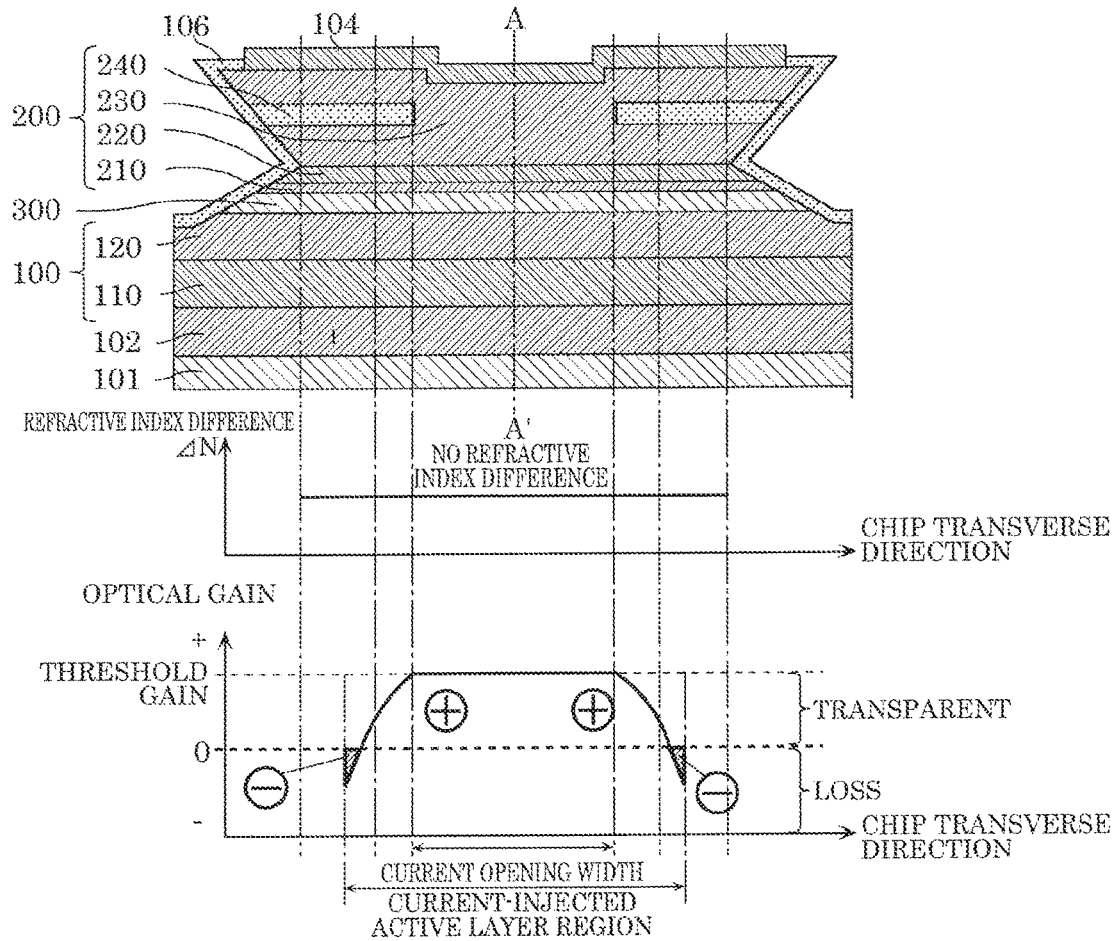
FIG. 9A is a schematic diagram illustrating a fixed refractive index distribution and optical gain in the transverse direction of the semiconductor laser device according to Embodiment 1.
Figure 9B:
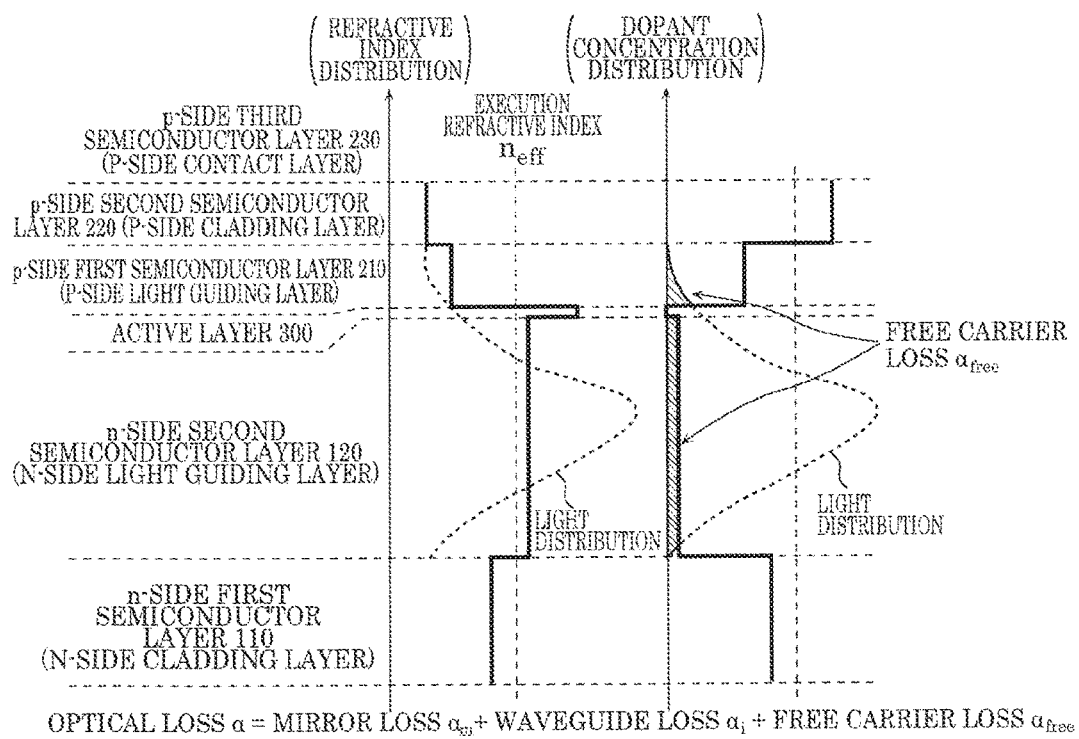
FIG. 9B is a schematic diagram illustrating profiles of a fixed refractive index distribution, a light distribution, and a dopant concentration distribution in the stacking direction of the semiconductor laser device according to Embodiment 1, taken along line A-A' in FIG. 9A.

FIG. 9A is a schematic diagram illustrating a fixed refractive index distribution and optical gain in a direction (transverse direction) horizontal to the main surface of substrate 101 of semiconductor laser device 1 according to Embodiment 1. FIG. 9B is a schematic diagram illustrating profiles of a fixed refractive index distribution, a light distribution, and a dopant concentration distribution in the stacking direction (longitudinal direction) of semiconductor laser device 1 according to Embodiment 1, taken along line A-A' in FIG. 9A.

Active layer 300 can be made transparent with a slight amount of current injection because its well layer 320 (FIG. 3) is a very thin film. As illustrated in FIG. 9A, active layer 300 located immediately below opening 241 (current opening width) of current block layer 240 reaches threshold gain. However, in the present embodiment, since p-side second semiconductor layer 220 and p-side first semiconductor layer 210 have a flared mesa shape, current injected through opening 241 is diffused from opening 241, spreads out like an unfolded fan in a direction toward active layer 300, and is injected into active layer 300 with a width greater than the opening width of opening 241.

Accordingly, a transparent region of active layer 300 spreads in the transverse direction and has a width greater than the opening width of opening 241. Thus, the light distribution is spread and enlarged laterally to a width greater than the width of opening 241. That is, the active layer obtains high gain, is easily made transparent, and suffers small optical losses. As a result, the threshold current as well as optical density on the light exit end face can be reduced, and gain saturation is less likely to occur. Accordingly, it is possible to suppress a decrease in slope efficiency at high output and to reduce the operating current, and it is also possible to achieve high power with ease because COD on the light exit end face can be suppressed.

As illustrated in FIG. 9B, semiconductor laser device 1 according to the present embodiment satisfies relations of $n_{22}<n_{11}<n_{12}$ and $n_{12} \geq n_{21}$, where $n_{11}$, $n_{12}$, $n_{21}$, and $n_{22}$ are respectively the refractive indices of n-side first semiconductor layer 110, n-side second semiconductor layer 120, p-side first semiconductor layer 210, and p-side second semiconductor layer 220. In the present embodiment, $n_{22}<n_{21}<n_{11}<n_{12}$.

In semiconductor laser device 1 with this configuration, a maximum intensity position of the light distribution of light guided in the stacked structure in the normal direction (longitudinal direction) of the main surface of substrate 101 is within first conductivity-side semiconductor layer 100. Specifically, the maximum intensity position of the longitudinal light distribution of laser light guided in the stacked structure is within n-side second semiconductor layer 120 (n-side light guiding layer).

Moreover, in the present embodiment, not only the maximum intensity position of laser light is within n-side second semiconductor layer 120, but also the most part of the longitudinal light distribution is within n-side second semiconductor layer 120 as illustrated in FIG. 9B. That is, semiconductor laser device 1 according to the present embodiment is an n-side guiding laser that guides light within the n-side semiconductor region.

In this way, in semiconductor laser device 1 according to the present embodiment, the stacked structure is configured such that the maximum intensity of the longitudinal light distribution is within n-side second semiconductor layer 120, and light is guided within the n-side semiconductor region. This minimizes free carrier losses $\alpha_{free}$ and improves the efficiency of use of carries injected into active layer 300 to the maximum. As a result, it is possible to operate the semiconductor laser device via low voltage drive and low threshold current and with high slope efficiency, and to achieve optical output at levels of several tens of watts per emitter with high efficiency and via low current drive.

From the viewpoint of optical gain, active layer 300 desirably has a quantum well structure, and in particular, active layer 300 desirably has a single quantum well structure (SQW). This will be described with reference to FIGS. 10 to 17.

Figure 10:
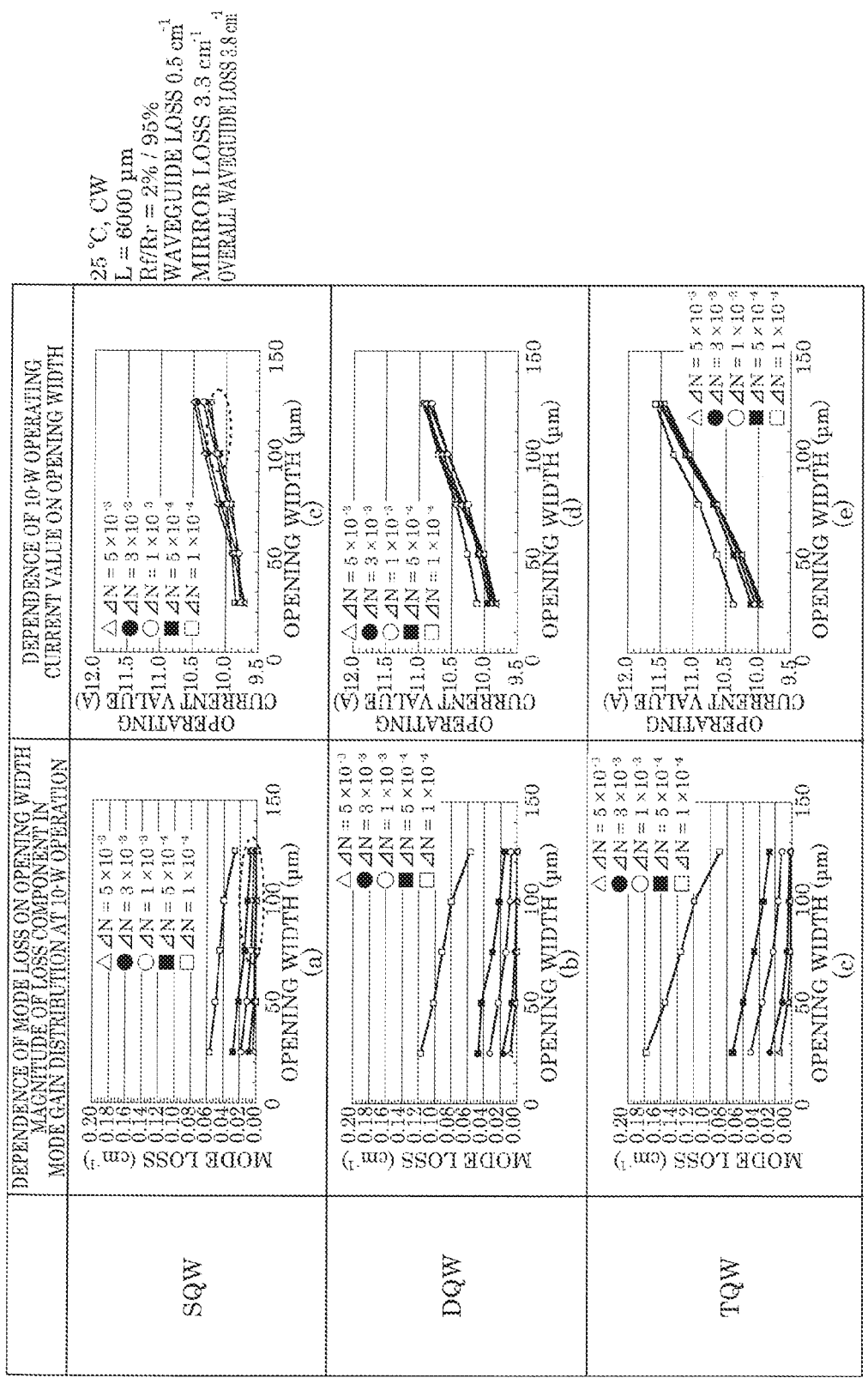
FIG. 10 illustrates the result of calculating mode losses and an operating current value in the active layer in a semiconductor laser device with an optical output of 10 W, using fixed refractive index difference $\Delta N$, opening width Ws of the opening of the current block layer, and the number of wells in the well layer of the active layer as parameters.

FIG. 10 summarizes the results of calculating mode losses in active layer 300 and a 10-W operating current value in semiconductor laser device 1 at 10-W optical output, which is high power, using fixed refractive index difference $\Delta N$, opening width Ws of opening 241 of current block layer 240, and the number of wells (SQW, DQW, TQW) in well layer 320 of active layer 300 as parameters. Note that SQW, DQW, and TQW respectively indicate cases where the number of wells in well layer 320 of active layer 300 is one, where the number of wells is two, and where the number of wells is three.

Figure 11:
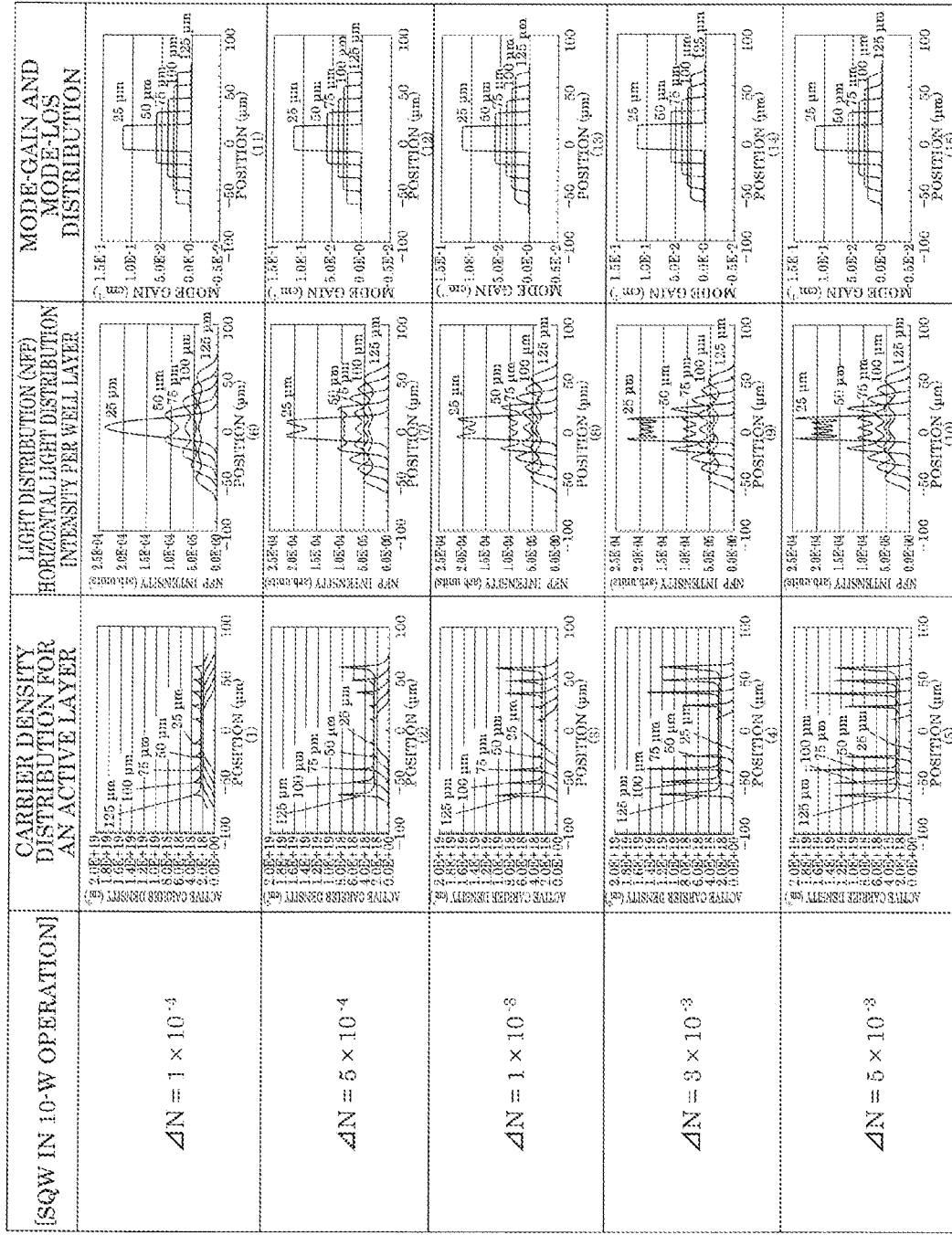
FIG. 11 illustrates the result of calculating carrier density distribution for an active layer, a light distribution (near field pattern), and a mode-gain and mode-loss distribution when the simulation result at 10-W optical output is illustrated in FIG. 10 for an SQW structure.
Figure 14:
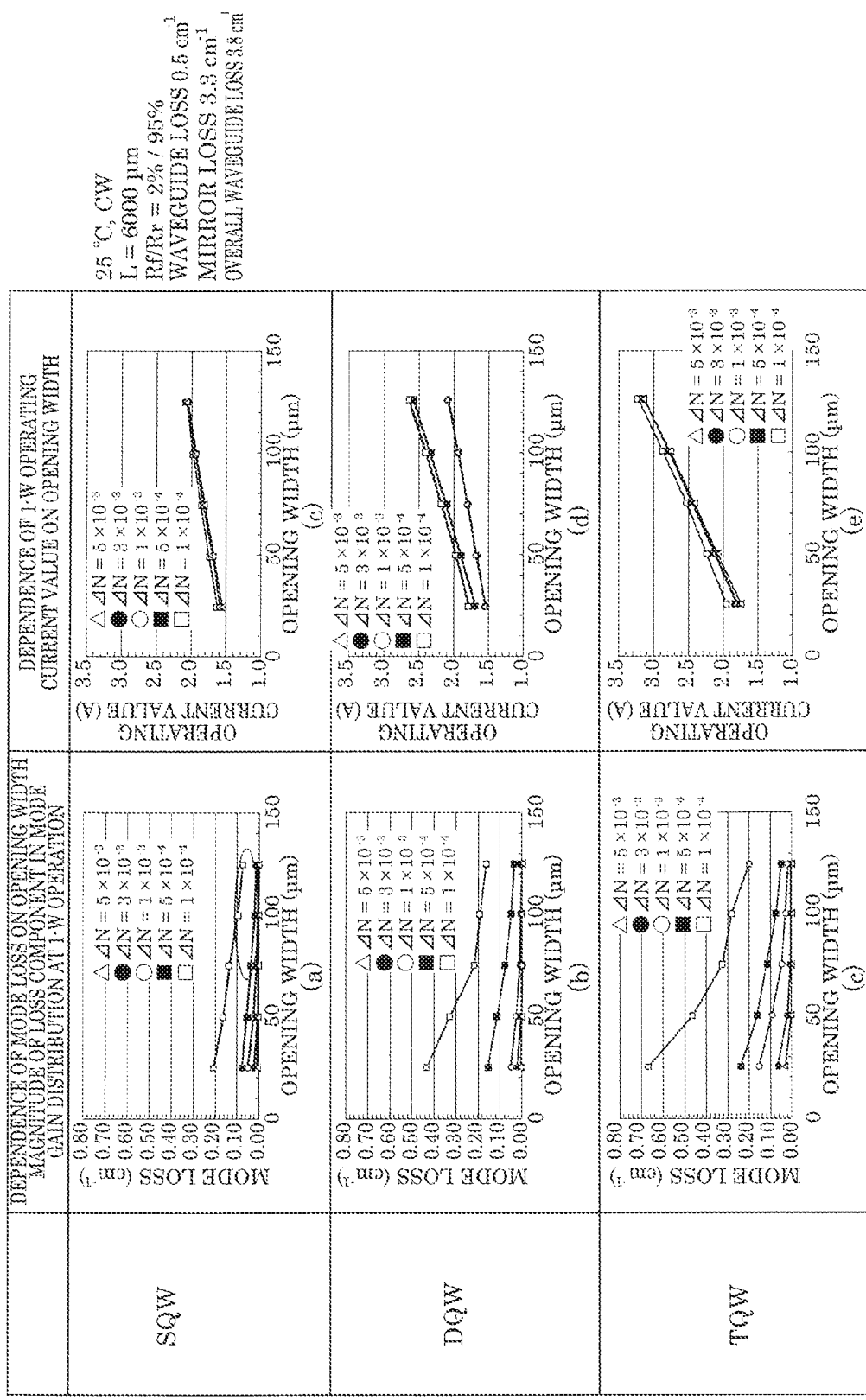
FIG. 14 illustrates the result of calculating mode losses and an operating current value in the active layer in the semiconductor laser device with an optical output of 1-W, using fixed refractive index difference $\Delta N$, opening width Ws of the opening of the current block layer, and the number of wells in the well layer of the active layer as parameters.

FIG. 11 illustrates the results of calculating the simulation result at 1-W optical output is illustrated in FIG. 14 for an SQW structure, a light distribution (near-field pattern), and a mode-gain and mode-loss distribution when the simulation result at 10-W optical output is illustrated in FIG. 10 for an SQW structure (single quantum well structure).

Figure 12:
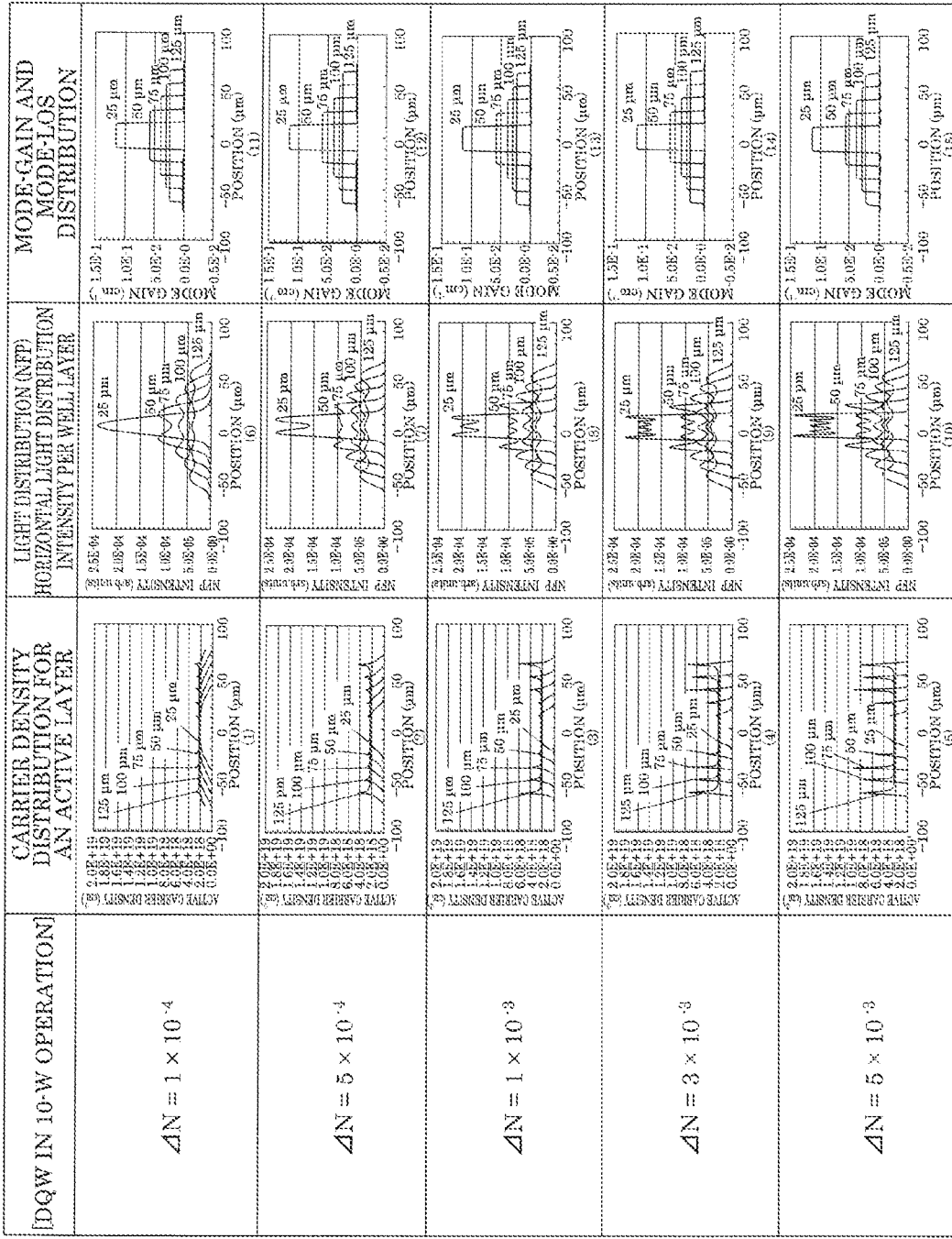
FIG. 12 illustrates the result of calculating carrier density distribution for an active layer, a light distribution (near field pattern), and a mode-gain and mode-loss distribution when the simulation result at 10-W optical output is illustrated in FIG. 10 for a DQW structure.

FIG. 12 illustrates the results of calculating carrier density distribution for an active layer, a light distribution (near-field pattern), and a mode-gain and mode-loss distribution when the simulation result at 10-W optical output is illustrated in FIG. 10 for a DQW structure (double quantum well structure).

Figure 13:
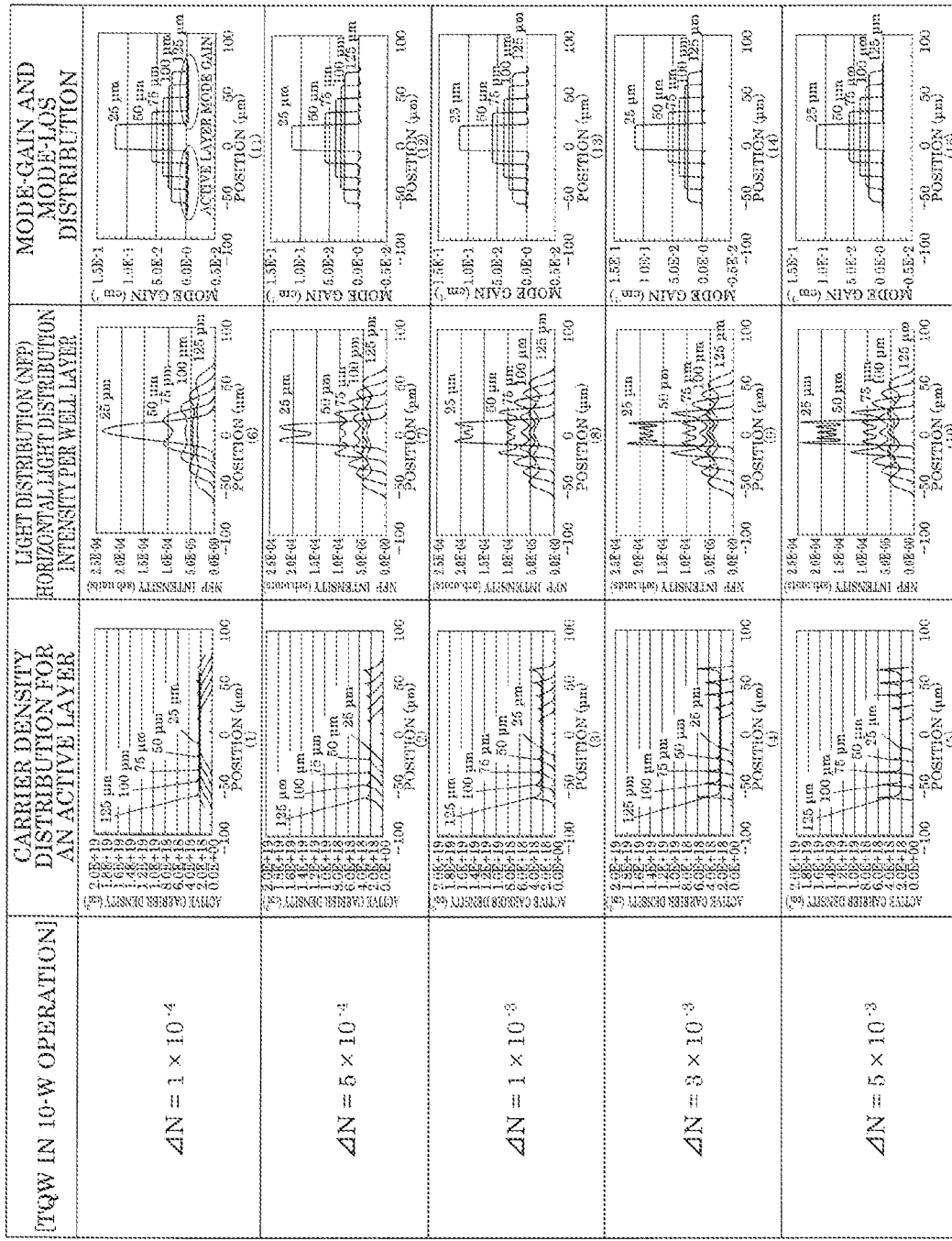
FIG. 13 illustrates the result of calculating carrier density distribution for an active layer, a light distribution (near field pattern), and a mode-gain and mode-loss distribution when the simulation result at 10-W optical output is illustrated in FIG. 10 for a TQW structure.

FIG. 13 illustrates the results of calculating carrier density distribution for an active layer, a light distribution (near-field pattern), and a mode-gain and mode-loss distribution when the simulation result at 10-W optical output is illustrated in FIG. 10 for a TQW structure (triple quantum well structure).

Optical losses in an optical waveguide are roughly divided into free carrier losses $\alpha_{free}$, mirror losses $\alpha_m$, and waveguide losses $\alpha_i$ in the optical waveguide. A total of these losses is referred to as overall waveguide losses.

In semiconductor laser device 1, lasing occurs under a condition where mode gain obtained by multiplying gain generated in active layer 300 by current injection by a coefficient of light confinement within active layer 300 balances with overall waveguide loss. At this time, active layer 300 in a region outside opening 241 of current block layer 240 has a small amount of current injection and functions as an absorber of laser light that oscillates. Accordingly, mode losses occur in active layer 300 in the region outside opening 241.

In this case, mode losses in the region outside opening 241 are compensated for by increasing the amount of current injection into a region inside opening 241 of current block layer 240 and thereby increasing mode gain of active layer 300 that corresponds to the region inside opening 241, and lasing occurs.

In this way, lasing occurs under a condition where an integrated value of mode losses in active layer 300 balances with waveguide losses. Accordingly, a structure that produces great losses will result in an increase in the value of threshold current at which lasing occurs.

FIGS. 10 to 13 illustrate the results of calculating the dependence of mode losses obtained by integrating only mode loss components in active layer 300 on the opening width in structures with various refractive index differences $\Delta N$.

It can be seen from (a) to (e) in FIG. 10 that increasing the refractive index difference $\Delta N$ brings about an effect of reducing mode losses in active layer 300 having a small number of wells.

Compared with the DQW and TQW structures, the SQW structure has smaller mode losses in active layer 300 during operation. In particular, semiconductor laser device 1 according to the present embodiment, which has a structure of guiding light within the n-side semiconductor region (n-side waveguide laser structure), has small losses in active layer 300 during operation even if $\Delta N$ is less than or equal to $1 \times 10^{-3}$.

In addition, the SQW structures is advantageous for use in a wide stripe structure with opening width Ws greater than or equal to 50 μm, because not only the operating current value is small, but also the dependence of the operating current value on the opening width is low. In particular, in the case where opening width Ws is greater than or equal to 75 μm as illustrated in (c) in FIG. 10, the operating current value is small when $\Delta N$ is less than or equal to $1 \times 10^{-3}$.

If $\Delta N$ is large as illustrated in FIG. 11, carrier hole burning may be enhanced and increase leakage current. If $\Delta N$ is small, on the other hand, the light distribution is spread to the outside of the opening width and suppresses carrier hole burning. Accordingly, leakage current decreases.

FIG. 14 summarizes the results of calculating mode losses in active layer 300 and a 1-W operating current value in semiconductor laser device 1 at 1-W optical output, which is low power, using fixed refractive index difference $\Delta N$, opening width Ws of opening 241 of current block layer 240, and the number of wells (SQW, DQW, TQW) in well layer 320 of active layer 300 as parameters as in FIG. 10.

Figure 15:
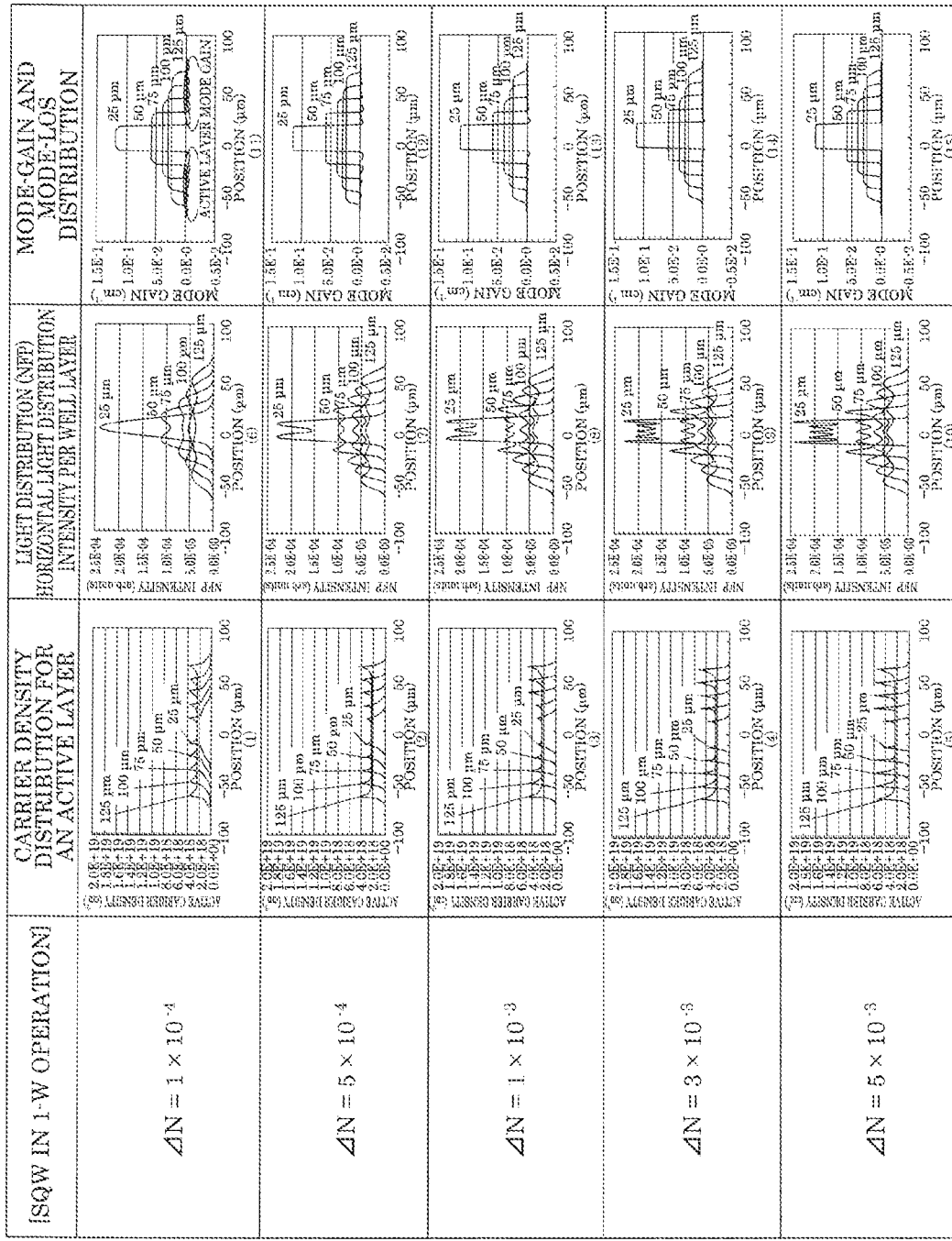
FIG. 15 illustrates the result of calculating carrier density distribution for an active layer, a light distribution (near field pattern), and a mode-gain and mode-loss distribution when the simulation result at 1-W optical output is illustrated in FIG. 14 for an SQW structure.

FIG. 15 illustrates the results of calculating carrier density distribution for an active layer, a light distribution (near-field pattern), and a mode-gain and mode-loss distribution when the simulation result at 1-W optical output is illustrated in FIG. 14 for an SQW structure (single quantum well structure).

Figure 16:
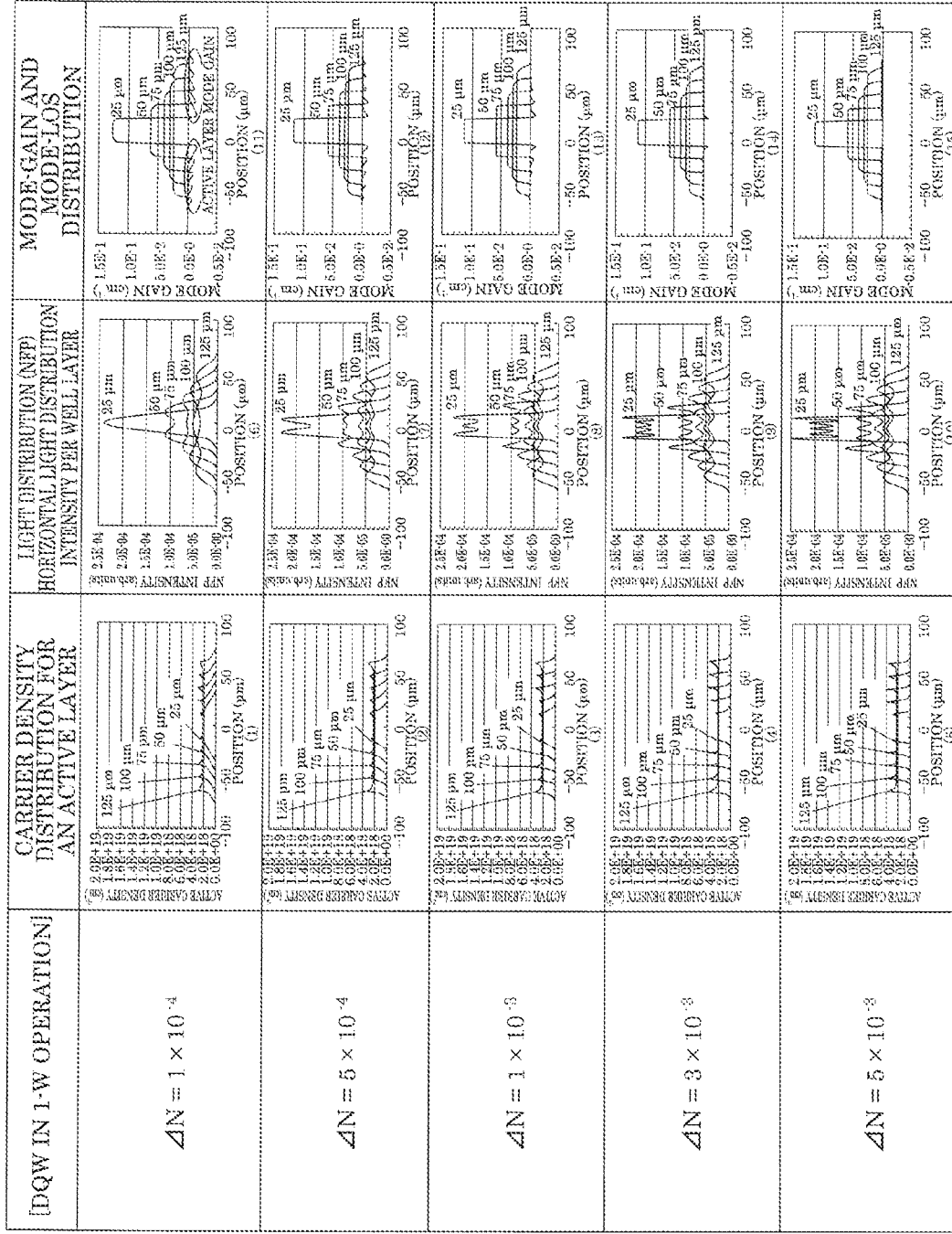
FIG. 16 illustrates the result of calculating carrier density distribution for an active layer, a light distribution (near field pattern), and a mode-gain and mode-loss distribution when the simulation result at 1-W optical output is illustrated in FIG. 14 for a DQW structure.

FIG. 16 illustrates the results of calculating carrier density distribution for an active layer, a light distribution (near-field pattern), and a mode-gain and mode-loss distribution when the simulation result at 1-W optical output is illustrated in FIG. 14 for a DQW structure (double quantum well structure).

Figure 17:
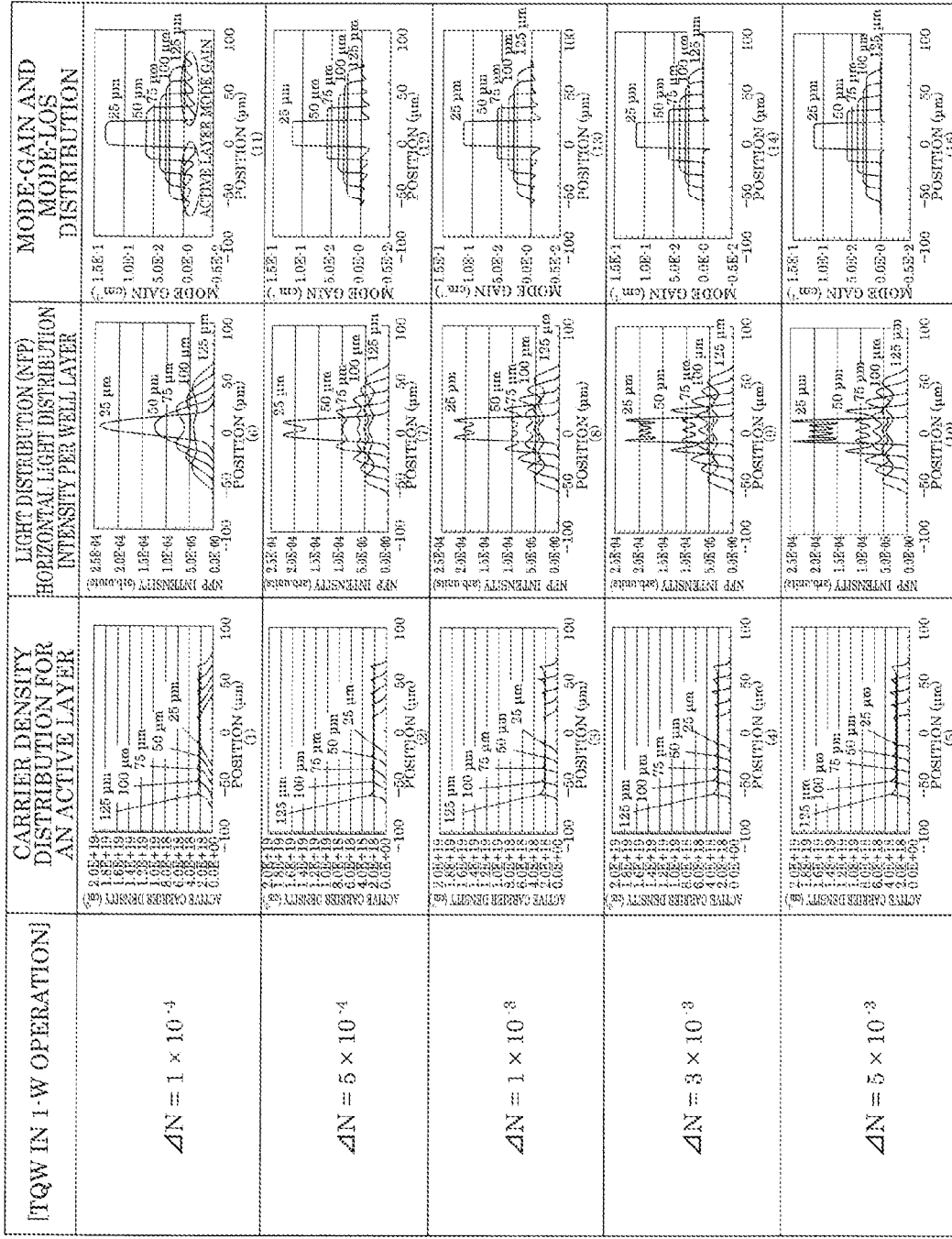
FIG. 17 illustrates the result of calculating carrier density distribution for an active layer, a light distribution (near field pattern), and a mode-gain and mode-loss distribution when the simulation result at 1-W optical output is illustrated in FIG. 14 for a TQW structure.

FIG. 17 illustrates the results of calculating carrier density distribution for an active layer, a light distribution (near-field pattern), and a mode-gain and mode-loss distribution when the simulation result at 1-W optical output is illustrated in FIG. 14 for a TQW structure (triple quantum well structure).

FIGS. 14 and 15 illustrate the results of calculating the dependence of mode losses obtained by integrating only mode loss components in active layer 300 on the opening width in structures having various refractive index differences $\Delta N$.

As illustrated in (a) to (e) in FIG. 14, even during 1-W operation, increasing the refractive index difference $\Delta N$ brings about an effect of reducing mode losses in active layer 300 having a small number of wells even during 1-W operation. Compared with the DQW and TQW structures, the SQW structure has smaller mode losses in active layer 300 even during 1-W operation, and even if $\Delta N$ is less than or equal to $1 \times 10^{-3}$, mode losses in active layer 300 are relatively small during operation.

In addition, even during 1-W operation, the SQW structure is advantageous for use in a wide stripe structure with opening width Ws greater than or equal to 50 µm, because not only the operating current value is small, but also the dependence of the operating current value on the opening width is low. Note that, if ΔN is greater than or equal to $1\times10^{-4}$, the operating current value remains almost the same during 1-W operation.

In the case of a 1-W operation with the SQW structure as illustrated in FIG. 15, if ΔN is small, mode losses in active layer 300 increase, but the magnitude of the mode losses is smaller than in the DQW and TQW structures as illustrated in FIGS. 16 and 17.

In this way, it has been confirmed from FIGS. 10 to 13 and FIGS. 14 and 15 that, compared with the DQW and TQW structures, the SQW structure (i) has smaller mode losses in active layer 300 during operation; (ii) has smaller mode losses in active layer 300 during operation, even if fixed refractive index difference ΔN is very small on the order of less than or equal to $1\times10^{-3}$, as a feature of the n-side waveguide laser structure; (iii) is advantageous for use in a wide stripe structure with opening width Ws greater than or equal to 50 µm because not only the operating current value is small, but also the dependence of the operating current value on the opening width is low; and (iv) has a smaller operating current value when ΔN is less than $1\times10^{-3}$, if Ws is greater than or equal to 75 µm (i.e., the light distribution is spread to the outside of opening 241, which brings about an effect of suppressing carrier hole burning and thereby reducing leakage current).

In order to enhance these effects to the maximum, semiconductor laser device 1 according to the present embodiment uses an n-type semiconducting material, more specifically n-GaAs, as the material for current block layer 240. Based on the results described above, opening width Ws of opening 241 of current block layer 240 is determined as 100 µm, and a prototype of semiconductor laser device 1 has been produced.

Next, characteristics of semiconductor laser device 1 against leakage light from the optical waveguide will be described hereinafter.

First, leakage light according to the present embodiment refers to scattered light generated during propagation through the resonator or spontaneous emission light leaking from active layer 300 in the distribution of light that oscillates in a multiple transverse mode and is guided in the cavity length direction. Such leakage light increases in amount and cannot be ignored when the semiconductor laser device operates with optical output at levels of 10 W per emitter.

In the structure where the maximum intensity position of the light distribution in the stacking direction (longitudinal direction) of the stacked structure is within n-side second semiconductor layer 120 (n-side light guiding layer) and n-side second semiconductor layer 120 occupies most part of the longitudinal light distribution as in semiconductor laser device 1, there is no region for absorbing light that leaks in parallel with the direction orthogonal to the cavity length direction and horizontal to the main surface of substrate 101 (i.e., in the transverse direction), and therefore leakage light that leaks in the transverse direction will reach the side faces of the stacked structure. It is thus important to suppress leakage light in performing stable lasing operations with optical output at levels of 10 W per emitter.

Here, semiconductor laser device 1 according to the present embodiment can perform stable lasing operations because side faces 105 originating in the isolation grooves for dividing a plurality of semiconductor laser devices formed on the wafer into individual pieces are inclined faces. This will be described in comparison with a semiconductor laser device according to Comparative Example 2. Compared with semiconductor laser device 1 illustrated in FIG. 1, the semiconductor laser device according to Comparative Example 2 has a structure in which a pair of side faces 105 are parallel to the direction of the normal to the main surface of substrate 101. That is, the semiconductor laser device according to Comparative Example 2 has a vertical-isolation-groove structure in which the side wall surfaces of the isolation grooves are vertical surfaces.

Figure 18:
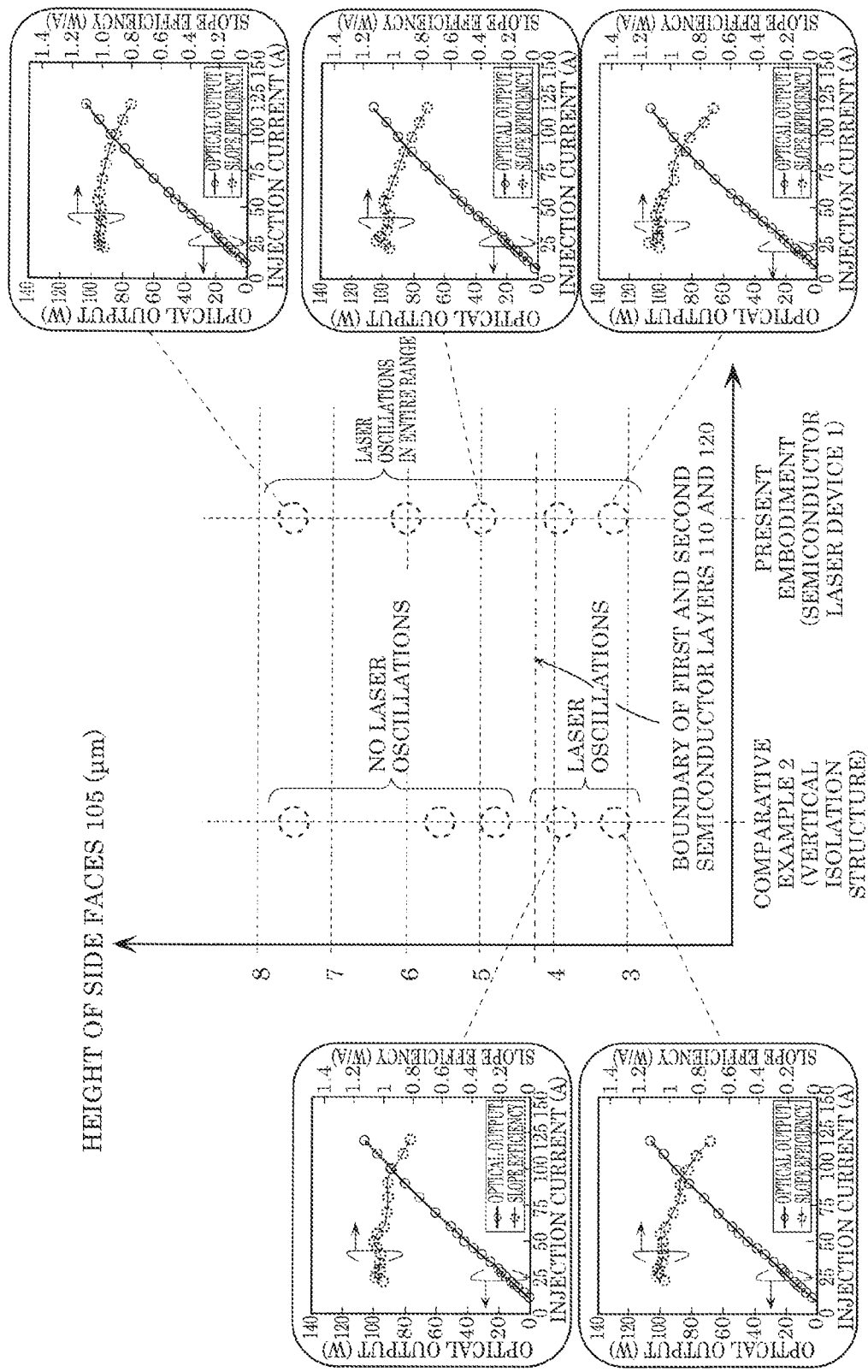
FIG. 18 illustrates how lasing occurs when the height of the pair of side faces is changed in the semiconductor laser device illustrated in FIG. 1 and in the semiconductor laser device according to Comparative Example 2.

FIG. 18 illustrates how lasing occurs when the height of the pair of side faces 105 is changed in semiconductor laser device 1 illustrated in FIG. 1 (Present Embodiment) and the semiconductor laser device according to Comparative Example 2 (Comparative Example 2). FIG. 18 illustrates current-optical characteristics and current-slope characteristics at each height, and a multi-emitter structure where a large number of semiconductor laser devices are arrayed (the number of emitters is 20) is used for evaluation in both of the present embodiment and Comparative Example 2. As evaluation current values, differences in lasing operation are compared by increasing the current up to 125 A.

As illustrated in FIG. 18, for the semiconductor laser device according to Comparative Example 2, lasing operations were confirmed and the results of the current-optical characteristics, which are laser characteristics, were the same as the results for semiconductor laser device 1 according to the present embodiment until the height of side faces 105 is 4 µm.

However, when the height of side faces 105 exceeded 4.8 µm in the semiconductor laser device according to Comparative Example 2, lasing operations stopped suddenly. Besides, weak spontaneous emission light leaked from the light exit end face, and lasing operations did not occur even if the amount of current injection was increased up to 125 A.

In contrast, for semiconductor laser device 1 according to the present embodiment, stable lasing operations continued even if the height of side faces 105 was changed. Specifically, stable lasing operations continued even when side faces 105 had a height of 4.8 µm, at which lasing operations stopped in the semiconductor laser device according to Comparative Example 2, and stable lasing operations were still confirmed even when side faces 105 had a height of 7.5 µm. This height of side faces 105, i.e., 7.5 µm, corresponds to a length that the depth of isolation grooves 650 in FIG. 7D described above reaches the interface between n-side first semiconductor layer 110 and buffer layer 102.

In this way, the structure of semiconductor laser device 1 according to the present embodiment can inhibit light that leaks in the direction orthogonal to the cavity length direction and horizontal to the main surface of substrate 101 (in the transverse direction) from affecting the guided mode originally intended to oscillate and formed of light travelling in the cavity length direction, even if the laser structure is weak in terms of light confinement in the transverse direction (fixed refractive index difference ΔN is very small).

Figure 19A:
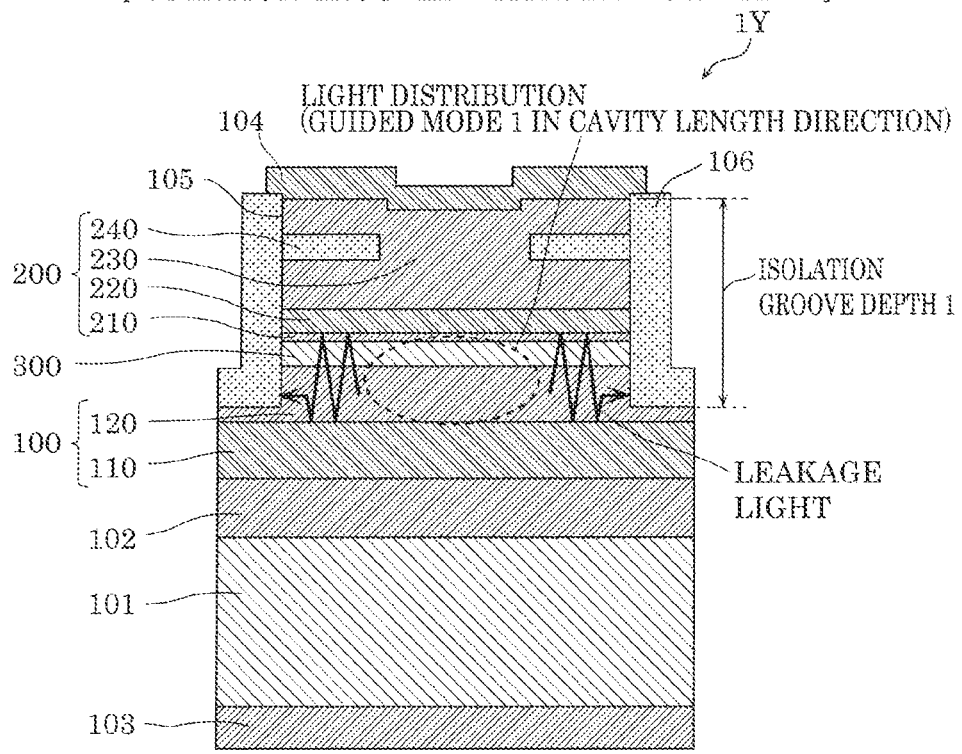
FIG. 19A schematically illustrates how light is distributed in the semiconductor laser device according to Comparative Example 2 when the isolation grooves have a shallow depth and the side faces have a short height, in which lasing operations have stopped due to the height of the side faces.
Figure 19B:
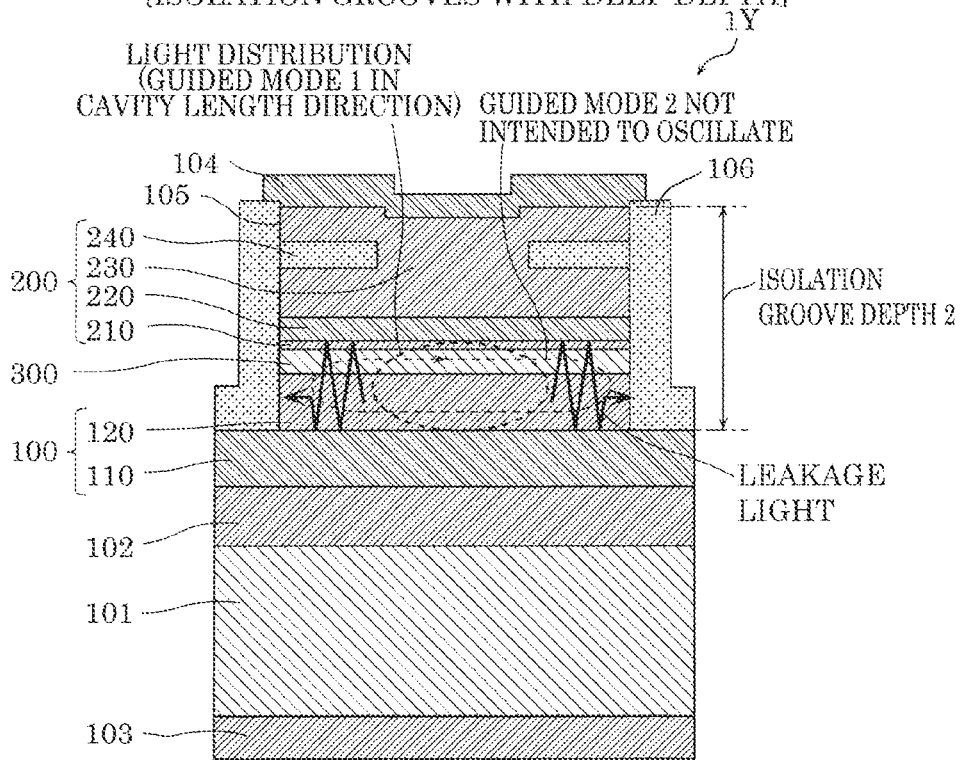
FIG. 19B schematically illustrates how light is distributed in the semiconductor laser device according to Comparative Example 2 when the isolation grooves have a deep depth and the side faces have a tall height, in which lasing operations have stopped due to the height of the side faces.

With reference to FIGS. 19A and 19B, a description is now given of a mechanism of the semiconductor laser device according to Comparative Example 2 in which lasing operations stop suddenly due to the height of side faces 105. FIGS. 19A and 19B schematically illustrates how light is distributed in semiconductor laser device 1Y according to Comparative Example 2 when a lasing operation has stopped due to the height of side faces 105. FIG. 19A illustrates the case where the isolation grooves have a shallow depth and side faces 105 have a short height, and FIG. 19B illustrates the case where the isolation grooves have a deep depth and side faces 105 have a tall height.

As illustrated in FIG. 19A, in the case where side faces 105 have a short height and the lower ends of the isolation grooves are located at some midpoint in n-side second semiconductor layer 120 of first conductivity-side semiconductor layer 100, light (leakage light) that leaks in the direction orthogonal to the cavity length direction and horizontal to the main surface of substrate 101 (in the transverse direction), out of leakage light that leaks from guided mode 1 originally intended to oscillate and forming a light distribution in the cavity length direction, propagate in a direction toward the pair of side faces 105. However, the structure is weak in terms of confining light within active layer 300 because the maximum intensity of the light distribution in the stacking direction is within n-side second semiconductor layer 120. Thus, only a small amount of leakage light is reflected off the side faces of n-side second semiconductor layer 120, out of the pair of side faces 105 formed in parallel with the normal direction of substrate 101. This prevents formation of guided mode 2 that is originally not intended to oscillate and configured via leakage light, the pair of side faces 105, and active layer 300 as illustrated in FIG. 19B. Thus, superiority is given to guided mode 1 originally intended to oscillate and forming a light distribution in the cavity length direction, and stable lasing operations are possible in a multiple transverse mode.

However, as illustrated in FIG. 19B, if side faces 105 have a tall height and the lower ends of the isolation grooves reach the boundary between second semiconductor layer 120 and first semiconductor layer 110, the amount of light reflected off the pair of side faces 105 increases even if the maximum intensity position of the light distribution in the stacking direction is within n-side second semiconductor layer 120 and even if semiconductor laser device 1Y according to Comparative Example 2 has a weak structure in terms of confining light within active layer 300. This results in formation of guided mode 2 originally not intended to oscillate and configured via leakage light, the pair of side faces 105, and active layer 300. Accordingly, competition occurs between guided mode 1 originally intended to oscillate and forming a light distribution in the cavity length direction and guided mode 2 originally not intended to oscillate. This causes difficulties in stabilizing guided mode 1 originally intended to oscillate in the cavity length direction and forming a guided mode with stable oscillations, and makes lasing itself impossible.

In this way, in the structure where waveguide losses $\alpha_i$ are reduced out of optical losses and the maximum intensity position of the light distribution in the stacking direction is within second semiconductor layer 120, means for attenuating leakage light is critically important because, when the mechanism for attenuating leakage light is lost, guided mode 2 originally not intended to oscillate and configured via leakage light, the pair of side faces 105, and active layer 300 becomes likely to oscillate.

Figure 20:
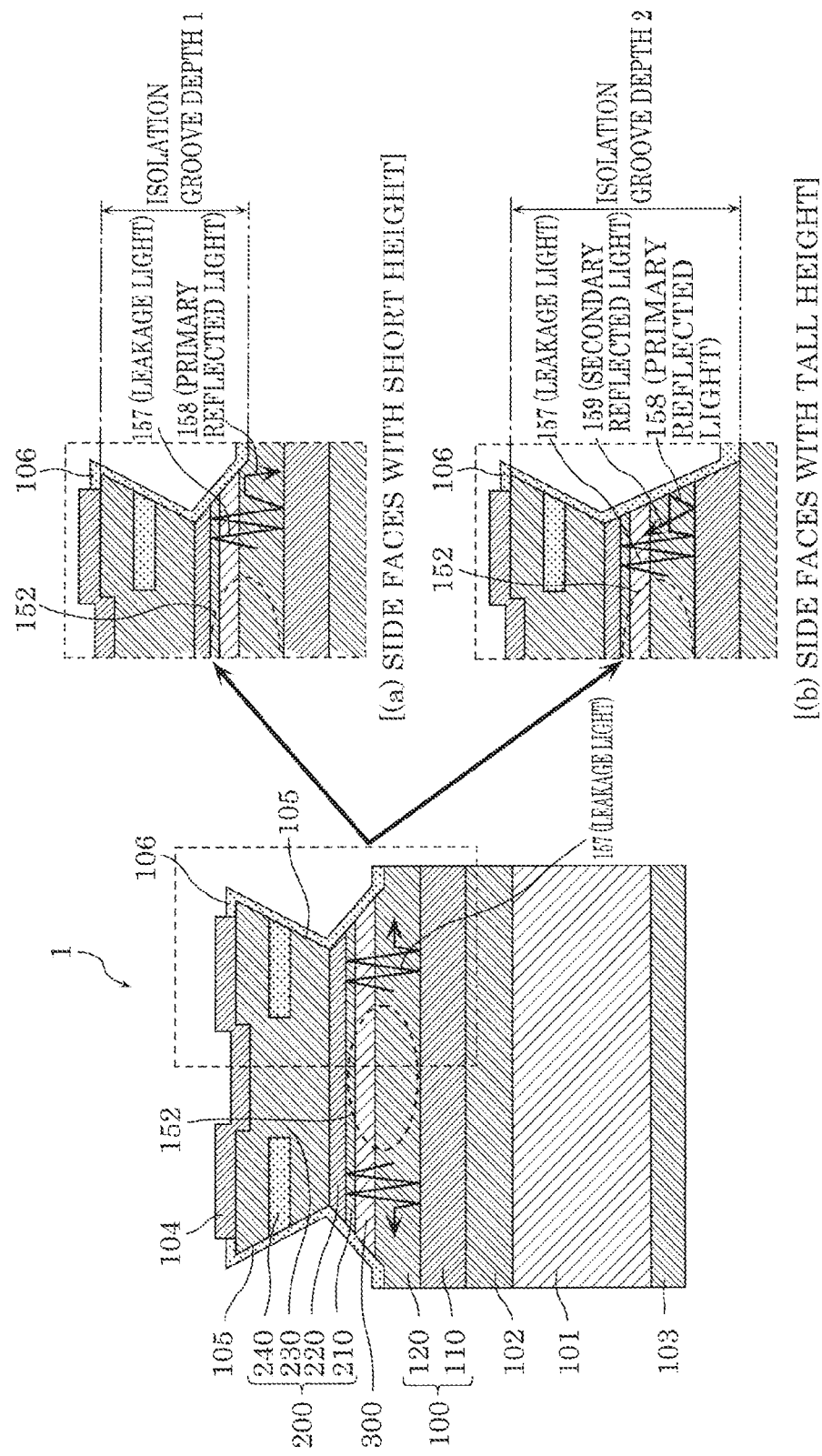
FIG. 20 schematically illustrates how light is distributed during a lasing operation of the semiconductor laser device according to Embodiment 1.

Next, with reference to FIG. 20, a description is given of a mechanism for producing oscillations in a stable multiple transverse mode, irrespective of whether side faces 105 have a short height or a tall height that reaches buffer layer 102 when the height of side faces 105 is changed in semiconductor laser device 1 according to the present embodiment. FIG. 20 schematically illustrates how light is distributed during lasing operations of semiconductor laser device 1 according to Embodiment 1.

In FIG. 20, (a) illustrates how lasing operations are performed when side faces 105 have a short height and the lower ends of the isolation grooves are located at some midpoint in n-side second semiconductor layer 120 of first conductivity-side semiconductor layer 100, and (b) illustrates how lasing operations are performed when side faces 105 have a tall height and the lower ends of side faces 105 are located at the boundary between n-side second semiconductor layer 120 and n-side first semiconductor layer 110.

As illustrated in (a) in FIG. 20, when the pair of side faces 105 has a short height (i.e., isolation groove depth 1 is shallow), leakage light 157 that leaks in a direction orthogonal to the cavity length direction and parallel to the main surface of substrate 101, out of light that leaks from the guided mode originally intended to oscillate and forming light distribution 152 in the cavity length direction, propagates in a direction toward the side faces of the stacked structure including the pair of side faces 105.

At this time, semiconductor laser device 1 according to the present embodiment has a weak structure in terms of confining light within active layer 300 because the maximum intensity position of the light distribution in the stacking direction is within n-side second semiconductor layer 120. However, since side faces 105 (hereinafter, also referred to as inclined faces) inclined in the direction whose width decreases toward active layer 300 are formed in part of n-side second semiconductor layer 120, which is part of first conductivity-side semiconductor layer 100, leakage light 157 that is reflected off the inclined faces of n-side second semiconductor layer 120 becomes primary reflected light 158, changes its direction, and propagates in the opposite direction to the direction of light distribution 152, which is the source of light leakage. Thus, primary reflected light 158 itself is attenuated. This reduces components that come back to the region of active layer 300 in light distribution 152, which is the source of light leakage. As a result, leakage light 157 leaking in the transverse direction from light distribution 152 is inhibited from being fed back into active layer 300, and superiority is given to the guided mode originally intended to oscillate and forming light distribution 152 in the cavity length direction, without formation of the guide mode originally not intended to oscillate and configured via leakage light, the pair of side faces 105, and active layer 300. This enables stable operations in a multiple transverse mode even if the amount of current injection is increased.

As illustrated in (b) in FIG. 20, when the pair of side faces 105 has a tall height (i.e., isolation groove depth 2 is deep), leakage light 157 that leaks in a direction orthogonal to the cavity length direction and parallel to the main surface of substrate 101, out of light that leaks from a guided mode forming light distribution 152 in the cavity length direction, propagates in a direction toward the pair of side faces 105.

At this time, semiconductor laser device 1 according to the present embodiment has a weak structure in terms of confining light within active layer 300 because the maximum intensity position of the light distribution in the stacking direction is within n-side second semiconductor layer 120.

However, since inclined side faces 105 are formed tall enough so as to incline the side faces of all the layers of first conductivity-side semiconductor layer 100, leakage light 157 that is reflected off the inclined faces of n-side second semiconductor layer 120 becomes primary reflected light 158, changes its direction, and returns in a direction toward light distribution 152, which is the source of leakage light. At this time, primary reflected light 158 that is reflected off the interface between first and second semiconductor layers 110 and 120 due to a refractive index difference between first and second semiconductor layers 120 and 110 may become secondary reflected light 159 and return in a direction toward light distribution 152, which is the source of leakage light.

In this way, even if the pair of side faces 105 has a tall height, it is possible to inhibit leakage light 157 that leaks in the transverse direction from light distribution 152 from being fed back into active layer 300 because side faces 105 are inclined faces. However, part of leakage light 157 may be fed back into light distribution 152.

Figure 21A:
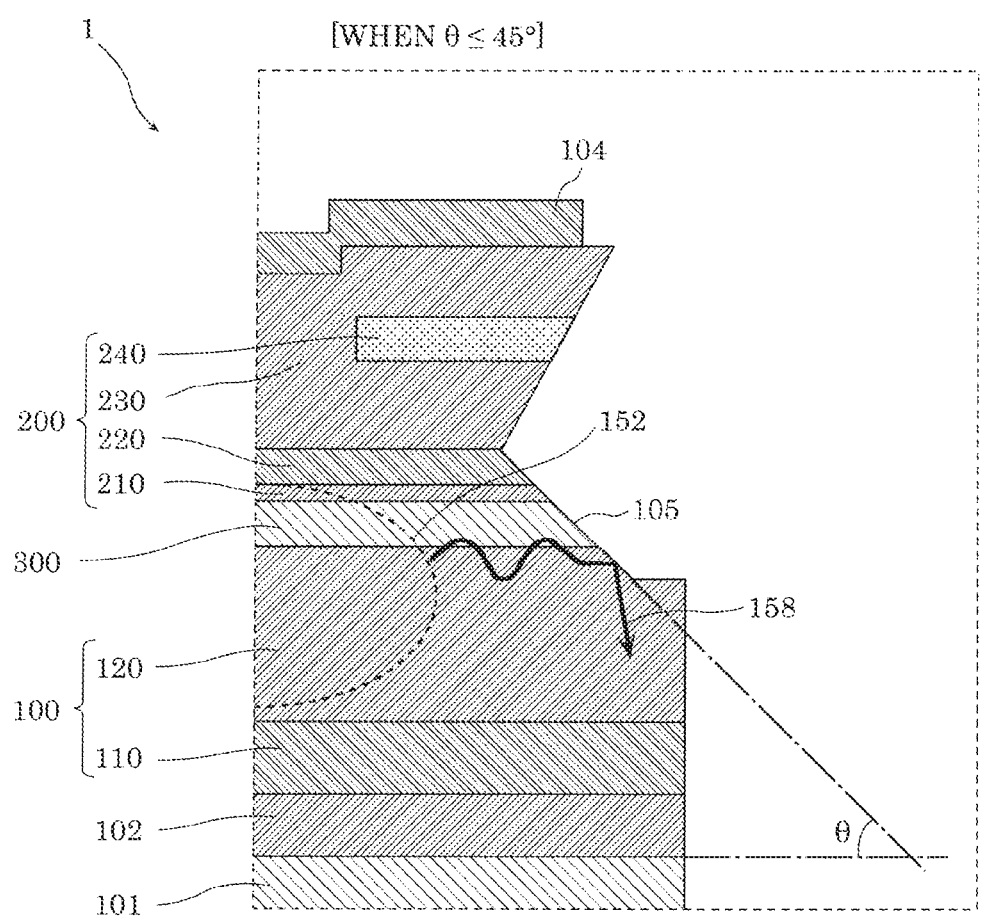
FIG. 21A is an enlarged view of an essential part of the semiconductor laser device according to Embodiment 1 when θ≤45°.
Figure 21B:
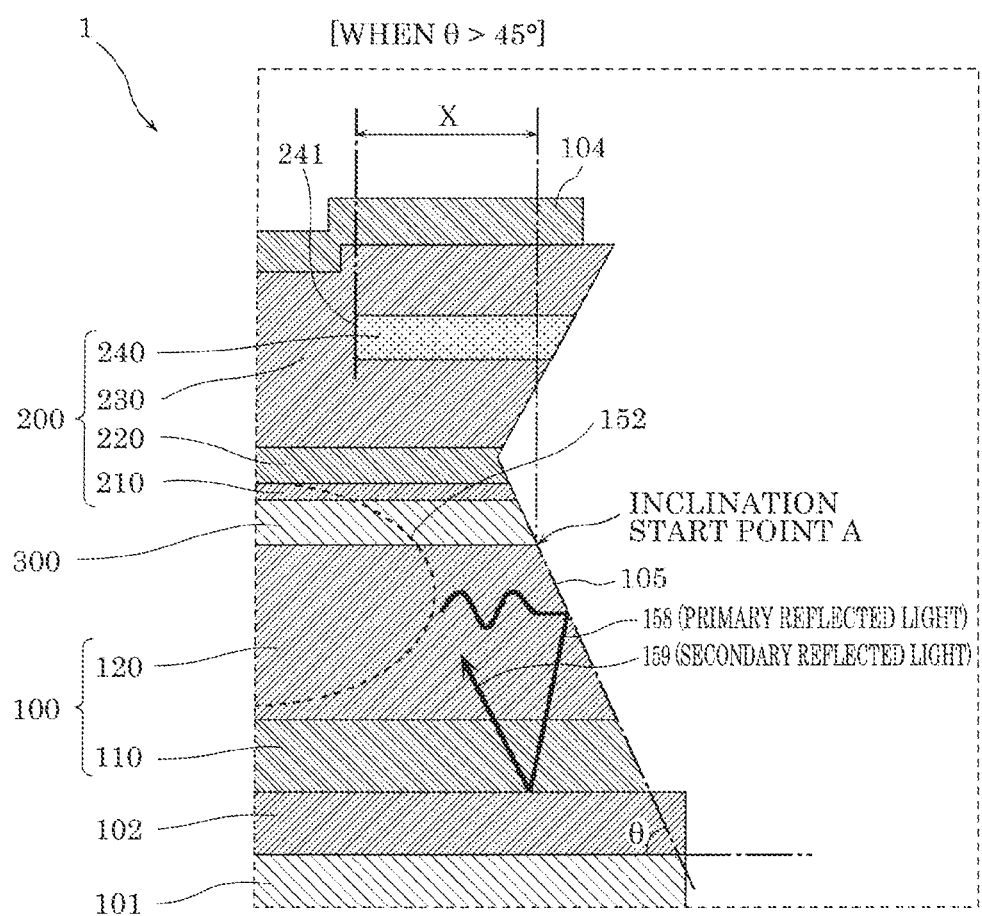
FIG. 21B is an enlarged view of the essential part of the semiconductor laser device according to Embodiment 1 when θ>45°.

In view of this, a detailed study has been made of inclination angle θ of side faces 105 (angle formed by side faces 105 and the main surface of substrate 101). This will be described with reference to FIGS. 21A and 21B. FIGS. 21A and 21B are enlarged views of an essential part of semiconductor laser device 1 according to Embodiment 1. In FIGS. 21A and 21B, dielectric film 106 is not shown.

When leakage light 157 that leaks in the transverse direction from light distribution 152 in the cavity length direction, which is originally intended to oscillate, is reflected off side faces 105 (inclined faces) and returns as primary reflected light 158 to light distribution 152, which is the source of leakage light, inclination angle θ of side faces 105 can be divided into two categories, using inclination angle θ of 45° as a boundary angle as illustrated in FIGS. 21A and 21B.

FIG. 21A illustrates a case where inclination angle θ is less than or equal to 45° (θ≤45°). In this case, leakage light 157 that leaks in the transverse direction from light distribution 152 is reflected off inclined side faces 105 (inclined faces) of part of first conductivity-side semiconductor layer 100, becomes primary reflected light 158, and changes its direction. This primary reflected light 158 propagates in a direction away from light distribution 152, which is the source of leakage light 157, and then attenuates sooner or later.

FIG. 21B illustrates a case where inclination angle θ is greater than 45° (θ>45°). In this case, part of leakage light 157 that leaks in the transverse direction from light distribution 152 is reflected off side faces 105 (inclined faces) of second semiconductor layer 120, becomes primary reflected light 158, and changes its direction. Then, primary reflected light 158 that is further reflected off the interface between n-side first semiconductor layer 110 and buffer layer 102 due to a refractive index difference between n-side first semiconductor layer 110 and buffer layer 102 becomes secondary reflected light 159 and returns in a direction toward light distribution 152, which is the source of leakage light.

In view of this, a distance from the point of reflection of leakage light 157 on side faces 105 to a point where secondary reflected light 159 returns to active layer 300 in light distribution 152 is estimated as an internal reflection distance with reference to FIG. 21B.

When the internal reflection distance is expressed using inclination angle θ(°), the internal reflection distance shows a maximum value when the inclination of side faces 105 starts from the interface between active layer 300 and n-side second semiconductor layer 120 located in the uppermost portion of first conductivity-side semiconductor layer 100. If this start point of inclination is defined as an inclination start point A, and a point of intersection between secondary reflected light 159 and active layer 300 when primary reflected light 158 that is reflected below inclination start point A is reflected off an interface parallel to the main surface of substrate 101 so as to make secondary reflected light 159, and then secondary reflected light 159 reaches active layer 300 is defined as an intersection point B (not shown), the distance from inclination start point A to intersection B corresponds to the internal reflection distance.

Here, if d is the distance from active layer 300 to an interface serving as the start point of secondary reflected light 159, the internal reflection distance is expressed by Equation 1 below:

$$\text{Internal Reflection Distance} = \frac{2 \times d}{\tan(180° - 2\theta)} \quad (1)$$

Figure 22:
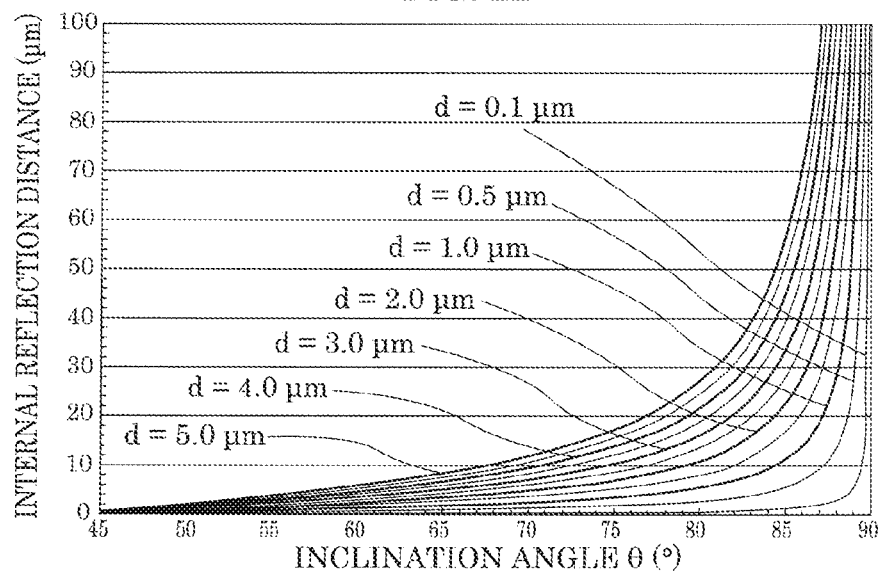
FIG. 22 illustrates the result of estimating an internal reflection distance by distance d with changing inclination angle θ.
Figure 22:
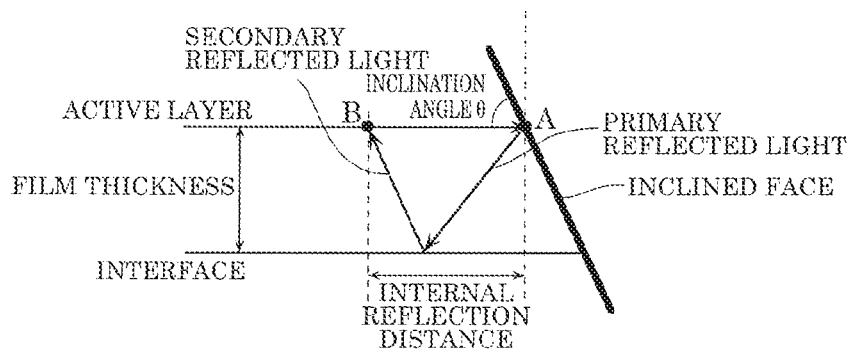

FIG. 22 illustrates the results of estimating the internal reflection distance with changing inclination angle θ, using distance d to the interface. FIG. 22 illustrates the results of estimating the internal reflection distance when inclination angle θ is greater than or equal to 45°. FIG. 22 also illustrates the dependence on the thickness from active layer 300 to the interface at which secondary reflected light 159 is generated, by changing the thickness from active layer 300 to the interface at which secondary reflected light 159 is generated (i.e., changing distance d). The horizontal axis indicates inclination angle θ, and the vertical axis indicates the internal reflection distance.

As can be seen in FIG. 22, the internal reflection distance increases as the thickness from active layer 300 to the interface increases.

From a study based on the results in FIG. 22, the inventors of the present disclosure have come up with an idea that, if active layer 300 in light distribution 152 of the source of leakage is not arranged within the internal reflection distance, it is impossible to suppress a guided mode originally not intended to oscillate and configured via leakage light 157 that leaks from light distribution 152, inclined side faces 105, and active layer 300 in light distribution 152. Thus, the inventors have further conducted a close study of secondary reflected light 159.

In semiconductor laser device 1, an interface where secondary reflected light 159 is generated is the interface between n-side first and second semiconductor layers 110 and 120 in first conductivity-side semiconductor layer 100. In this case, the thickness from active layer 300 to the interface between n-side first and second semiconductor layers 110 and 120 is set to 0.6 μm in the present embodiment.

In the case where the thickness from active layer 300 to the interface between n-side first and second semiconductor layers 110 and 120 is 0.6 μm and if this case is applied to the estimation results in FIG. 22, it can be seen that the internal reflection distance of secondary reflected light 159 is less than or equal to 1 μm when inclination angle θ is 50°, is approximately 11.4 μm when inclination angle θ is 87°, and increases to approximately 35 μm when inclination angle θ is 89°.

Light distribution 152 is a near-field light intensity distribution observed from the light exit end face, and a light distribution width of light distribution 152 of light guided in the stacked structure is defined as a $1/e^2$ intensity width, where 1 is the maximum intensity in the near-field light distribution. That is, the $1/e^2$ intensity width forms the most part of light distribution 152. Here, the $1/e^2$ intensity width (light distribution width) of light distribution 152 that is spread in a direction horizontal to the main surface of substrate 101 is given as Nw [μm].

Figure 23:
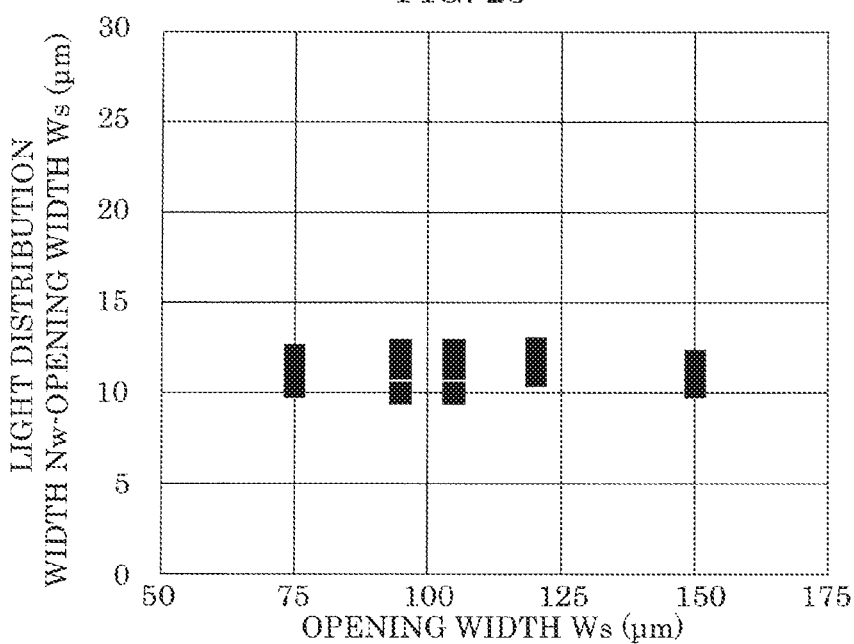
FIG. 23 illustrates changes in light distribution width Nw with changing opening width Ws of the opening of the current block layer in the direction horizontal to the main surface of the substrate and perpendicular to the cavity length direction in the same stacked structure as the stacked structure of the semiconductor laser device according to Embodiment 1.

FIG. 23 illustrates a change in light distribution width Nw when opening width Ws (current opening width) of opening 241 of current block layer 240 in the direction horizontal to the main surface of substrate 101 and perpendicular to the cavity length direction has been changed in the same stacked structure as the stacked structure of semiconductor laser device 1 according to Embodiment 1. In FIG. 23, the horizontal axis indicates opening width Ws, and the vertical axis indicates a difference (=Nw−Ws) obtained by subtracting opening width Ws from light distribution width Nw. This difference represents a region of light distribution 152 that extends to the outside of the opening width of opening 241.

As can be seen from FIG. 23, when opening width Ws is large and greater than or equal to 75 μm, the length of light distribution 152 that extends to the outside of opening 241 becomes approximately 13 μm and remains almost constant even if opening width Ws is changed. This is considered because, in the case where opening width Ws is large enough, the spreading of diffusion current in the direction horizontal to the main surface of substrate 101 and perpendicular to the cavity length direction becomes bilaterally symmetrical and the difference between light distribution width Nw and opening width W becomes a constant value when current flows to active layer 300 below current block layer 240 by virtue of sufficiently large opening width Ws, because the fixed refractive index distribution is small, the maximum intensity position of the light distribution in the stacking direction and most part of the light distribution are within n-side second semiconductor layer 120, and active layer 300 has a thin-film quantum well structure.

The result in FIG. 23 shows that the relationship of opening width Ws, light distribution width Nw, and the internal reflection distance requires light distribution 152 to be inside of the internal reflection distance as a condition for lasing of semiconductor laser device 1 in a stable multiple transverse mode.

Specifically, since n-side second semiconductor layer 120 in semiconductor laser device 1 has a thickness of 0.6 μm, in extreme cases of FIG. 22, light distribution 152 may be inside of the internal reflection distance of 35 μm with inclination angle θ of 89°, and the positions of side faces 105 (inclined faces) of n-side second semiconductor layer 120 in the stacking direction at which secondary reflected light 159 becomes closest to light distribution 152 are at the interface between active layer 300 and second semiconductor layer 120.

In the case where θ>45° in FIG. 21B, if the point of intersection of an inclined face of first conductivity-side semiconductor layer 100 and the interface between n-side second semiconductor layer 120 and active layer 300 is defined as inclination start point A, distance X from the boundary of opening 241 of current block layer 240 to inclination start point A may be set to a value greater than or equal to (internal reflection distance)+(light distribution width Nw−opening width Ws)/2.

Consequently, when generalized including Equation 1 that indicates the internal reflection distance, distance X has to satisfy the following relation of Equation 2 in order to achieve a stable multiple transverse mode.

$$X > \frac{2 \times d}{\tan(180° - 2\theta)} + \frac{Nw - Ws}{2} \quad (2)$$

In Equation 2, Nw [μm] is the width of light distribution 152 (light distribution width), Ws [μm] is the opening width of opening 241 of current block layer 240, and d [μm] is the distance from active layer 300 to the interface serving as the start point of secondary reflected light 159. In semiconductor laser device 1, an interface where a largest amount of secondary reflected light 159 is generated is the interface between n-side first semiconductor layer 110 and n-side second semiconductor layer 120.

Therefore, in an extreme case with inclination angle θ of 89°, if distance X is greater than 41.5 μm according to Equation 2, lasing in a multiple transverse mode is made possible without being affected by secondary reflected light 159. Base on this result, X>41.5 μm in semiconductor laser device 1 according to the present embodiment.

Consequently, semiconductor laser device 1 according to the present embodiment is capable of lasing in a stable multiple transverse mode, irrespective of the dimension of the height of side faces 105 as illustrated in FIG. 18, and stably operating without being affected by leakage light from light distribution 152.

Here, Equation 2 described above is transformed into a general formula using inclination angle θ. Since inclination angle θ is an angle, Equation 3 below is derived as a result of equation conversion from radian measure to degree measure.

$$\tan(180° - 2\theta) > \frac{4d}{2X - (Nw - Ws)} \quad (3)$$

$$180° - 2\theta > \frac{180}{\pi} \text{Arctan}\left\{\frac{4d}{2X - (Nw - Ws)}\right\}$$

$$\theta < 90\left[1° - \frac{1}{\pi}\text{Arctan}\left\{\frac{4d}{2X - (Nw - Ws)}\right\}\right]$$

The range of values that inclination angle θ can take is greater than 0° and therefore inclination angle θ satisfies the relation expressed by Equation 4 below.

$$0° < \theta < 90\left[1° - \frac{1}{\pi}\text{Arctan}\left\{\frac{4d}{2X - (Nw - Ws)}\right\}\right] \quad (4)$$

It is, however, noted that Equation 4 takes the range of inverse trigonometric functions as expressed by Equation 5 below.

$$-\frac{\pi}{2} < \text{Arctan}\left\{\frac{4d}{2X - (Nw - Ws)}\right\} < \frac{\pi}{2} \quad (5)$$

In this way, by forming side faces 105 such that inclination angle θ satisfies Equations 4 and 5 with respect to X, d, Nw, and Ws, it is possible to stably operate the semiconductor laser device without being affected by leakage light 157 traveling in the transverse direction from light distribution 152.

Next, the shape of second side faces 105b on the upper side of active layer 300, out of side faces 105 of the stacked structure of semiconductor laser device 1, will be described with reference again to FIG. 2.

As illustrated in FIG. 2, the relations of θ2>θ1 and θ2>90° may be satisfied, where θ1 is the first angle formed by normal direction D1 of first side face 105a and normal direction D0 of the main surface of substrate 101, and θ2 is the second angle formed by normal direction D2 of second side face 105b and normal direction D0 of the main surface of substrate 101.

Figure 24:
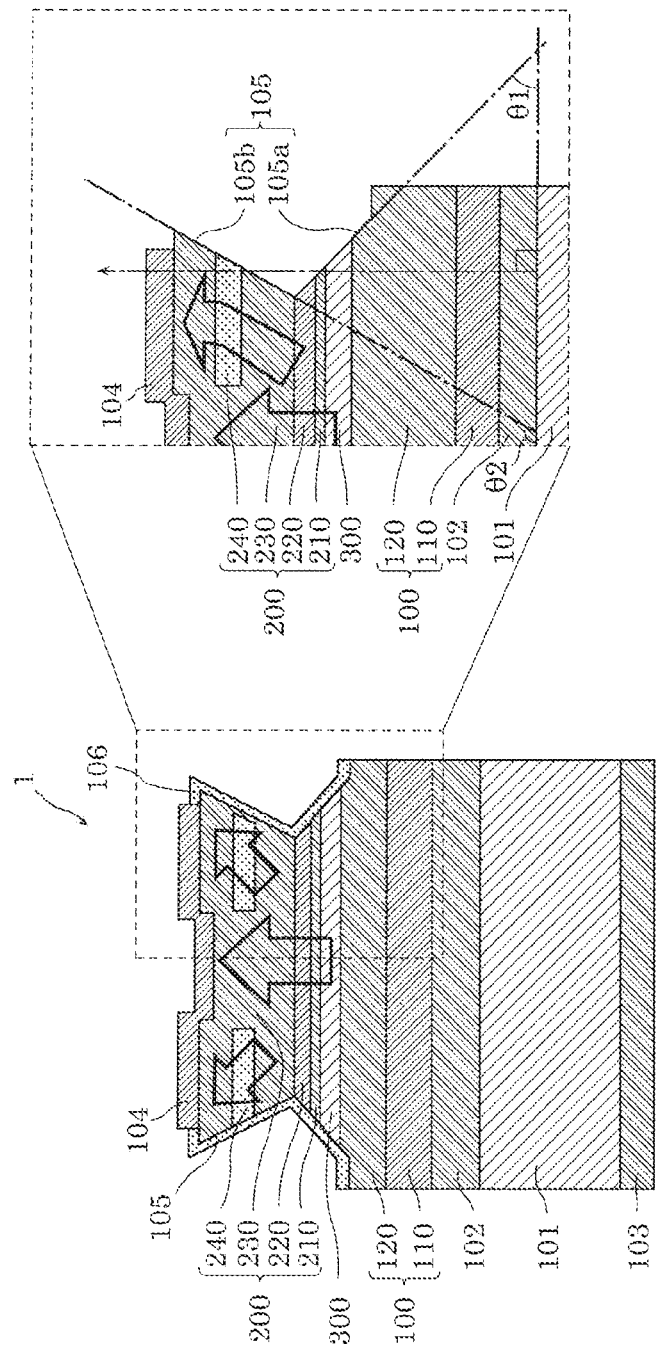
FIG. 24 schematically illustrates how heat is diffused on the upper side of the stacked structure of the semiconductor laser device according to Embodiment 1 above the active layer.

By satisfying these relations, the horizontal width of second electrode 104 can be increased, and the area of contact between second electrode 104 and second contact layer 232 of p-side third semiconductor layer 230 can be increased. Accordingly, it is possible to widen the path of heat dissipation for heat generated based on resistance components when current flows through the region of active layer 300 and each layer during lasing of semiconductor laser device 1. This will be described with reference to FIG. 24. FIG. 24 schematically illustrates how heat is diffused on the upper side of active layer 300 in the stacked structure of semiconductor laser device 1 according to Embodiment 1.

As illustrated in FIG. 24, when θ2>θ1 and θ2>90° are satisfied, a portion of the stacked structure above p-side third semiconductor layer 230 can be formed in an inverted flared mesa shape.

This allows heat generated during laser operations to be diffused in diagonally outward directions, and enables efficient dissipation of heat generated in the stacked structure. The inverted flared mesa shape can also increase the area of contact between layers on the upper side of p-side third semiconductor layer 230, thus resulting in a reduction of contact resistance.

In order to improve heat dissipation capability, layers located above p-side first semiconductor layer 210 are desirably made of materials having excellent thermal conductivity, and for example, in the case of using an AlGaAs-based material, the Al composition is desirably as low as possible. In particular, no inclusion of Al is more desirable. From the viewpoint of electrical resistance, resistance decreases as the Al composition decreases. In view of the circumstances described above, in semiconductor laser device 1 according to the present embodiment, layers located above p-side second semiconductor layer 220 are made of a GaAs material that does not contain Al.

SUMMARY

As described above, with regard to semiconductor laser device 1 according to the present embodiment, a detailed study has been conducted of the dimension of the light distribution (near-field) with respect to the opening width of opening 241 of current block layer 240 formed in semiconductor laser device 1 and the inclination angle of the pair of side faces 105 of the stacked structure with respect to leakage light that leaks from the light distribution in the direction (transverse direction) orthogonal to the cavity length direction and horizontal to the main surface of substrate 101, while indicating that the maximum intensity of the light distribution in the stacking direction is within first conductivity-side semiconductor layer 100 (in the present embodiment, n-side second semiconductor layer 120), most part of the light distribution is within first conductivity-side semiconductor layer 100 (in the present embodiment, n-side second semiconductor layer 120), and active layer 300 has a quantum well structure and has superiority by virtue of its SQW structure. A detailed study has also been conducted of, for example, the inclination angle of the pair of inclined side faces 105 and the distance from the pair of side faces 105 to the light distribution, in order to suppress a guide mode originally not intended to oscillate and configured via leakage light, the pair of side faces 105 of the stacked structure, and active layer 300 within the light distribution, and to allow the semiconductor laser device to operate in a stable multiple transverse mode in the cavity length direction in which a guided mode is originally intended to oscillate. There are no past examples, including technical literatures, of these studies, and the above points have this time been focused on for the first time and studied closely to formulate the technique of the present disclosure.

In order to achieve optical output at levels of 10 W per emitter, it is necessary to improve heat dissipation capability at the same time, and simultaneous with conducting the present studies, the inventors also have newly found a structure for widening the path of heat diffusion and formulated and achieved, for the first time, a technique that offers an excellent compromise between suppressing leakage light and providing high heat dissipation capability.

Specifically, in semiconductor laser device 1 according to the present embodiment, the pair of side faces 105 is formed in the portion of the stacked structure that ranges from part of first conductivity-side semiconductor layer 100 to second conductivity-side semiconductor layer 200, active layer 300 has the second width greater than the first width of opening 241 of current block layer 240, the pair of side faces 105 in at least part of first conductivity-side semiconductor layer 100 is inclined to the main surface of substrate 101, and as to light guided in the stacked structure, the maximum intensity position of the light distribution in the normal direction of the main surface of substrate 101 is within first conductivity-side semiconductor layer 100.

This inhibits light that leaks from the optical waveguide (light distribution) in the transverse direction from being fed back into active layer 300 and allows laser light to be stably output in a multiple transverse mode even if the amount of current injection is increased. Accordingly, it is possible to achieve high-power, long-term reliable semiconductor laser device 1.

In semiconductor laser device 1 according to the present embodiment, the materials for first reflection film 410 and second reflection film 420 are not limited to a combination of $Al_2O_3$, $SiO_2$, and $Ta_2O_5$, and may be any combination of $ZrO_2$, $TiO_2$, SiN, BN, AlN, and $A_xO_yN$ (x>y) as long as first reflection film 410 can reduce reflectance R1 of front end face 1a and second reflection film 420 can increase reflectance R2 of rear end face 1b.

In semiconductor laser device 1 according to the present embodiment, n-side first semiconductor layer 110 has a three-layer structure of n-type first cladding layer 111 made of n-$Al_{0.15}Ga_{0.85}As$, n-type second cladding layer 112 made of n-$Al_{0.335}Ga_{0.665}As$, and n-type third cladding layer 113 made of n-$Al_{0.335}Ga_{0.665}As$, and the Al composition and the impurity doping concentration is increased or decreased in accordance with the light distribution in the stacking direction so as to have a light confinement structure and reduce carrier absorption. Alternatively, n-side first semiconductor layer 110 may have a multilayer structure or a single-layer structure, and similar effects can also be achieved even if n-side first semiconductor layer 110 has a single-layer structure.

In semiconductor laser device 1 according to the present embodiment, n-side second semiconductor layer 120 has a three-layer structure of n-type first optical waveguide layer 121 made of n-$Al_{0.27}Ga_{0.73}As$, n-type second optical waveguide layer 122 made of n-$Al_{0.27}Ga_{0.73}As$, and n-type third optical waveguide layer 123 made of n-$Al_{0.25}Ga_{0.75}As$, and the Al composition and the impurity doping concentration are increased or decreased in accordance with the light distribution in the stacking direction in order to have a guiding-layer structure where the center of the light distribution in the stacking direction exists and to control light distribution with high precision so as to reduce free carrier absorption. Alternatively, n-side second semiconductor layer 120 may have a multilayer structure or a single-layer structure, and similar effects can also be achieved even if n-side second semiconductor layer 120 has a single-layer structure.

In semiconductor laser device 1 according to the present embodiment, in order to maximize effects, active layer 300 is made to have a single quantum well structure in which first barrier layer 310 made of un-$Al_{0.25}Ga_{0.75}As$, well layer 320 made of un-$In_{0.17}Ga_{0.83}As$, and second barrier layer 330 made of un-$Al_{0.25}Ga_{0.75}As$ are stacked one above another. Alternatively, for similar effects, active layer 300 may have a multiple quantum well structure including two or more quantum well layers.

In semiconductor laser device 1 according to the present embodiment, the pair of side faces 105 (inclined faces) is made into approximately a symmetrical shape as illustrated in FIG. 1, using as substrate 101 a (100)-plane substrate tilted by 0.2° in the [011] direction. Alternatively, a (100)-plane substrate tilted by 0.2° to 10° in the [011] tilt direction with respect to main surface (100) of substrate 101 may be used. In this case, the pair of side faces 105 (inclined faces) has a bilaterally non-symmetrical shape, and if φ is the off-angle in this case, the (inclined-face) shape of side face 105a on the [011]-direction side, out of the pair of side faces 105a, has a steep slope (inclination calculated by adding the off-angle to the 0.2-degree tilted substrate; inclination angle of θ1+φ), and the (inclined-face) shape of side face 105a on the other side has a gentle slope (inclination calculated by subtracting the off-angle from the 0.2-degree tilted substrate; inclination angle of θ1−φ). However, if the inclination angle is within a range that satisfies Equations 4 and 5, similar effects can be achieved. In this case, the (inclined-face) shape of side face 105b on the [011]-direction side, out of the pair of side faces 105b, has an inclination angle of θ2+φ, and the (inclined-face) shape of side face 105b on the other side has an inclination angle of θ2−φ.

In semiconductor laser device 1 according to the present embodiment, p-side second semiconductor layer 220 has a three-layer structure of p-type first cladding layer 221 made of p-$Al_{0.65}Ga_{0.35}As$, p-type second cladding layer 222 made of p-$Al_{0.65}Ga_{0.35}As$, and p-type third cladding layer 223 made of p-$Al_{0.15}Ga_{0.85}As$, and achieves an optical waveguide with ultralow losses (optical waveguide losses $\alpha_i$=0.5 $cm^{-1}$) because high-precision control of the refractive indices allows maximum light intensity in the stacking direction and most part of the light distribution to exit within n-side second semiconductor layer 120 (n-side light guiding layer). Alternatively, p-side second semiconductor layer 220 may have a multilayer structure or a single-layer structure, and similar effects can also be achieved even if p-side second semiconductor layer 220 has a single-layer structure.

Figure 25A:
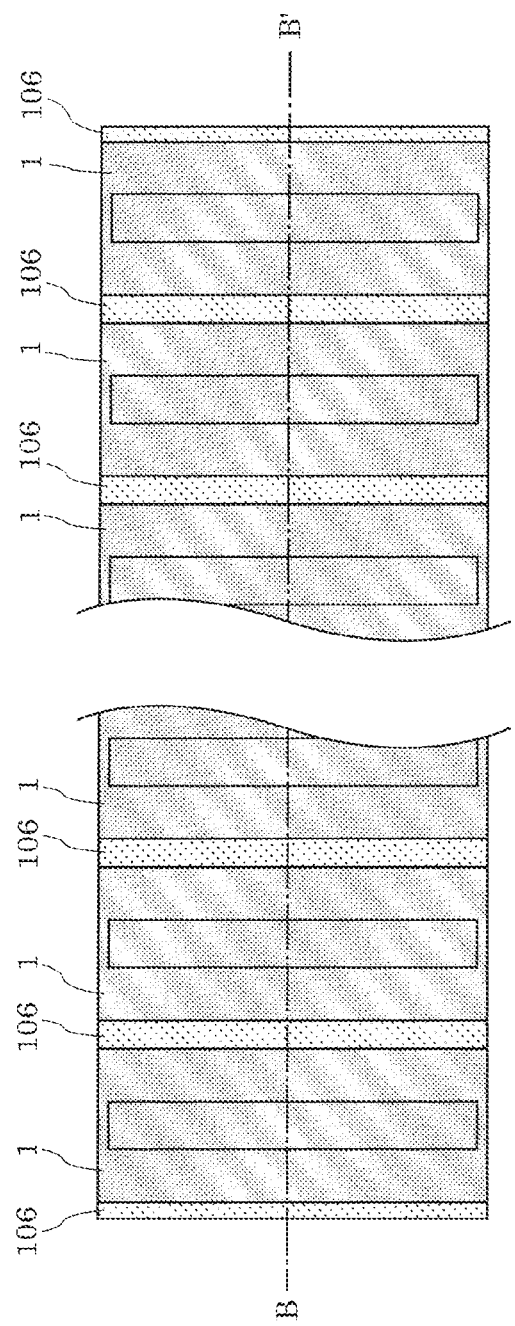
FIG. 25A illustrates a semiconductor laser device with a multi-emitter structure.
Figure 25B:
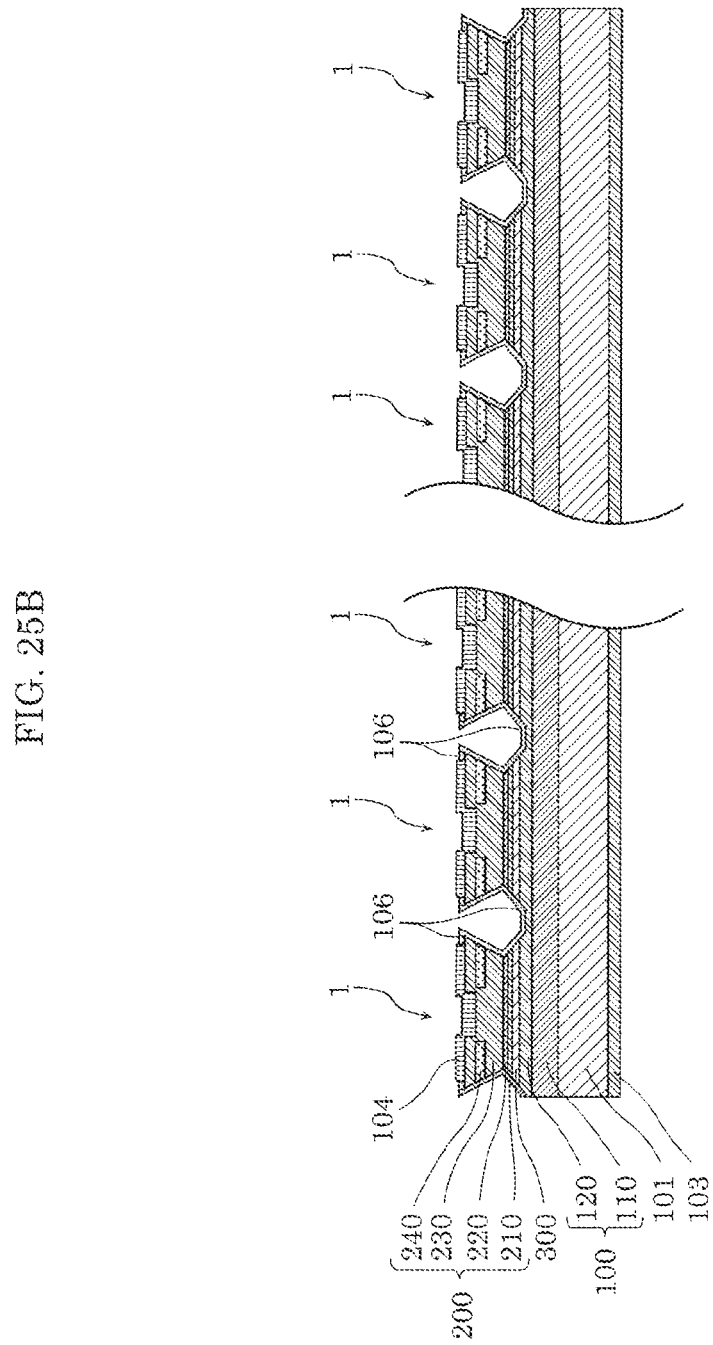
FIG. 25B is a sectional view of the semiconductor laser device, taken along line B-B' in FIG. 25A.

Semiconductor laser device 1 according to the present embodiment can also achieve similar effects when serving as a semiconductor laser device having a multi-emitter structure that includes a plurality of emitters. For example, as illustrated in FIGS. 25A and 25B, a plurality of semiconductor laser devices 1 may be arranged so as to form a semiconductor laser device having a multi-emitter structure that includes a plurality of emitters. In this case, the semiconductor laser device with a multi-emitter structure includes a plurality of openings 241 of current block layer 240, and each of the plurality of openings 241 is isolated by isolation grooves formed from part of first conductivity-side semiconductor layer 100 to second conductivity-side semiconductor layer 200. FIG. 25B is a sectional view taken along line B-B' in FIG. 25A.

In semiconductor laser device 1 according to the present embodiment, a GaAs substrate is used as substrate 101, and each layer of the stacked structure is formed of a GaAs-based semiconducting material such as GaAs, AlGaAs, or InGaAs on the GaAs substrate. However, the material used in the stacked structure of semiconductor laser device 1 is not limited to this example.

Figure 26:
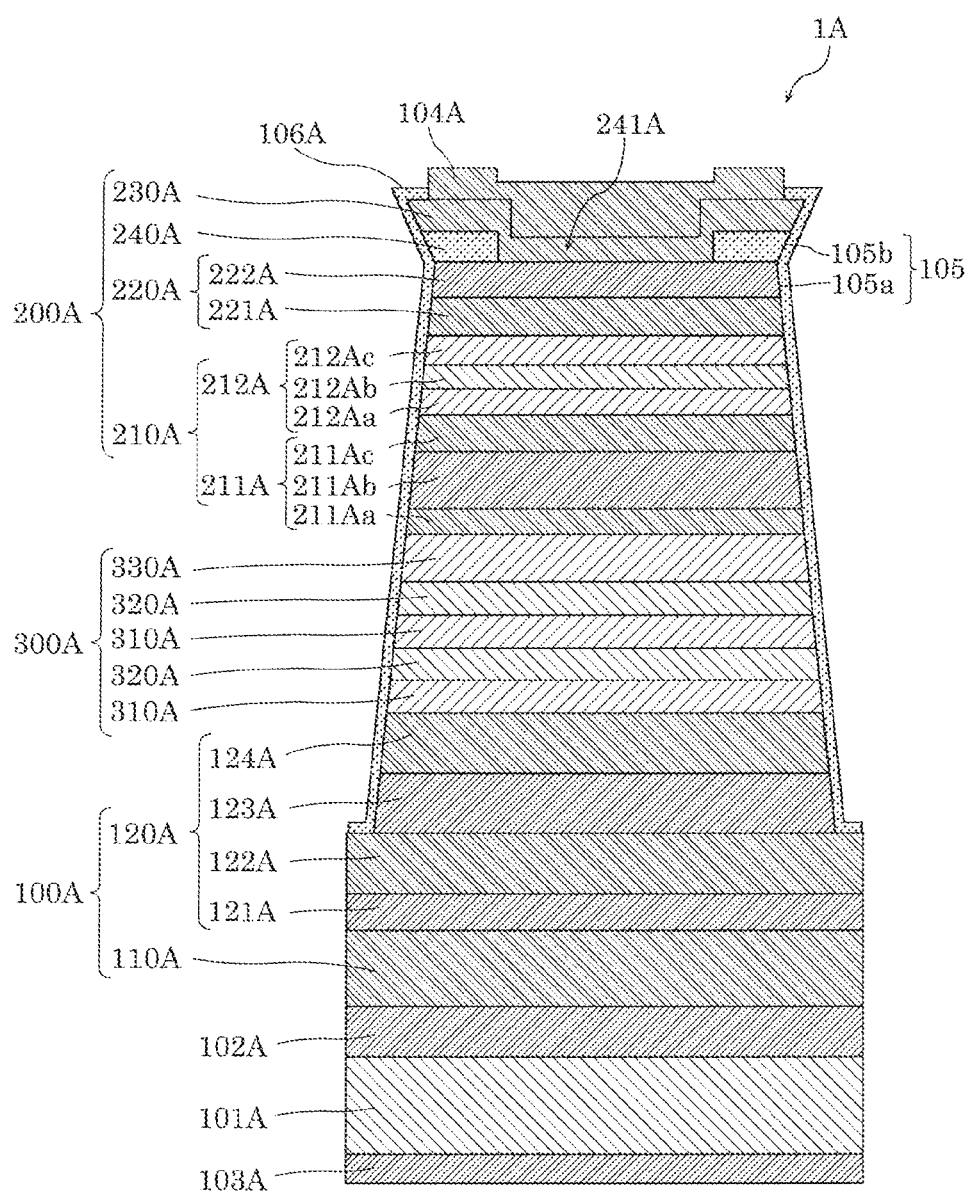
FIG. 26 is a sectional view of a semiconductor laser device according to a variation of Embodiment 1.
Figure 27:
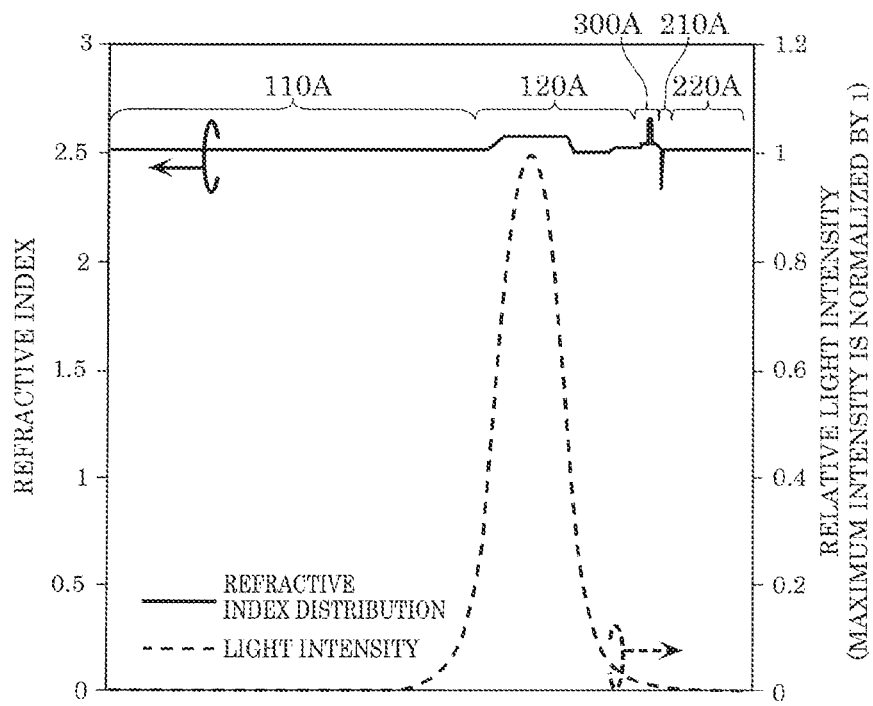
FIG. 27 illustrates a refractive index distribution and a light distribution in the stacking direction within an optical waveguide in the semiconductor laser device illustrated in FIG. 26.

For example, a GaN substrate may be used as substrate 101, and each layer of the stacked structure may be formed of a nitride-based semiconductor material such as GaN, AlGaN, InGaN, or AlGaInN on the GaN substrate. As one example, semiconductor laser device 1A using an $Al_xGa_{1-x-y}In_yN$ material (where 0≤x≤1 and 0≤y≤1) will be described with reference to FIGS. 26 and 27. FIG. 26 is a sectional view of semiconductor laser device 1A according to a variation of Embodiment 1. FIG. 27 illustrates a refractive index distribution and a light distribution in the stacking direction within an optical waveguide of semiconductor laser device 1A illustrated in FIG. 26.

As illustrated in FIG. 26, semiconductor laser device 1A is an end-face emission type laser element that includes a stacked structure in which first conductivity-side semiconductor layer 100A, active layer 300A, and second conductivity-side semiconductor layer 200A are sequentially stacked, and oscillates and emits laser light in a multiple transverse mode.

Specifically, semiconductor laser device 1A includes substrate 101A, buffer layer 102A formed on the upper face of substrate 101A, first conductivity-side semiconductor layer 100A formed on buffer layer 102A, active layer 300A formed on first conductivity-side semiconductor layer 100A, second conductivity-side semiconductor layer 200A formed on active layer 300A, first electrode 103A formed on the lower face of substrate 101A, and second electrode 104A formed on second conductivity-side semiconductor layer 200A.

According to the variation of the present embodiment, substrate 101A is an n-GaN substrate. Buffer layer 102A is, for example, an n-GaN-type layer with a thickness of 1 μm.

First conductivity-side semiconductor layer 100A (n-side semiconductor layer) includes n-side first semiconductor layer 110A formed on buffer layer 102A, and n-side second semiconductor layer 120A formed on n-side first semiconductor layer 110A.

N-side first semiconductor layer 110A is an n-type cladding layer made of n-$Al_{0.026}Ga_{0.974}N$ and having a thickness of 3.7 μm.

N-side second semiconductor layer 120A is a first light guiding layer (with a total thickness of 1.04 μm) serving as an n-side light guiding layer, and is also a stacked film in which undoped first optical waveguide layer 121A made of un-$In_{0.02}Ga_{0.98}N$ (with a thickness of 0.5 μm), n-type second optical waveguide layer 122A made of n-$Al_{0.026}Ga_{0.974}N$ (with a thickness of 0.03 μm), n-type third optical waveguide layer 123A made of n-GaN (with a thickness of 0.22 μm), and undoped fourth optical waveguide layer 124A made of un-$In_{0.008}Ga_{0.992}N$ (with a thickness of 0.02 μm) are sequentially stacked.

Second conductivity-side semiconductor layer 200A (p-side semiconductor layer) on active layer 300A includes p-side first semiconductor layer 210A, p-side second semiconductor layer 220A, p-side third semiconductor layer 230A, and current block layer 240A.

P-side first semiconductor layer 210A is a second light guiding layer serving as a p-side light guiding layer, and is formed on active layer 300A. P-side first semiconductor layer 210A includes undoped light guiding layer 211A (with a thickness of 0.0354 μm) and carrier overflow suppression layer 212A (with a thickness of 0.0539 μm). Undoped light guiding layer 211A is a stacked film in which first optical waveguide layer 211Aa made of un-$In_{0.008}Ga_{0.992}N$ (with a thickness of 0.017 μm), p-type second optical waveguide layer 211Ab made of un-$In_{0.003}Ga_{0.997}N$ (with a thickness of 0.0135 μm), and p-type third optical waveguide layer 211Ac made of un-GaN (with a thickness of 0.0049 μm) are sequentially stacked. Carrier overflow suppression layer 212A is a stacked film in which first carrier overflow suppression layer 212Aa made of p-GaN (with a thickness of 0.0049 μm), second carrier overflow suppression layer 212Ab made of p-$Al_{0.36}Ga_{0.64}N$ (with a thickness of 0.005 μm), and third carrier overflow suppression layer 212Ac made of p-$Al_{0.026}Ga_{0.974}N$ (with a thickness of 0.044 μm) are sequentially stacked.

P-side second semiconductor layer 220A is a p-type cladding layer and is formed on p-side first semiconductor layer 210A. P-side second semiconductor layer 220A (with a total thickness of 0.595 μm) is a stacked film in which p-type first cladding layer 221A made of p-$Al_{0.026}Ga_{0.974}N$ (with a thickness of 0.505 μm) and p-type second cladding layer 222A made of p-$Al_{0.026}Ga_{0.974}N$ and doped with high concentration (with a thickness of 0.09 μm) are sequentially stacked.

P-side third semiconductor layer 230A is formed on current block layer 240A and on p-side second semiconductor layer 220A so as to fill opening 241A of current block layer 240A. P-side third semiconductor layer 230A is a p-type contact layer made of p-GaN (with a thickness of 0.05 μm).

Current block layer 240A is a p-side semiconductor layer made of n-$Al_{0.15}Ga_{0.85}N$ and having a thickness of 0.15 μm, and is formed on p-side second semiconductor layer 220A. According to the variation of the present embodiment, current block layer 240A is an n-type current block layer. Current block layer 240A has opening 241A that corresponds to a current injection region. Opening 241A of current block layer 240A has, for example, a shape similar to the shape of opening 241 of current block layer 240 illustrated in FIG. 2.

Active layer 300A is a stacked film with a double quantum well structure, in which first barrier layer 310A made of un-$In_{0.008}Ga_{0.992}N$ (with a thickness of 0.019 μm), well layer 320A made of un-$In_{0.066}Ga_{0.934}N$ (with a thickness of 0.0075 μm), first barrier layer 310A made of un-$In_{0.008}Ga_{0.992}N$ (with a thickness of 0.019 μm), well layer 320A made of un-$In_{0.066}Ga_{0.934}N$ (with a thickness of 0.0075 μm), and second barrier layer 330A made of n-$In_{0.008}Ga_{0.992}N$ (with a thickness of 0.019 μm) are sequentially stacked. Note that the composition of active layer 300A may be $In_xGa_{1-x}N$ (0<x<1). In this case, the emission wavelength is in the range of 400 nm to 550 nm.

First electrode 103A (n-side electrode) and second electrode 104A (p-side electrode) are similar to first electrode 103 and second electrode 104 of semiconductor laser device 1 illustrated in FIG. 1, and current is supplied by first and second electrodes 103A and 104A.

According to the variation of the present embodiment, the stacked structure of semiconductor laser device 1A also includes a pair of side faces 105. As in semiconductor laser device 1 according to Embodiment 1 described above, side faces 105 are formed as inclined faces in portions ranging from part of first conductivity-side semiconductor layer 100A to second conductivity-side semiconductor layer 200A.

Although not shown, like semiconductor laser device 1 illustrated in FIG. 2, the stacked structure of semiconductor laser device 1A includes front end face 1a serving as an exit end face of laser light, rear end face 1b that is a face on the opposite side to front end face 1a, and an optical waveguide using front and rear end faces 1a and 1b as reflecting mirrors of the resonator.

In semiconductor laser device 1A according to the variation of the present embodiment, the width of the current injection region to the optical waveguide is delimited by current block layer 240A, as in semiconductor laser device 1 illustrated in FIG. 2. Specifically, the current injection region corresponds to opening 241A of current block layer 240A. That is, according to the variation of the present embodiment, the width of the current injection region is delimited by the opening width of opening 241A of current block layer 240A.

As illustrated in FIG. 27, in semiconductor laser device 1A according to the variation of the present embodiment, side faces 105 are formed in the portions of the stacked structure that range from part of first conductivity-side semiconductor layer 100A to second conductivity-side semiconductor layer 200A, and a maximum intensity position of the light distribution and most part of the light distribution is within n-side second semiconductor layer 120A (n-side light guiding layer) as in semiconductor laser device 1 according to Embodiment 1 described above.

With this structure, semiconductor laser device 1A according to the variation of the present embodiment can suppress the influence of leakage light and the like, using a mechanism similar to the mechanism of semiconductor laser device 1. This allows the semiconductor laser device to operate with low losses and in a stable multiple transverse mode.

As described thus far, semiconductor laser device 1A according to the variation of the present embodiment can achieve similar effects to the effects of semiconductor laser device 1 according to Embodiment 1 described above.

In semiconductor laser devices 1 and 1A, a GaAs of GaN substrate is used as substrate 101, but substrate 101 is not limited to this example. For example, an InP substrate may be used as substrate 101, and each layer of the stacked structure may be formed of an arbitrary selected semiconductor material such as GaAs, AlGaAs, AlGaAsP, InAlGaAsP, InP, GaInP, GaP, AlGaP, or InGaAsP on the InP substrate. Semiconductor laser devices with this configuration can also achieve similar effects.

As one variation of the present embodiment, a plurality of semiconductor laser devices 1 may be stacked in the stacking direction via tunnel junctions to form a stacked laser structure. Similar effects to the effects of semiconductor laser device 1 according to Embodiment 1 described above can be achieved by inclining part of first conductivity-side semiconductor layer 100 in each semiconductor laser device 1 located in either the lower or upper portion of the stacked structure.

Embodiment 2

Figure 28A:
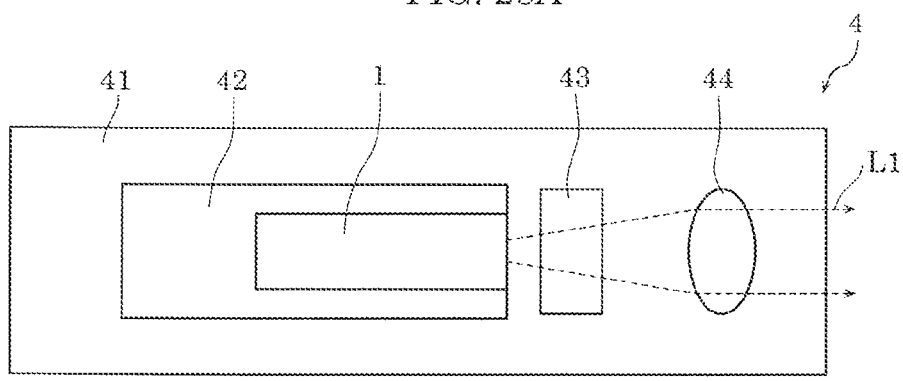
FIG. 28A is a plan view of a semiconductor laser module according to Embodiment 2.
Figure 28B:
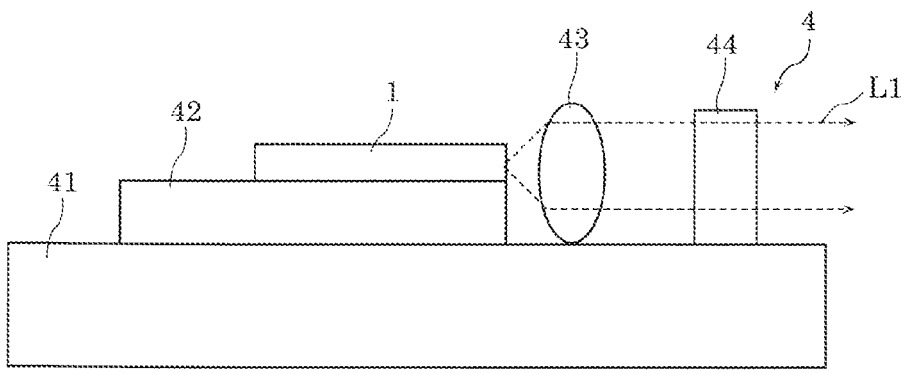
FIG. 28B is a side view of the semiconductor laser module according to Embodiment 2.

Next, a semiconductor laser module according to Embodiment 2 will be described with reference to FIGS. 28A and 28B. FIG. 28A is a plan view of semiconductor laser module 4 according to Embodiment 2, and FIG. 28B is a side view of semiconductor laser module 4.

Semiconductor laser module 4 according to the present embodiment includes semiconductor laser device 1 according to Embodiment 1 described above. Specifically, as illustrated in FIGS. 28A and 28B, semiconductor laser module 4 includes metal base 41, base 42 disposed on metal base 41, semiconductor laser device 1 arranged on base 42, and first and second optical elements 43 and 44 arranged on an optical path of laser light 1L emitted from semiconductor laser device 1.

In general, semiconductor laser devices suffer reductions in the level of thermal saturation when heat generation causes leakage of carriers from active layers. Semiconductor laser device 1 is susceptible to the influence of external stress, and suffers a deterioration in the crystallinity of semiconductor materials and a reduction in long-term reliability when excessive stress is applied from the outside. For mounting of semiconductor laser devices, gold tin solder is generally used, so the semiconductor laser devices are mounted under such high temperature conditions that gold tin solder will melt. Therefore, if a semiconductor laser device is mounted on a material whose thermal expansion coefficient is considerably different from the thermal expansion coefficient of the semiconductor laser device, heating and cooling processes cause mounting stress in the semiconductor laser device due to a difference in thermal expansion coefficient.

In the present embodiment, these circumstances are taken into consideration, and semiconductor laser device 1 is mounted on base 42 that is arranged on metal base 41 having high heat dissipation capability and that has high thermal conductivity and has a lattice constant close to lattice constants of semiconductor materials used in semiconductor laser device 1.

Metal base 41 is made of, for example, copper. Base 42 may be made of a material having a lattice constant close to the lattice constant of semiconductor laser device 1, such as a material made of copper and tungsten (W), a material made of copper, tungsten, and diamond, or a material made of aluminum nitride. In addition, a channel may be formed, through which a liquid circulates in metal base 41. If cooling water is circulated through that channel, heat dissipation capability can be further improved. This allows semiconductor laser device 1 to operate at high output, and reduces mounting stress applied to semiconductor laser device 1 and ensures long-term reliability.

First optical element 43 forms parallel light from only vertical light out of laser light L1 emitted from semiconductor laser device 1. Second optical element 44 forms parallel light form horizontal light out of laser light L1 that has passed through first optical element 43 and whose vertical light has been formed into parallel light. With this configuration, the shape of laser light L1 does not depend on the distance from semiconductor laser device 1. Accordingly, it is possible to achieve semiconductor laser module 4 that can efficiently utilize laser light L1 emitted from semiconductor laser device 1.

As described thus far, semiconductor laser module 4 according to the present embodiment includes semiconductor laser device 1 according to Embodiment 1. Thus, it is possible to achieve a high-power semiconductor laser module capable of low-power operations.

Although semiconductor laser device 1 according to Embodiment 1 is used in the present embodiment, the present embodiment is not limited to this example. For example, semiconductor laser device 1A illustrated in FIG. 26 may be used, or the semiconductor laser device with a multi-emitter structure illustrated in FIGS. 25A and 25B may be used. Using the semiconductor laser device with a multi-emitter structure can further improve optical output of the semiconductor laser module.

Embodiment 3

Next, a welding laser light source system 5 according to Embodiment 3 will be described with reference to FIG. 29.

Figure 29:
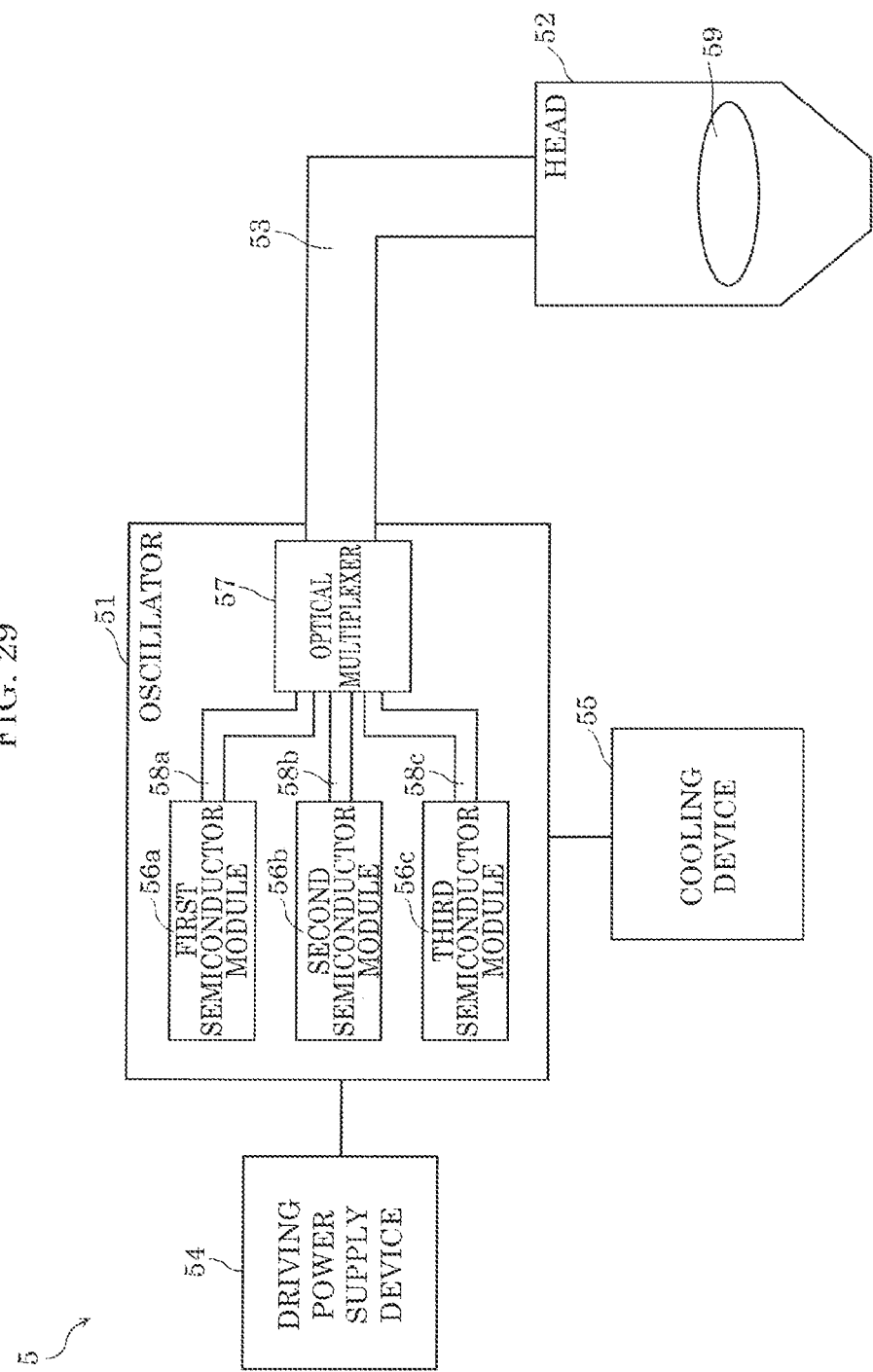
FIG. 29 illustrates a configuration of a welding laser light source system according to Embodiment 3.
Figure 30A:
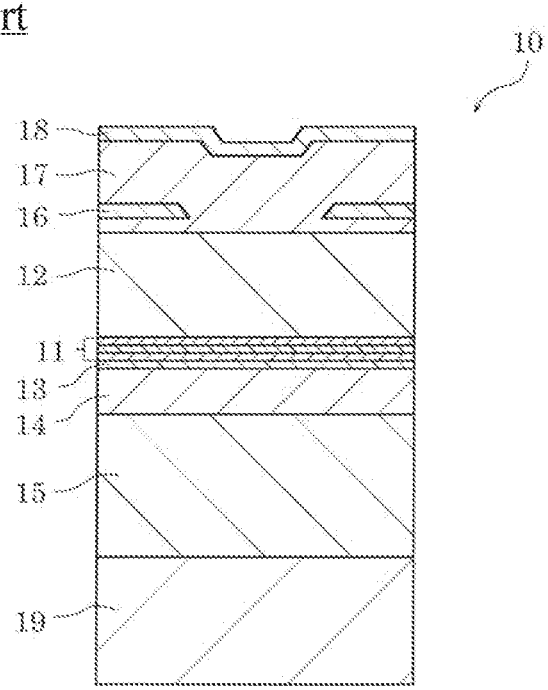
FIG. 30A is a sectional view of a conventional semiconductor laser device disclosed in PTL 1.
Figure 30A:
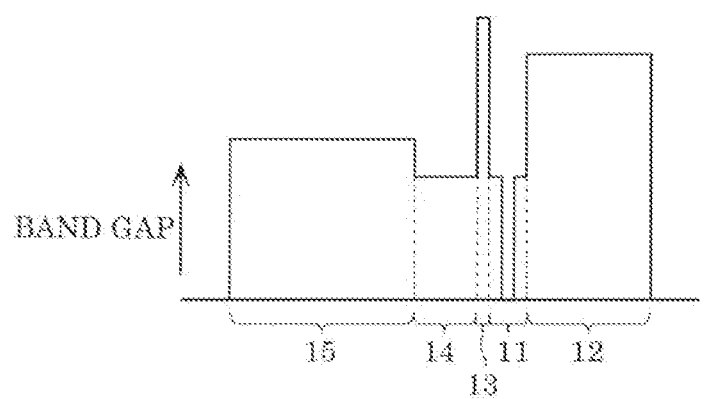
Figure 31:
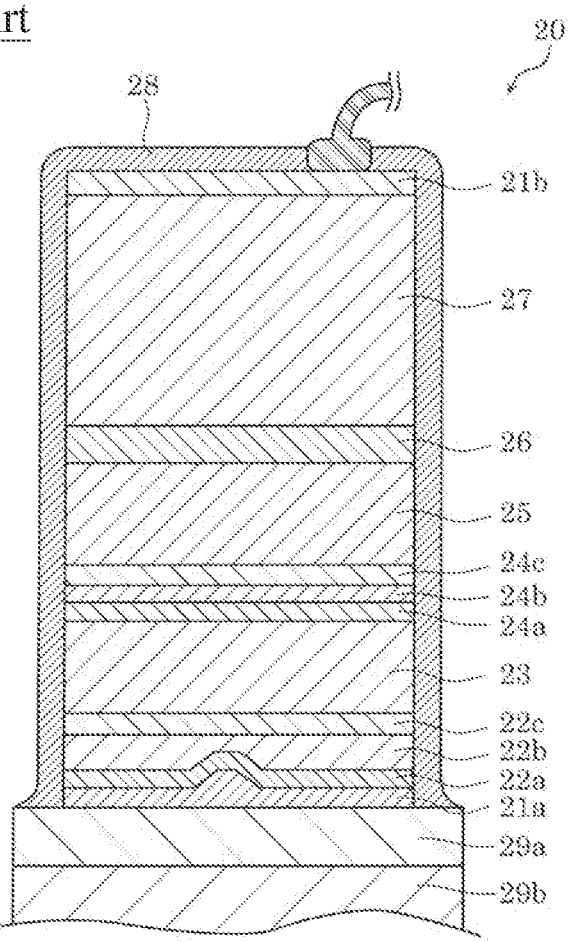
FIG. 31 is a sectional view of a conventional semiconductor laser device disclosed in PTL 2.
Figure 32:
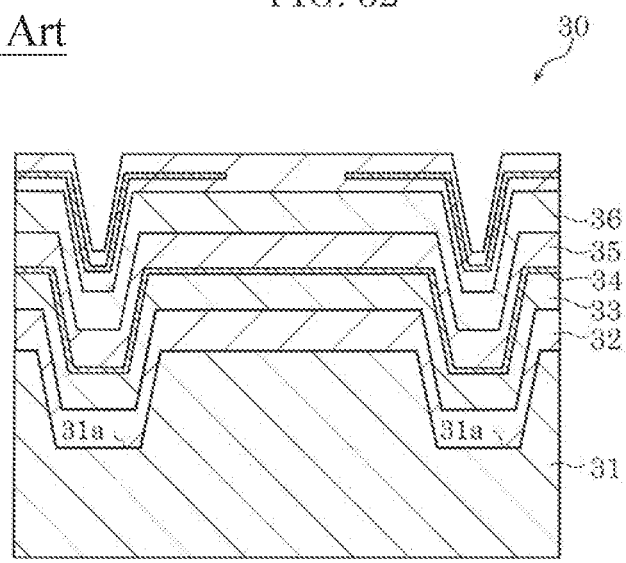
FIG. 32 is a sectional view of a conventional semiconductor laser device disclosed in PTL 3.

FIG. 29 illustrates a configuration of welding laser light source system 5 according to Embodiment 3.

As illustrated in FIG. 29, welding laser light source system 5 includes oscillator 51, head 52, optical path 53 provided between oscillator 51 and head 52, driving power supply device 54 for driving oscillator 51, and cooling device 55 for cooling oscillator 51.

Oscillator 51 includes first semiconductor laser module 56a, second semiconductor laser module 56b, third semiconductor laser module 56c, optical multiplexer 57, and first to third optical paths 58a to 58c provided between optical multiplexer 57 and first to third semiconductor laser modules 56a to 56c. First to third semiconductor laser modules 56a to 56c are each, for example, semiconductor laser module 4 according to Embodiment 2. Thus, welding laser light source system 5 includes semiconductor laser device 1 that emits laser light, as a light source.

Head 52 includes optical element 59. Optical element 59 is, for example, a convex lens having a light gathering function.

First to third semiconductor laser modules 56a to 56c of oscillator 51 receive power supply from driving power supply device 54 and outputs laser light formed into parallel light.

Three beams of laser light that are output from first to third semiconductor laser modules 56a to 56c pass through first, second, and third optical paths 58a, 58b, and 58c, respectively, and are guided to optical multiplexer 57. First to third optical paths 58a to 58c are, for example, configured by optical elements such as an optical fiber and a reflecting mirror.

Optical multiplexer 57 has a function of combining the three beams of laser light guided through first to third optical paths 58a to 58c and guiding the combined light to a single optical path. Optical multiplexer 57 is configured by, for example, a multiplexer prism or a diffraction grading to the presence of optical multiplexer 57 can simplify optical path 53 to head 52 even if the system includes a plurality of semiconductor laser modules.

Like first to third optical paths 58a to 58c, optical path 53 can be configured by an optical element such as an optical fiber or a reflecting mirror. In the case where welding laser light source system 5 includes fixed head 52, optical path 53 may be configured by an optical element such as a reflecting mirror. In the case where welding laser light source system 5 includes movable head 52, optical path 53 may be configured by an optical fiber or similar optical element.

Optical element 59 of head 52 collects laser light, which is guided from oscillator 51 through optical path 53, at a single point. This allows the laser light emitted from the semiconductor laser devices mounted on first to third semiconductor laser modules 56a to 56c to be applied directly to a to-be-welded object with a high optical density. Besides, direct use of the laser light emitted from the semiconductor laser devices is possible, so that the wavelength of laser light to be used can be changed easily by changing the semiconductor laser devices. Accordingly, it is possible to select the wavelength in conformity with the rate of light absorption in the to-be-welded object, and to improve the efficiency of welding.

As described thus far, since welding laser light source system 5 according to the present embodiment includes semiconductor laser modules that each include semiconductor laser device 1 according to Embodiment 1, it is possible to achieve a high-output welding laser light source system capable of low-power operations.

Although first to third semiconductor laser modules 56a to 56c used in the present embodiment each include semiconductor laser device 1 according to Embodiment 1, the present embodiment is not limited to this example. For example, first to third semiconductor laser modules 56a to 56c may include semiconductor laser device 1A illustrated in FIG. 26, or may include the semiconductor laser device with a multi-emitter structure illustrated in FIGS. 25A and 25B.

Although the welding laser light source system according to the present embodiment includes three semiconductor laser modules, the present embodiment is not limited to this example. In this case, higher optical output can be obtained by increasing the number of semiconductor laser modules to be included.

Welding laser light source system 5 according to the present embodiment can also be implemented as a laser welding device for use in facilities such as a laser welding facility.

In the present embodiment, if optical path 53 is an amplifying optical fiber obtained by adding rare earth to the core of an optical fiber, and a fiber bragg grating (FBG) having a function of confining light within the amplifying optical fiber is provided at both ends of the amplifying optical fiber, it is possible to achieve a fiber-laser welding device that uses light amplified by the amplifying optical fiber as a welding light source.

Other Variations

While semiconductor laser devices or other devices according to the present disclosure have been described thus far by way of embodiments, the present disclosure is not intended to be limited to the above-described embodiments.

For example, the semiconductor laser devices according to the above-described embodiments are n-side waveguide lasers in which the maximum intensity position of laser light in the light distribution in the stacking direction is within first conductivity-side semiconductor layer 100 (specifically, n-side second semiconductor layer 120) so that light is guided within the n-side semiconductor region. However, the present disclosure is not limited to this example. That is, the maximum intensity position of laser light in the light distribution in the stacking direction may be within active layer 300 or within second conductivity-side semiconductor layer 200.

In this case, side faces 105 of the stacked structure may be configured by first side face 105a and second side face 105b in order to prevent leakage light in the transverse direction, out of light that leaks from the guided mode originally intended to oscillate and forming a light distribution in the cavity length direction, from being reflected off side faces 105 and fed back into the light distribution. Moreover, the relations of θ1<90° and θ2>90° may be satisfied.

The semiconductor laser devices according to the above-described embodiments can be used in semiconductor laser modules and welding laser light source systems.

In this case, a semiconductor laser module may be configured by, for example, a metal base, a base arranged on the metal base, a semiconductor laser device arranged on the base, and an optical element arranged in the optical path of laser light emitted from the semiconductor laser device. In this way, by using the semiconductor laser devices according to the above-described embodiments, it is possible to achieve a high-power semiconductor laser module capable of low-power operations.

A welding laser light source system may be configured by an oscillator that includes the above-described semiconductor laser module, a head that collects laser light guided from the oscillator to a single point, and a cooling device for cooling the oscillator. In this way, by using the semiconductor laser modules each including the semiconductor laser device according to the above-described embodiment, it is possible to achieve a high-power welding laser light source system capable of low-power operations.

The present invention also includes other variations such as embodiments obtained by applying various changes conceivable by those skilled in the art to each embodiment, and embodiments implemented by any combination of constituent elements and functions of each embodiment without departing from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor laser device according to the present disclosure is capable of emitting laser light at high output in a low-power operation, and is thus useful as, for example, a welding light source, a projector light source, a display light source, a lighting light source, or any other light source of equipment such as an electronic device or an information processor.

What is claimed is:

1. A semiconductor laser device that lases in a multiple transverse mode, comprising:
   a substrate having a main surface; and
   a stacked structure including a first conductivity-side semiconductor layer, an active layer, and a second conductivity-side semiconductor layer that are sequentially stacked above the main surface of the substrate,
   wherein the second conductivity-side semiconductor layer includes an opening that delimits a current injection region,
   a pair of side faces is formed in portions of the stacked structure that range from part of the first conductivity-side semiconductor layer to the second conductivity-side semiconductor layer,
   the active layer has a second width greater than a first width of the opening,
   the pair of side faces in at least part of the first conductivity-side semiconductor layer is inclined to the main surface of the substrate,
   a maximum intensity position in a light distribution of light guided in the stacked structure, in a direction of a normal to the main surface of the substrate, is within the first conductivity-side semiconductor layer,
   each of the pair of side faces includes a first side face on a side close to the substrate and a second side face on a side farther away from the substrate,
   θ1 is less than 90 degrees, θ1 being an angle formed by a direction of a normal to the first side face and the direction of the normal to the main surface of the substrate,
   θ2 is greater than 90 degrees, θ2 being an angle formed by a direction of a normal to the second side face and the direction of the normal to the main surface of the substrate,
   the pair of side faces is covered with a dielectric film, and the first side face and the second side face are an interface between the dielectric film and the stacked structure.

2. The semiconductor laser device according to claim 1, wherein θ2 is greater than or equal to 120° and less than or equal to 150°.

3. The semiconductor laser device according to claim 1, wherein the stacked structure has a narrowest portion in an area ranging from part of the first conductivity-side semiconductor layer to the second conductivity-side semiconductor layer that are sandwiched between the pair of side faces, and the narrowest portion has a width greater than the first width.

4. The semiconductor laser device according to claim 3, wherein the narrowest portion is within the second conductivity-side semiconductor layer.

5. The semiconductor laser device according to claim 3, wherein the second conductivity-side semiconductor layer includes a second conductivity-side first semiconductor layer, a second conductivity-side second semiconductor layer, and a second conductivity-side contact layer that are provided on the substrate in an order mentioned, and the narrowest portion is at an interface between the second conductivity-side second semiconductor layer and the second conductivity-side contact layer or in the second conductivity-side layer.

6. The semiconductor laser device according to claim 1, wherein the first conductivity-side semiconductor layer includes a first conductivity-side first semiconductor layer and a first conductivity-side second semiconductor layer that are provided on the substrate in an order mentioned, and the following relation is satisfied:

$$0° < \theta < 90\left[1° - \frac{1}{\pi}\text{Arctan}\left\{\frac{4d}{2X - (Nw - Ws)}\right\}\right];$$

$$-\frac{\pi}{2} < \text{Arctan}\left\{\frac{4d}{2X - (Nw - Ws)}\right\} < \frac{\pi}{2}$$

where θ [°] is an angle formed by one of the pair of side faces and the main surface of the substrate, d [μm] is a thickness from the active layer to an interface between the first conductivity-side first semiconductor layer and the first conductivity-side second semiconductor layer, Nw [μm] is a width of the light distribution of the light guided in the stacked structure, Ws [μm] is a width that is the first width, and X [μm] is a distance from a side face of the opening to an intersection of the one of the pair of side faces and an interface between the active layer and the first conductivity-side second semiconductor layer.

7. The semiconductor laser device according to claim 1, wherein the first conductivity-side semiconductor layer includes a first conductivity-side first semiconductor layer and a first conductivity-side second semiconductor layer that are provided on the substrate in an order mentioned, the second conductivity-side semiconductor layer includes a second conductivity-side first semiconductor layer and a second conductivity-side second semiconductor layer that are provided on the substrate in an order mentioned, and the following relations are satisfied:

$n_{22} < n_{11} < n_{12}$, and $n_{12} \geq n_{21}$ where $n_{11}$, $n_{12}$, $n_{21}$, and $n_{22}$ are respectively refractive indices of the first conductivity-side first semiconductor layer, the first conductivity-side second semiconductor layer, the second conductivity-side first semiconductor layer, and the second conductivity-side second semiconductor layer.

8. The semiconductor laser device according to claim 1, wherein the active layer has a quantum well structure that includes one or more quantum well layers, and a total thickness of the one or more quantum well layers in the active layer is less than or equal to 100 angstroms.

9. The semiconductor laser device according to claim 1, wherein the opening includes a plurality of openings, and each of the plurality of openings is isolated by an isolation groove that spans from part of the first conductivity-side semiconductor layer to the second conductivity-side semiconductor layer.

10. The semiconductor laser device according to claim 1, wherein the first width of the opening is greater than or equal to 50 μm and less than or equal to 300 μm.

11. The semiconductor laser device according to claim 1, wherein a distribution of the light guided in the stacked structure, in a direction horizontal to the main surface of the substrate, has a width greater than the first width of the opening.

12. A semiconductor laser module, comprising the semiconductor laser device according to claim 1.

13. The semiconductor laser module according to claim 12, comprising a base on which the semiconductor laser device is arranged, wherein the stacked structure of the semiconductor laser device is mounted on the base.

14. The semiconductor laser module according to claim 13, further comprising metal disposed laterally on at least one of the two side faces of the semiconductor laser device.

15. The semiconductor laser module according to claim 14, wherein each of the pair of side faces includes a first side face on a side close to the substrate and a second side face on a side farther away from the substrate, θ1 is less than 90 degrees, θ1 being an angle formed by a direction of a normal to the first side face and the direction of the normal to the main surface of the substrate, and θ2 is greater than 90 degrees, θ2 being an angle formed by a direction of a normal to the second side face and the direction of the normal to the main surface of the substrate.

16. A welding laser light source system comprising the semiconductor laser device according to claim 1.

17. The semiconductor laser device according to claim 1, wherein the second conductivity-side semiconductor layer includes a second conductivity-side first semiconductor layer, a second conductivity-side second semiconductor layer, and a second conductivity-side contact layer that are provided on the substrate in an order mentioned, and the second side face includes a side face of the second conductivity-side contact layer.

18. The semiconductor laser device according to claim 1, wherein the dielectric film has a constricted structure so as to exhibit an hourglass shape in a cross-sectional view.

19. The semiconductor laser device according to claim 1, wherein the dielectric film is inclined in a flared mesa shape from the first conductivity-side semiconductor layer through active layer to a narrowest portion, and then is inclined in an inverted flared mesa shape from the narrowest portion to the second conductivity-side semiconductor layer.

20. The semiconductor laser device according to claim 1, wherein the second conductivity-side semiconductor layer includes a current block layer having the opening.

* * * * *